(12) United States Patent
Shiozaki et al.

(10) Patent No.: US 8,435,815 B2
(45) Date of Patent: May 7, 2013

(54) SURFACE-EMITTING SEMICONDUCTOR LASER AND MANUFACTURING METHOD THEREOF

(75) Inventors: Masaki Shiozaki, Kanagawa (JP);
Osamu Maeda, Kanagawa (JP);
Takahiro Arakida, Kanagawa (JP);
Susumu Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 40 days.

(21) Appl. No.: 12/926,917

(22) Filed: Dec. 17, 2010

(65) Prior Publication Data
US 2011/0182315 A1 Jul. 28, 2011

(30) Foreign Application Priority Data
Jan. 26, 2010 (JP) .................. 2010-014859

(51) Int. Cl.
*B82Y 20/00* (2011.01)
(52) U.S. Cl.
USPC .................. 438/31; 438/22; 438/29; 438/39; 438/42
(58) Field of Classification Search .................. 438/22, 438/29, 31, 39, 42
See application file for complete search history.

(56) References Cited

U.S. PATENT DOCUMENTS

| 6,678,307 | B2 * | 1/2004 | Ezaki et al. | 372/96 |
| 7,871,841 | B2 * | 1/2011 | Masui et al. | 438/39 |
| 2005/0121678 | A1 | 6/2005 | Ezaki et al. | |
| 2008/0240194 | A1 * | 10/2008 | Maeda et al. | 372/50.1 |
| 2009/0129417 | A1 * | 5/2009 | Maeda et al. | 372/44.01 |

FOREIGN PATENT DOCUMENTS
JP 2005-142361 6/2005

\* cited by examiner

*Primary Examiner* — Bac Au
(74) *Attorney, Agent, or Firm* — Rader, Fishman & Grauer PLLC

(57) ABSTRACT

A manufacturing method of a surface-emitting semiconductor laser includes the steps of: forming a stacked structure having a lower-multilayer film reflector including a lower oxidizable layer having at least one layer, an active layer having a light emitting region, an upper-multilayer film reflector including an upper oxidizable layer and an upper layer on a substrate in this order; providing a first groove in the upper layer; and providing a second groove including a portion overlapping the first groove in a planar shape and a portion not overlapping the first groove in the stacked structure.

18 Claims, 44 Drawing Sheets

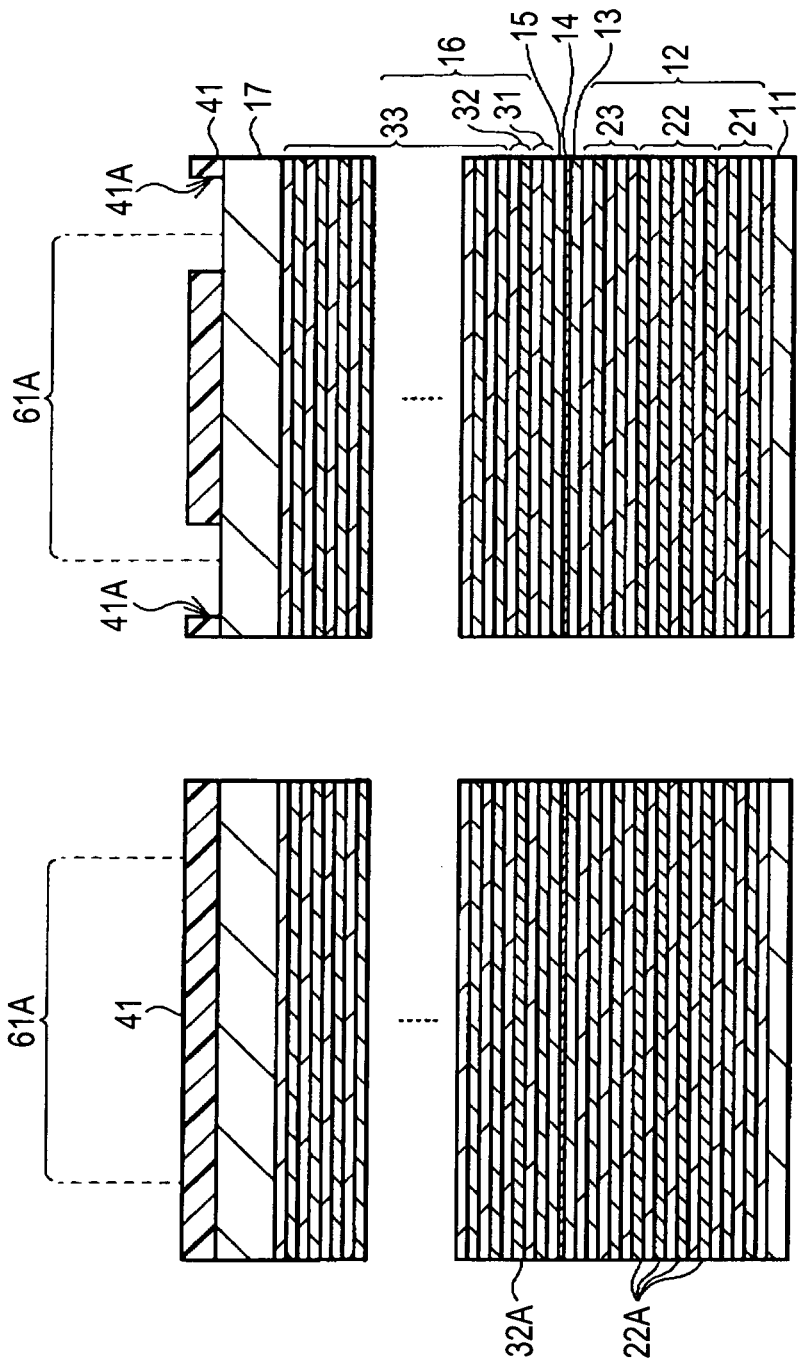

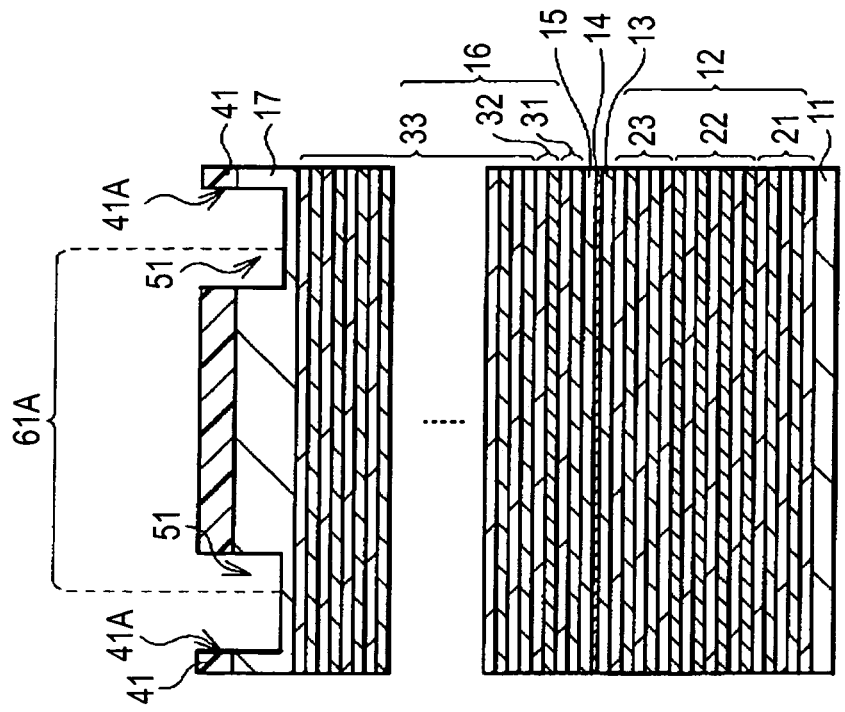
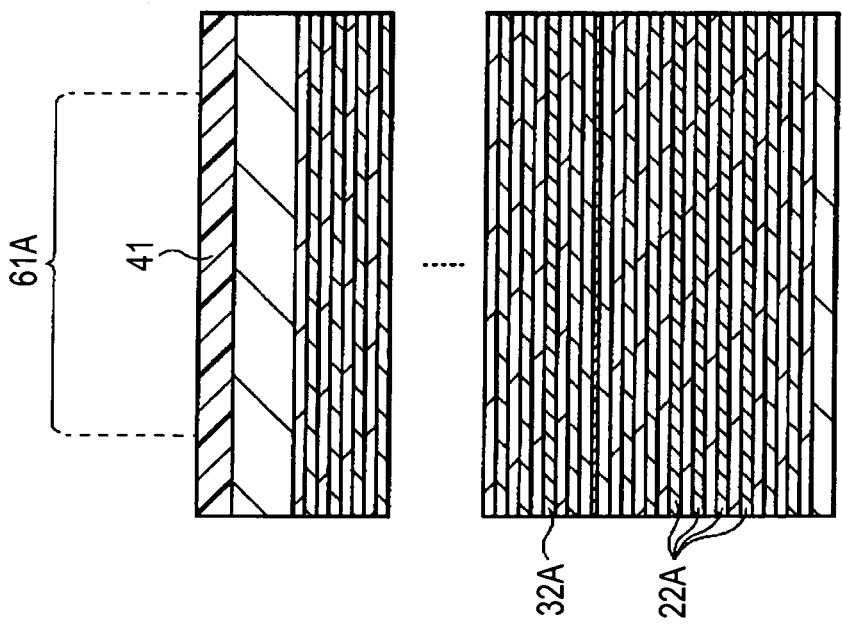

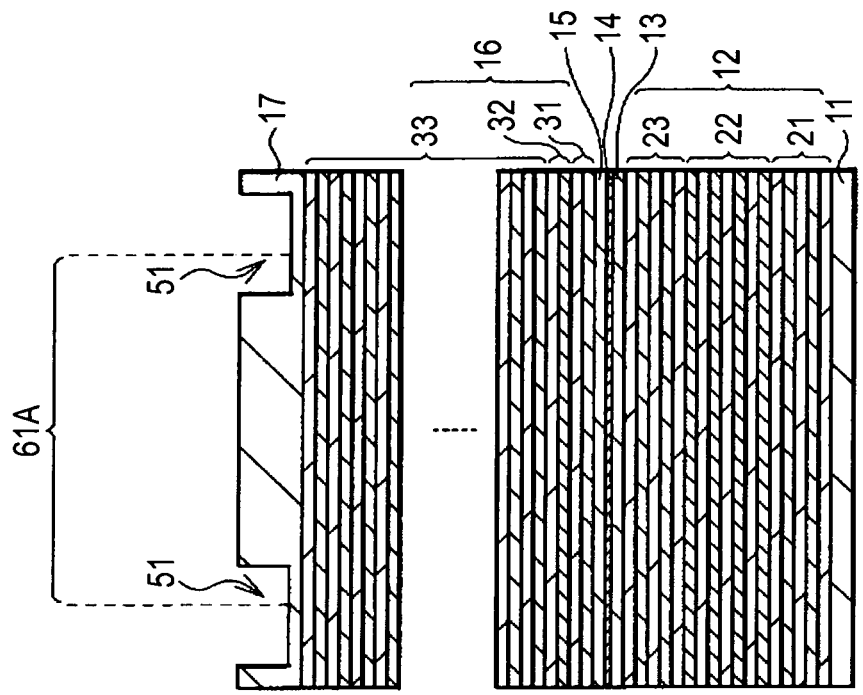
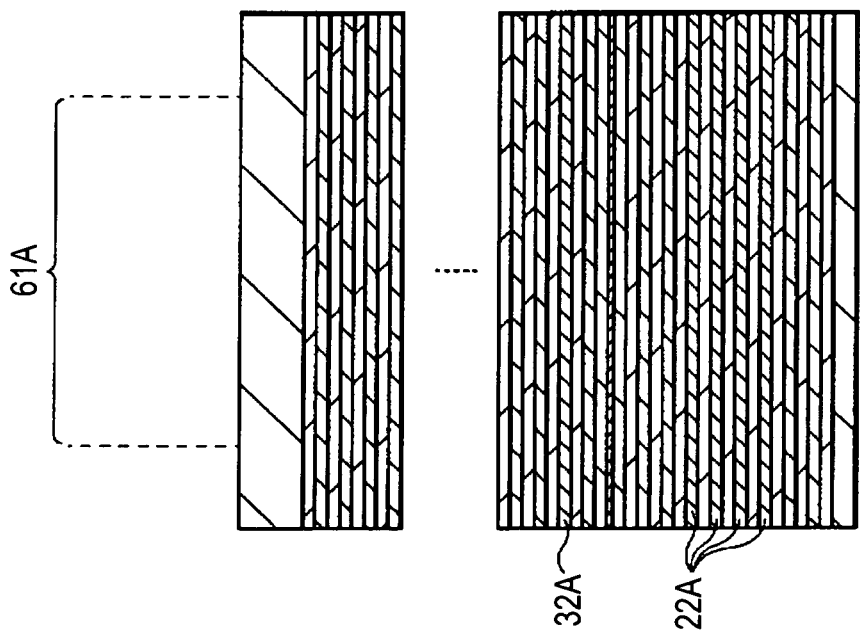

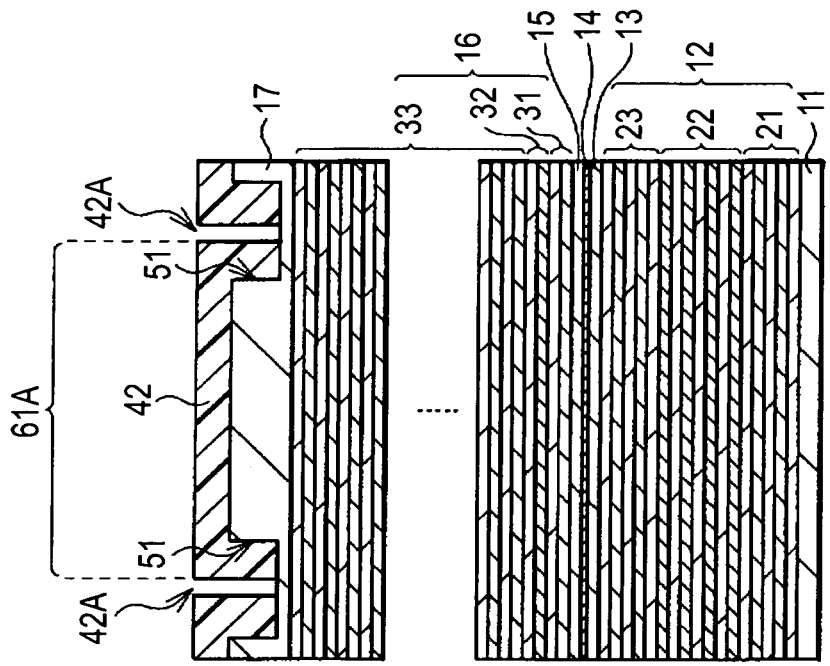
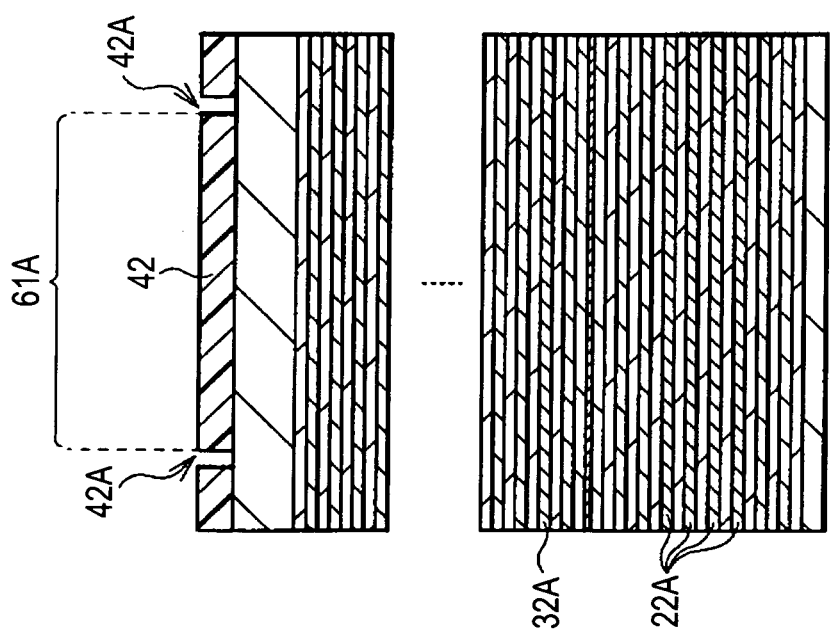

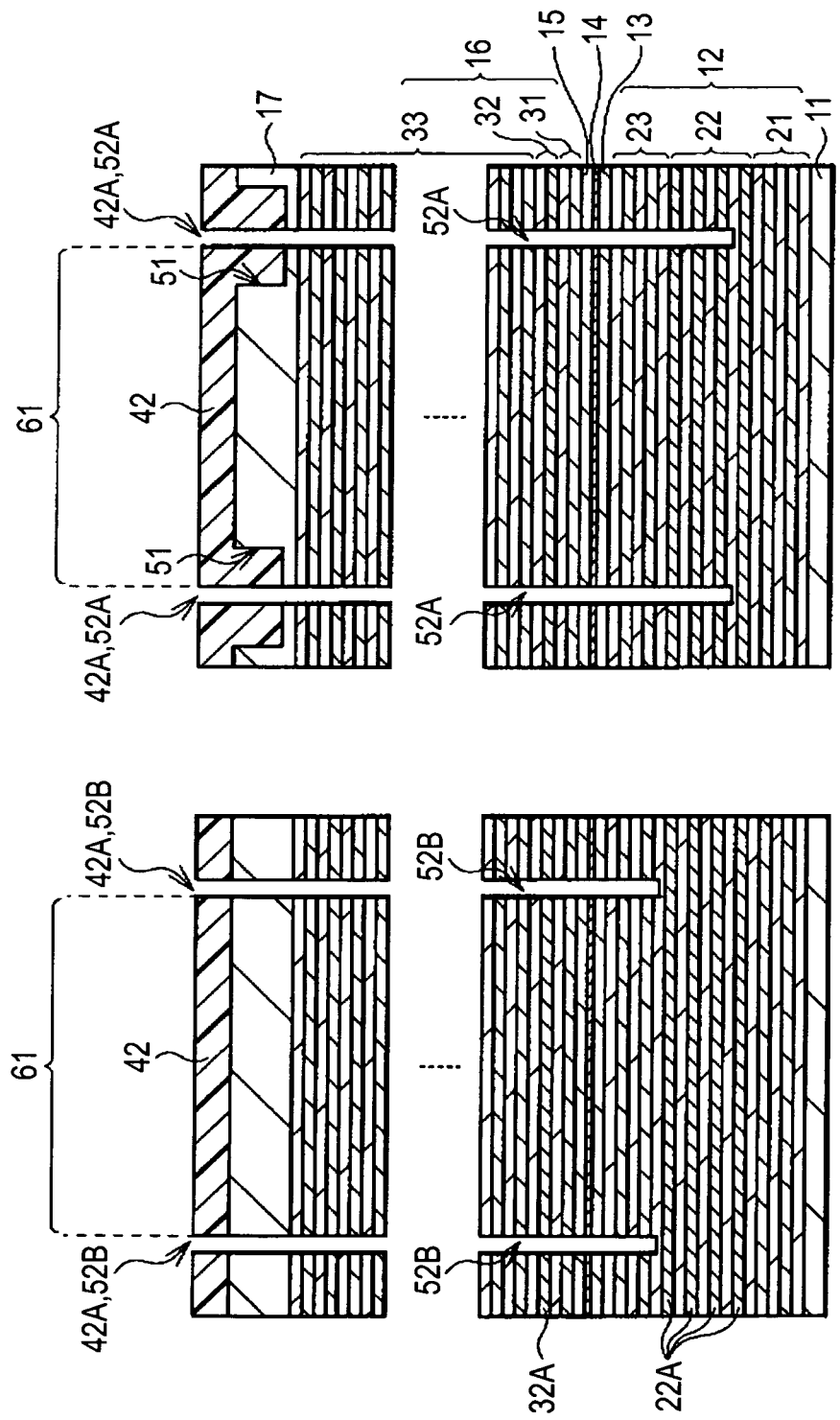

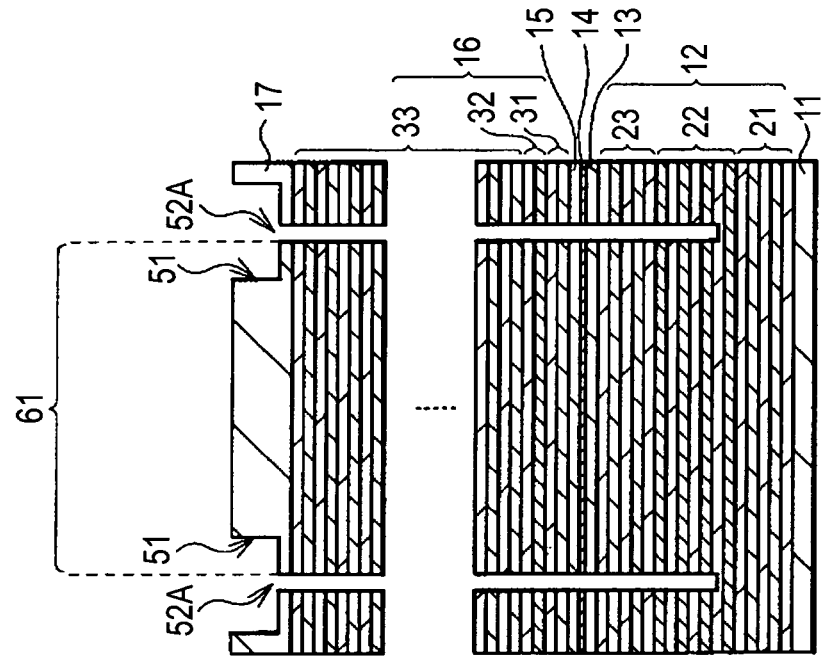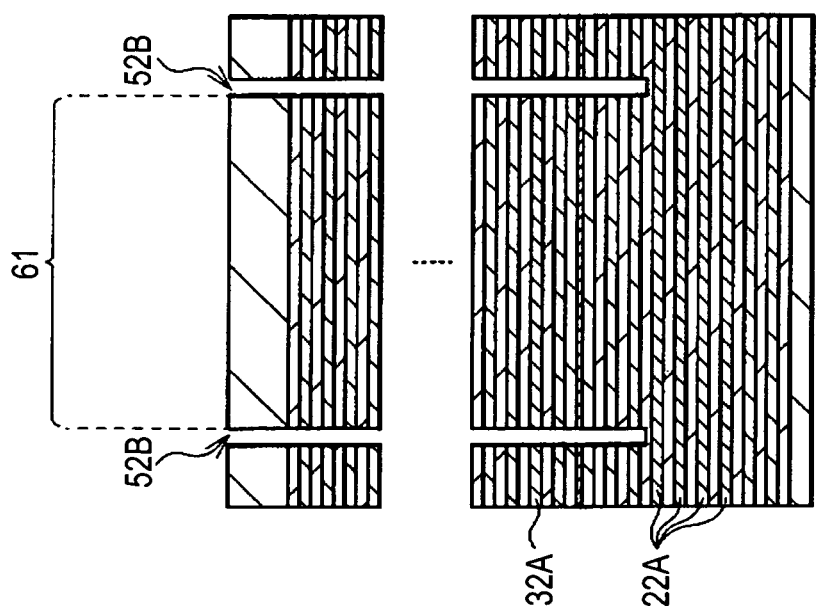

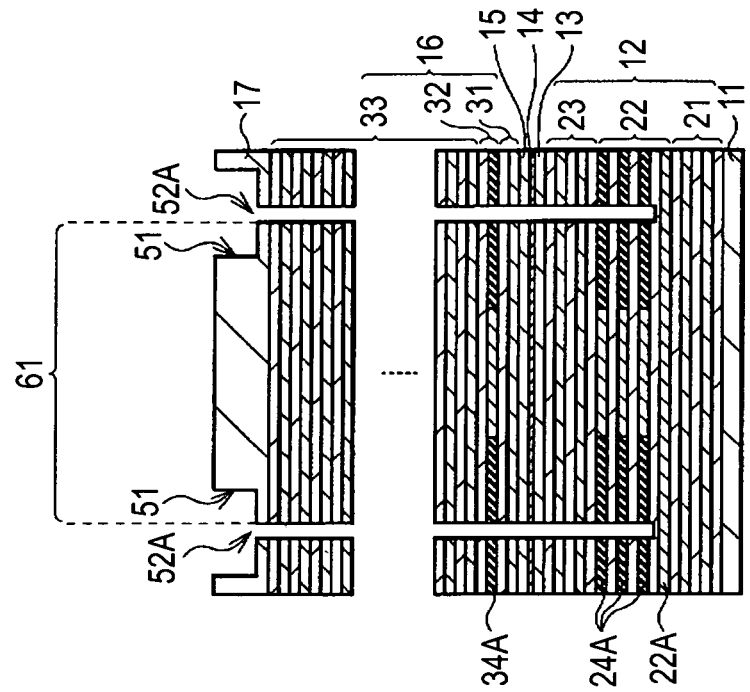
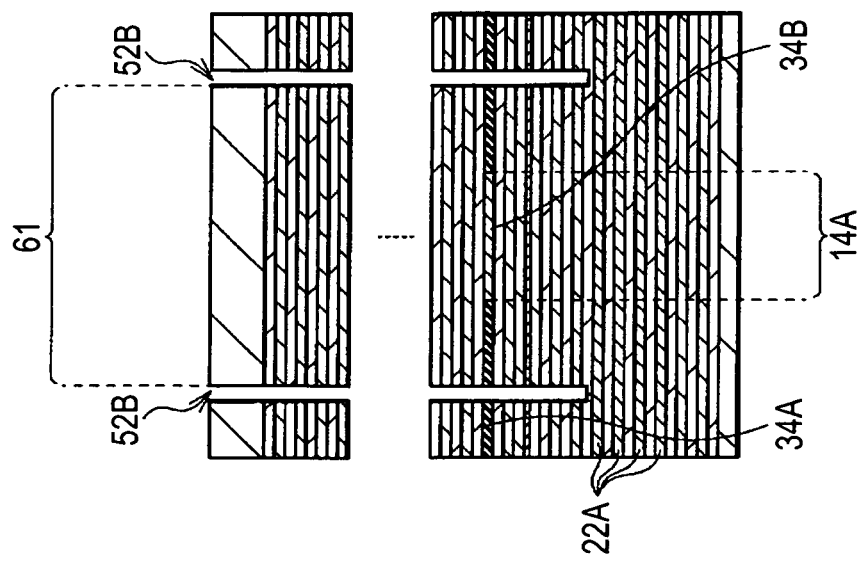

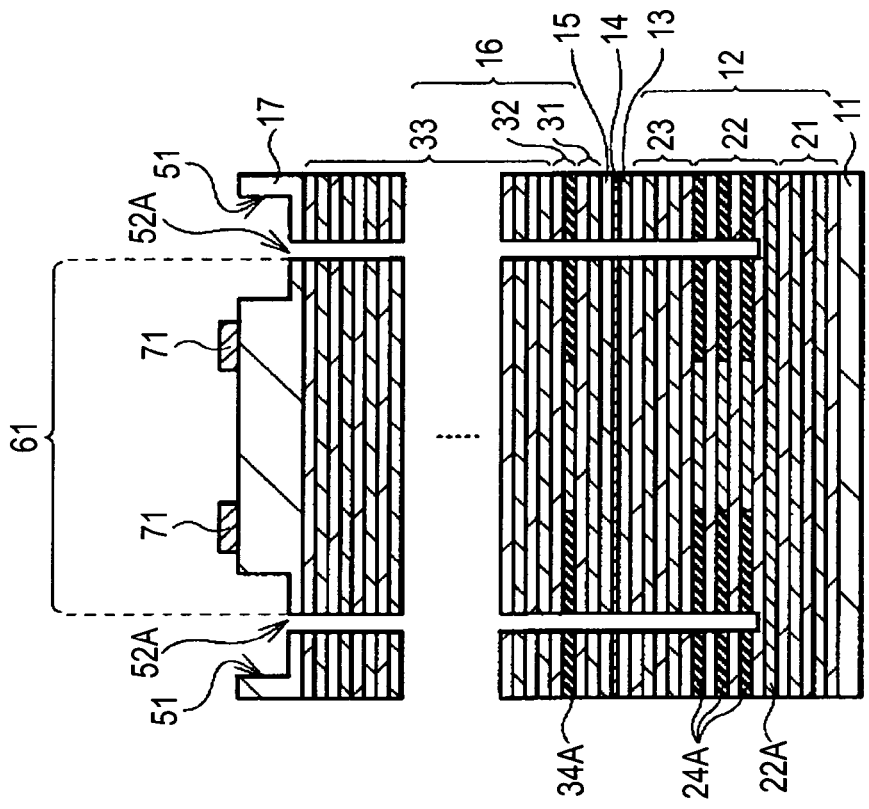
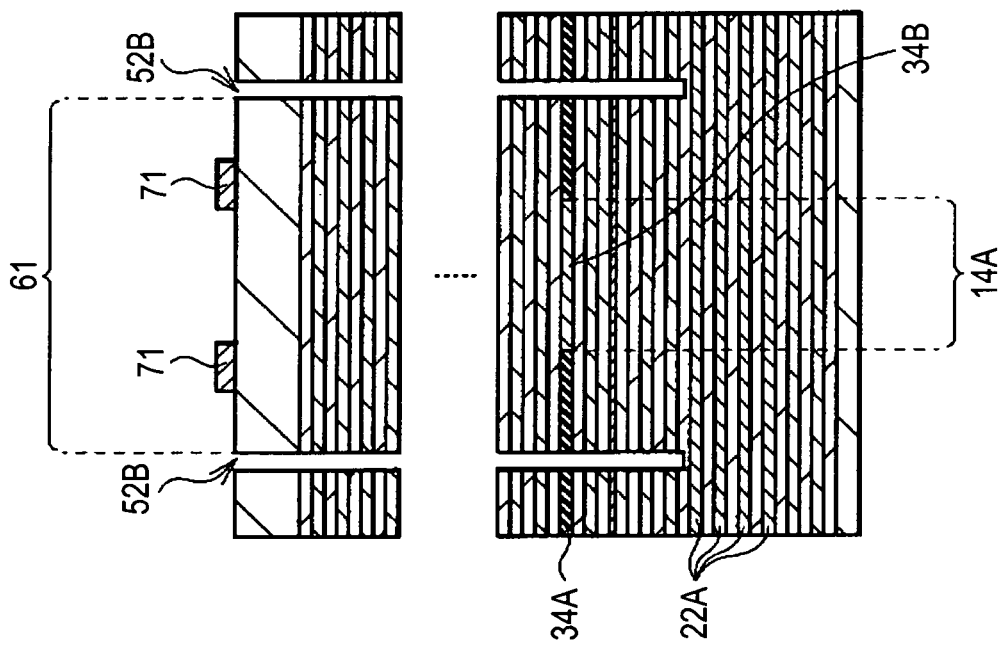

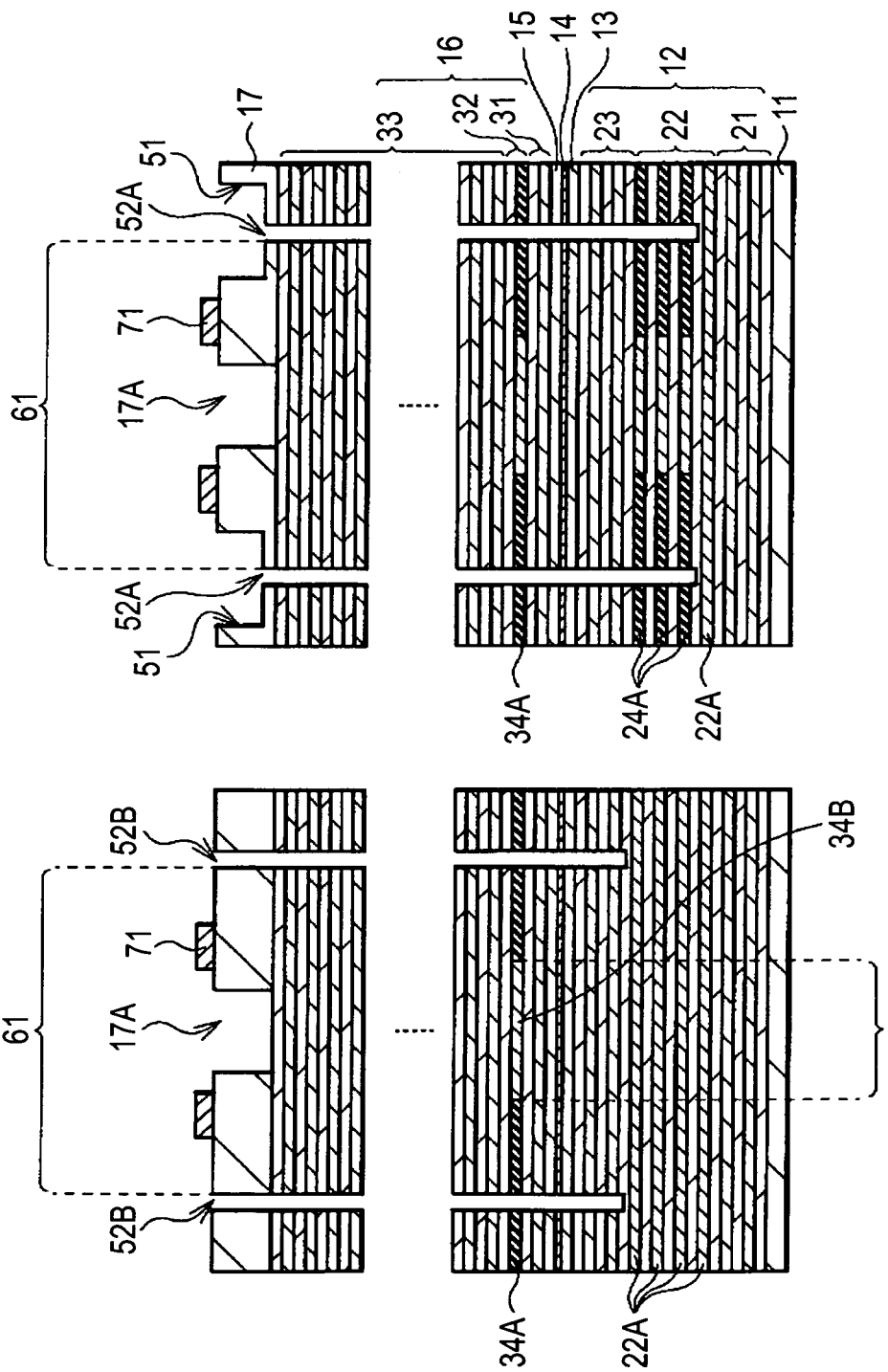

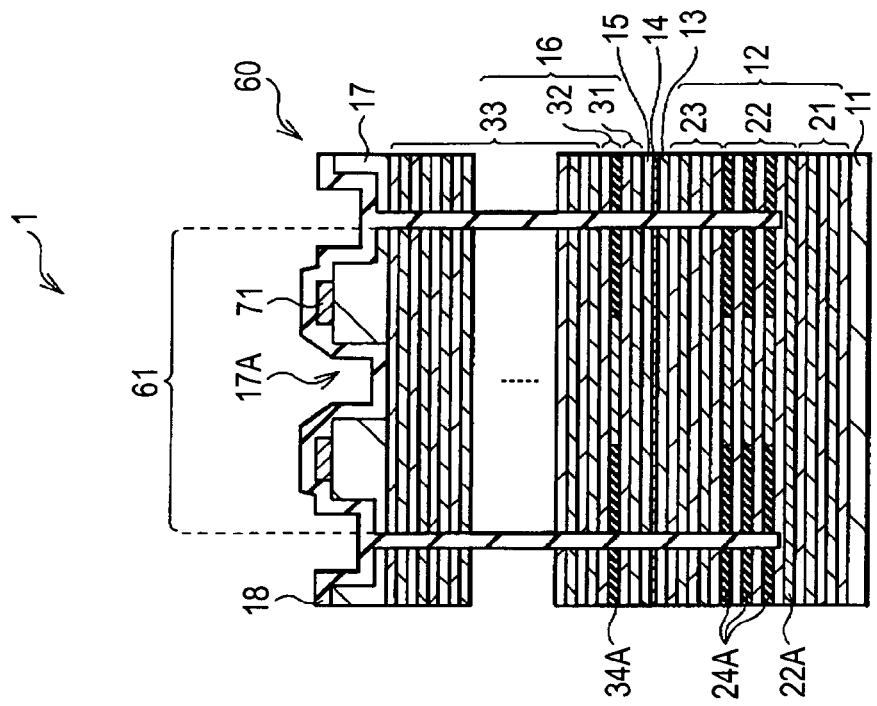
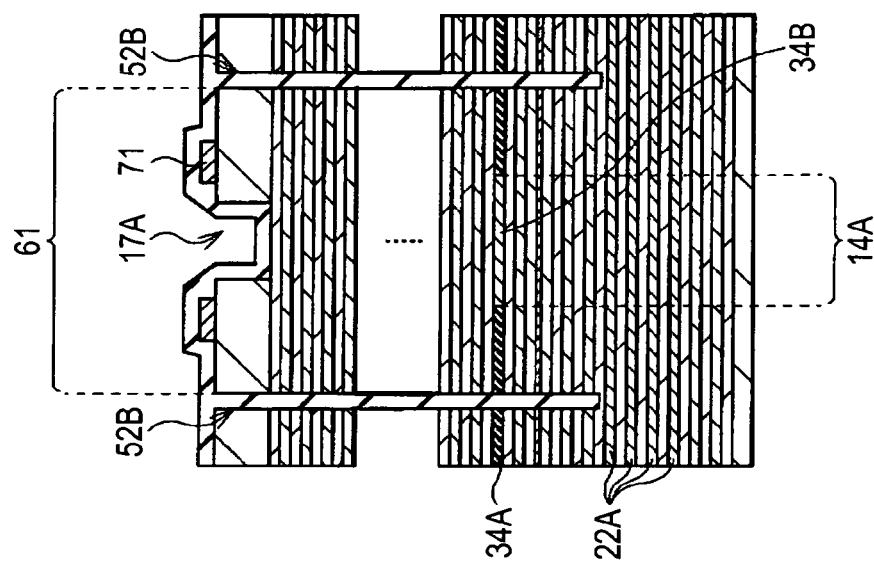

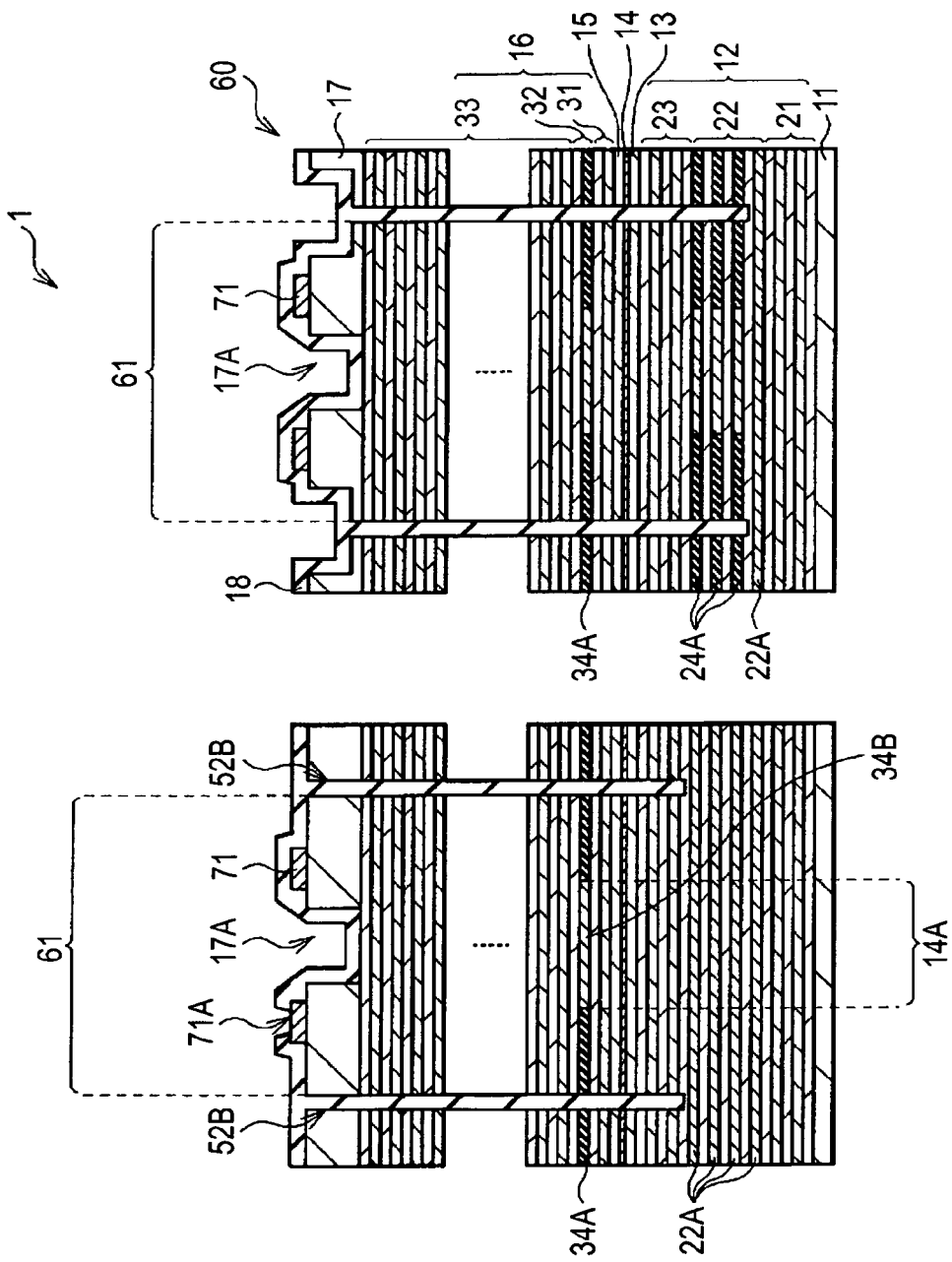

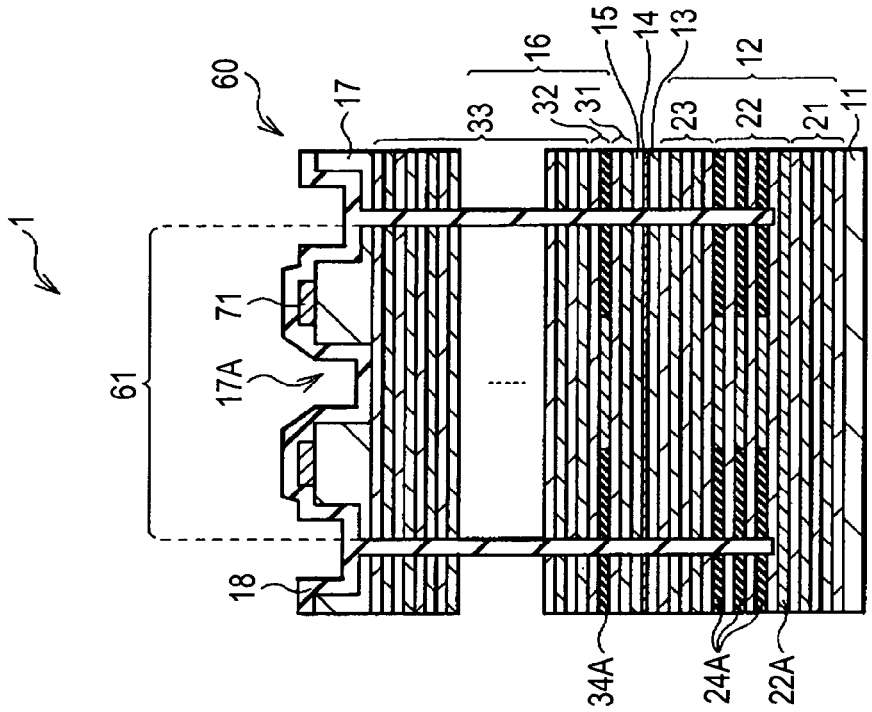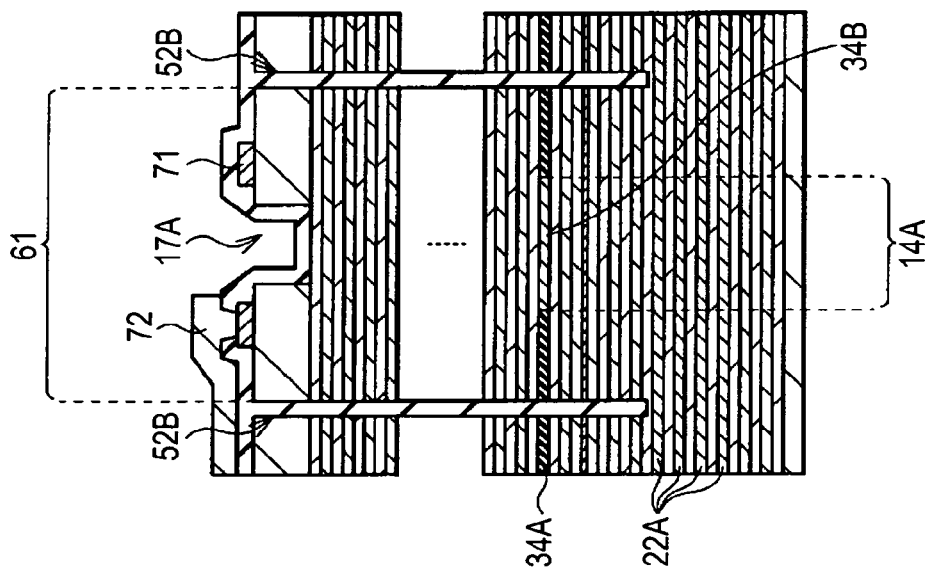

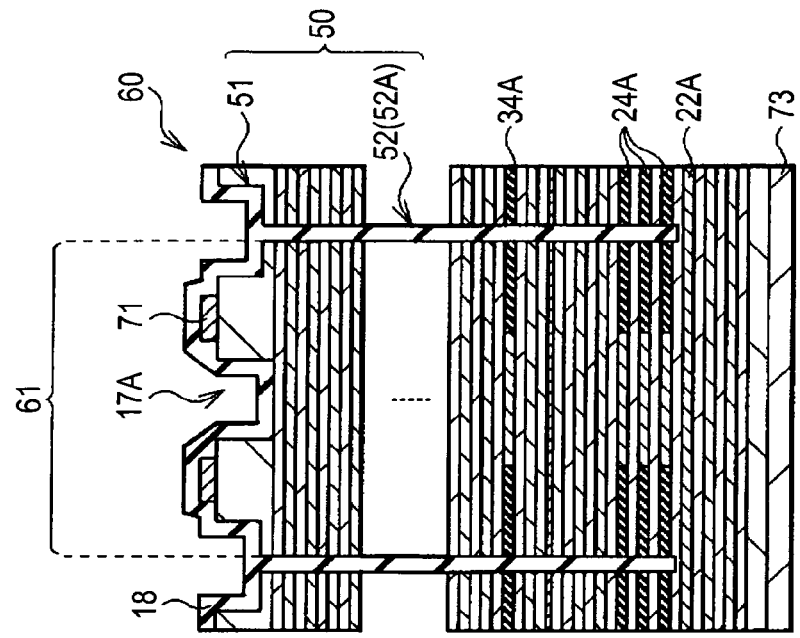
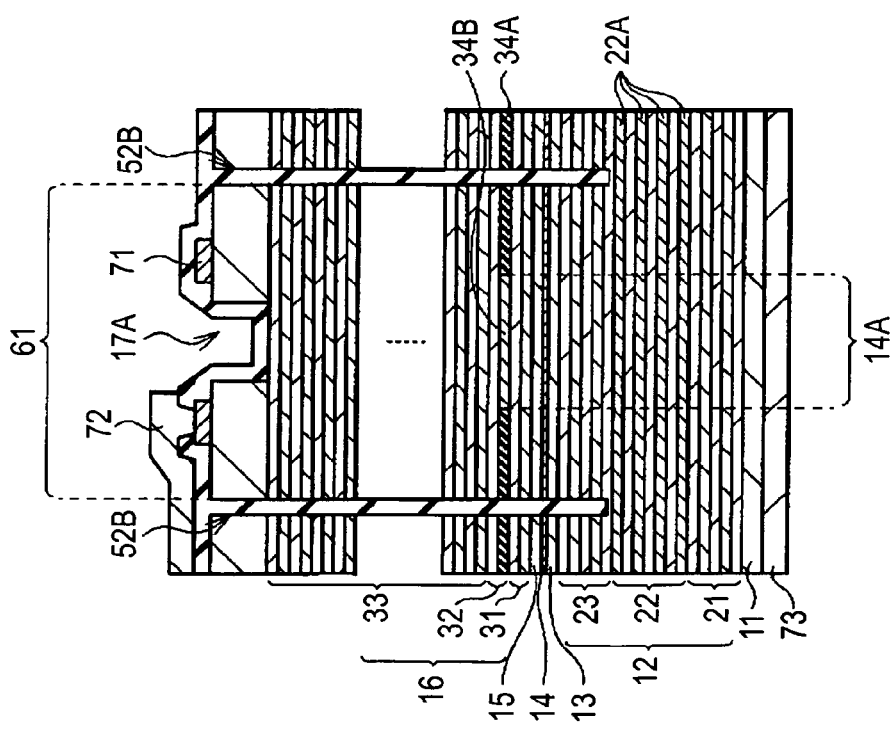
FIG.16B
FIG.16A

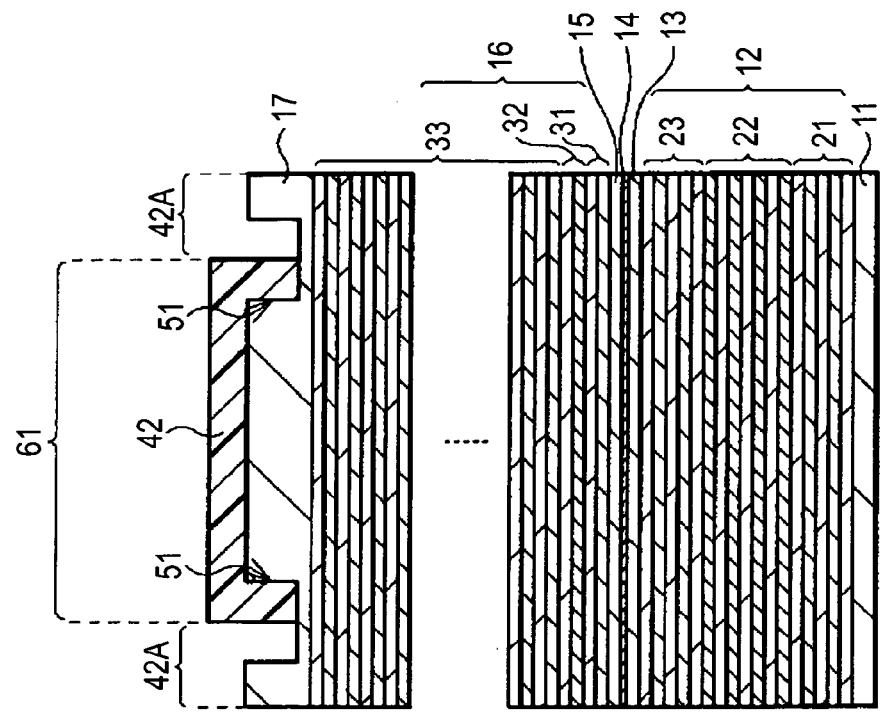
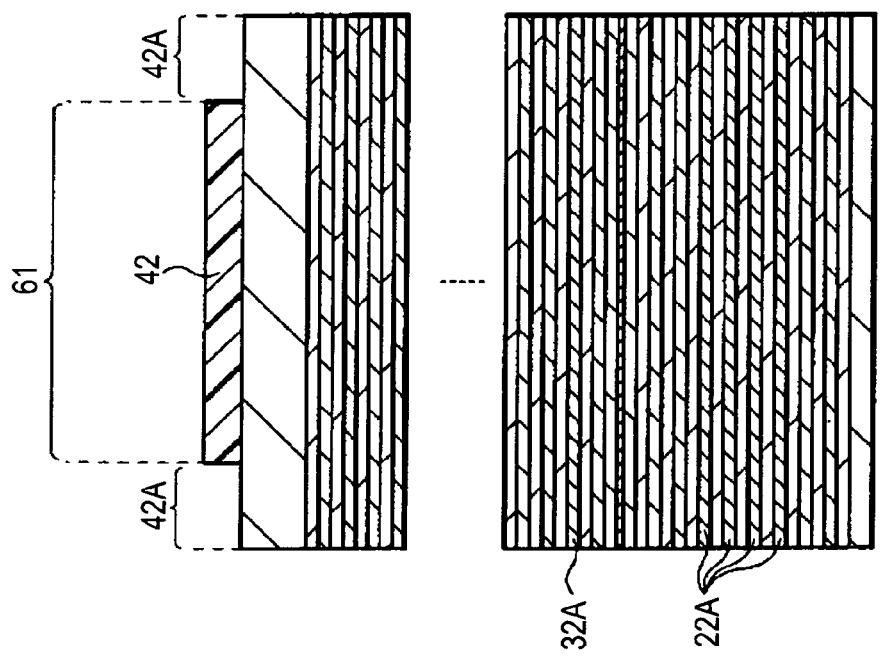

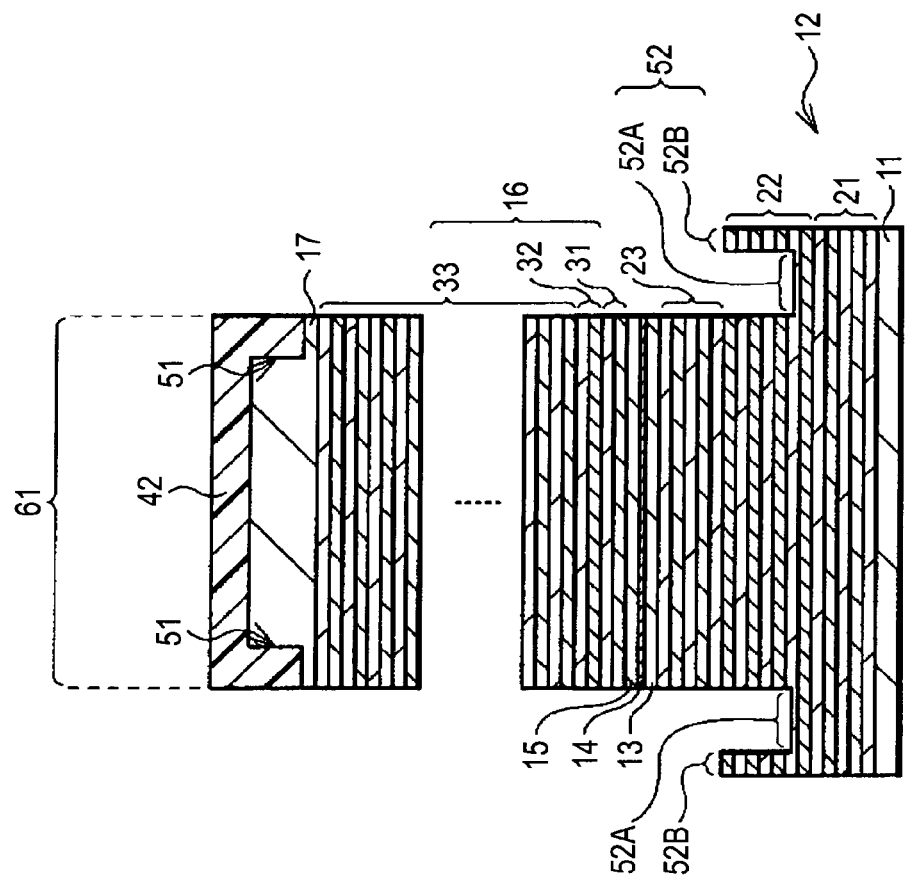
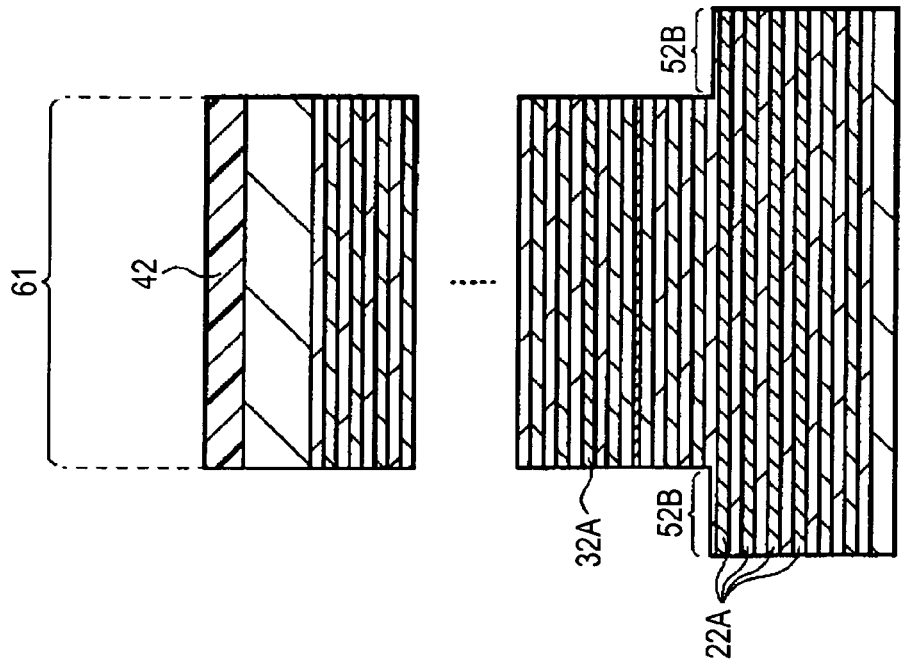

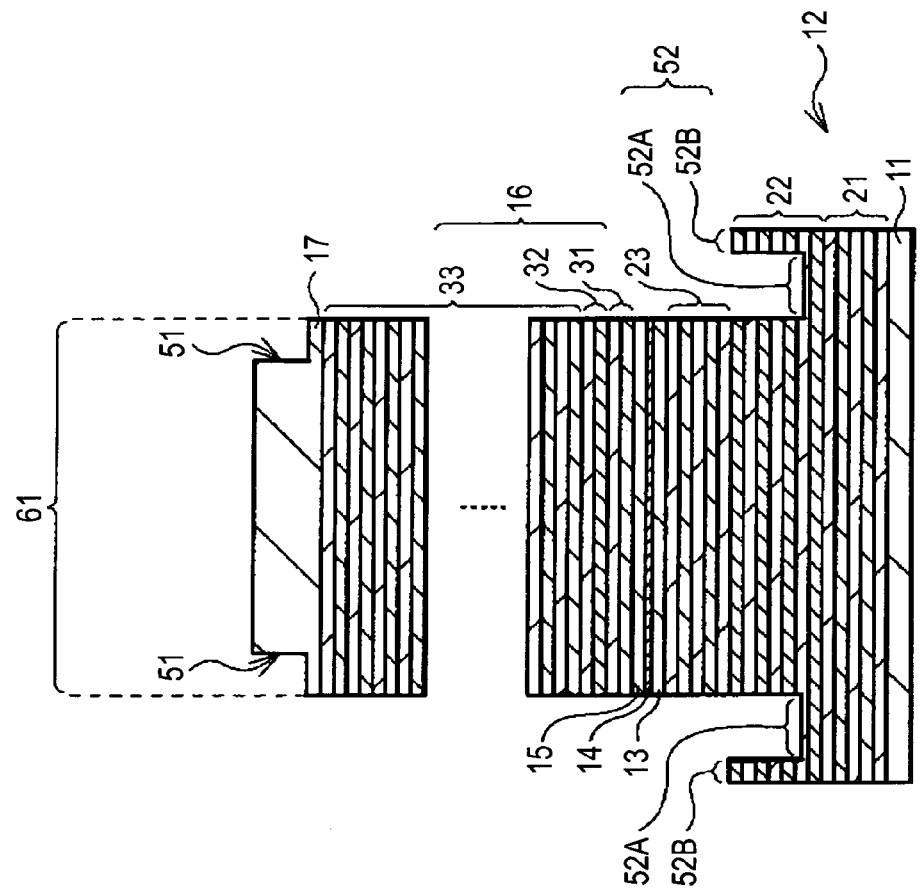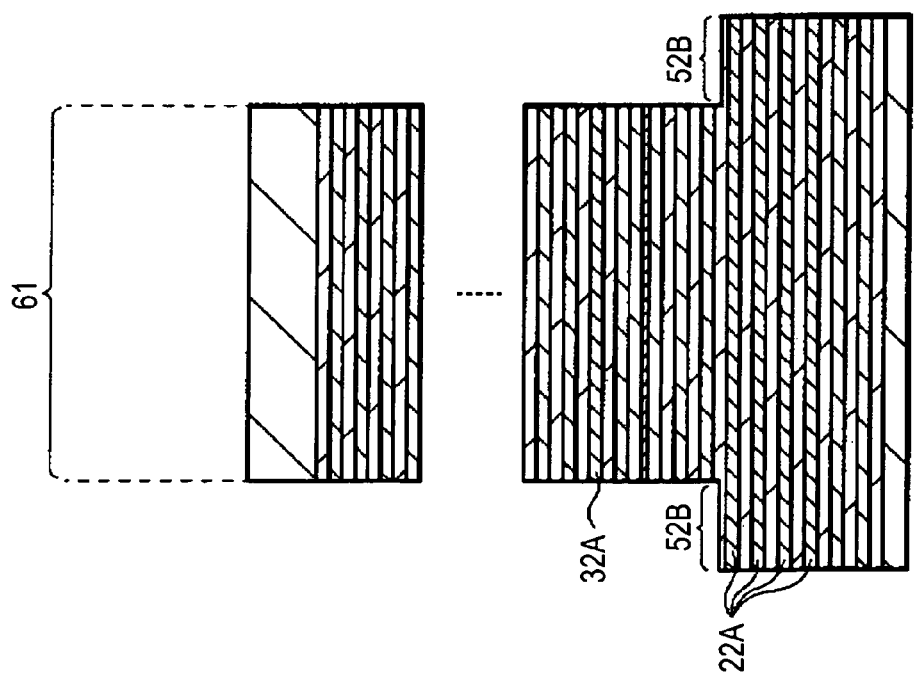

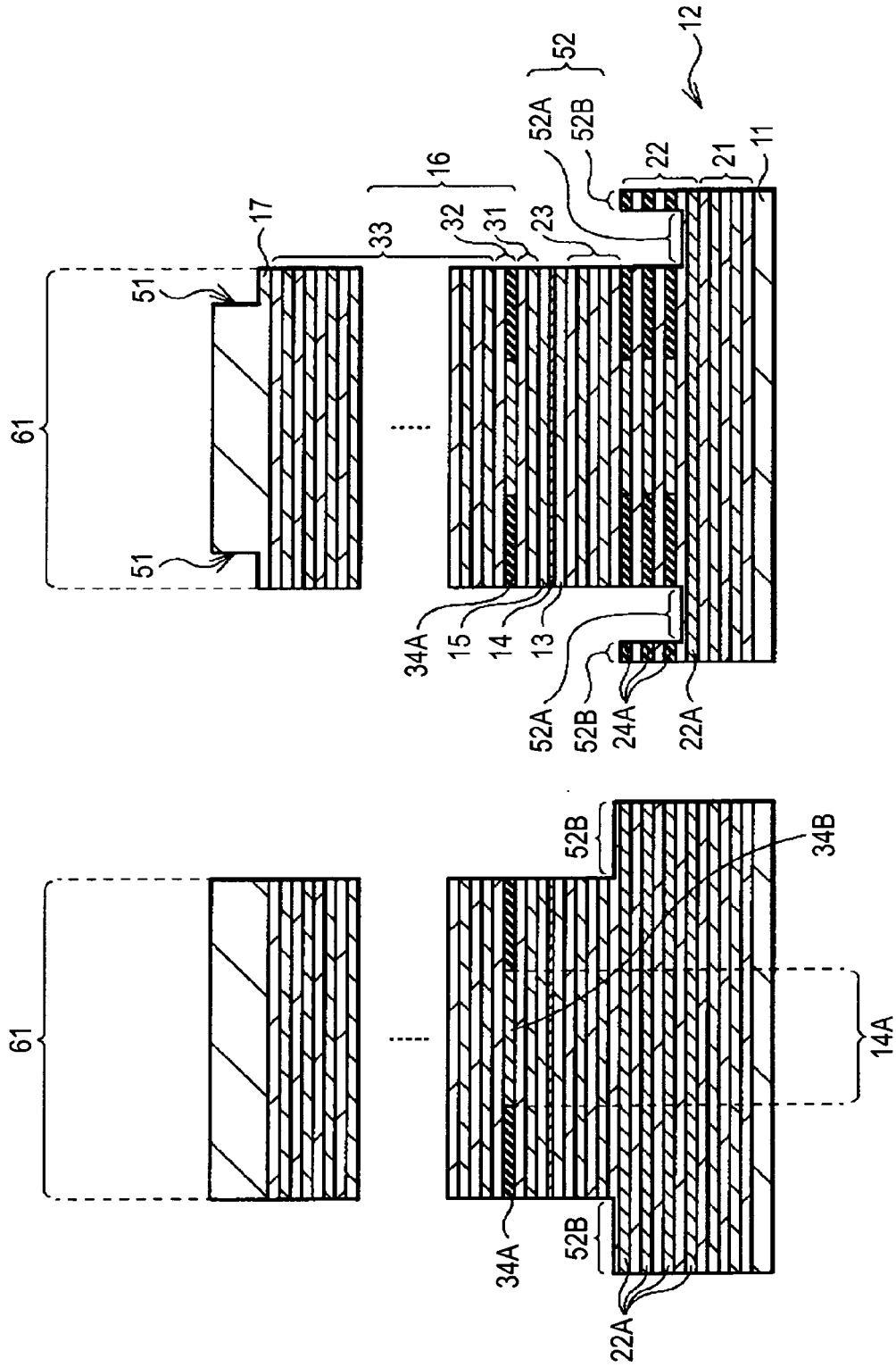

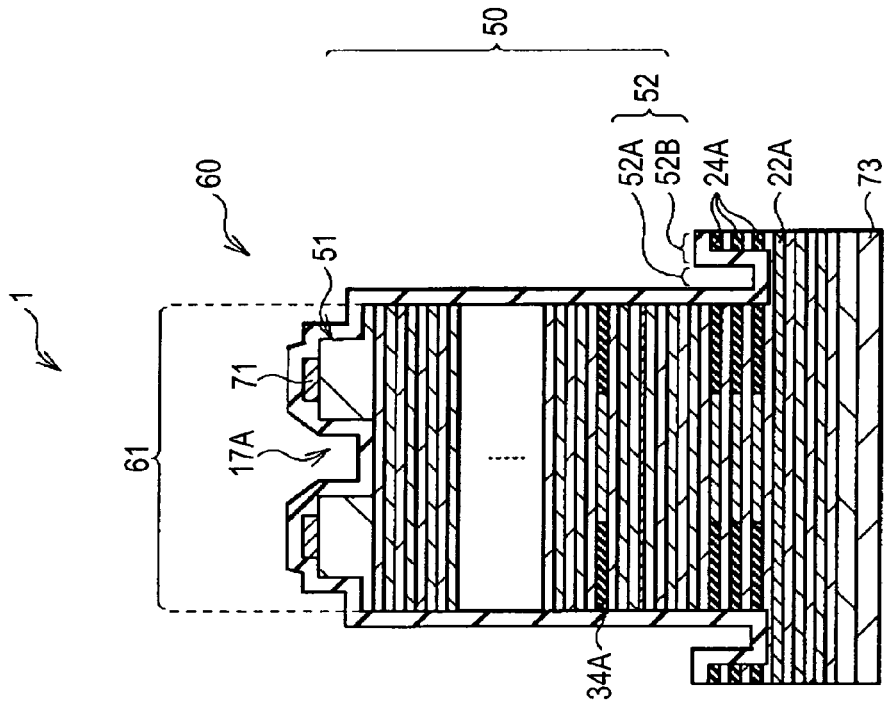
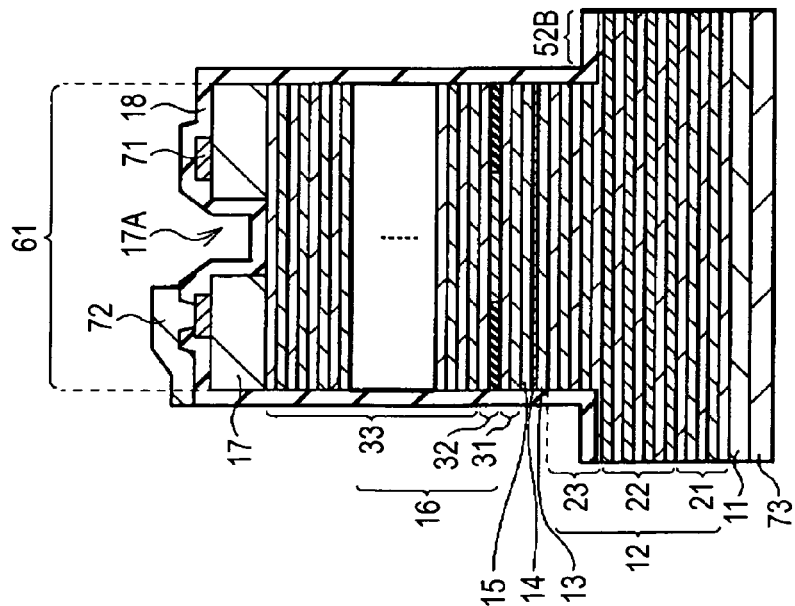

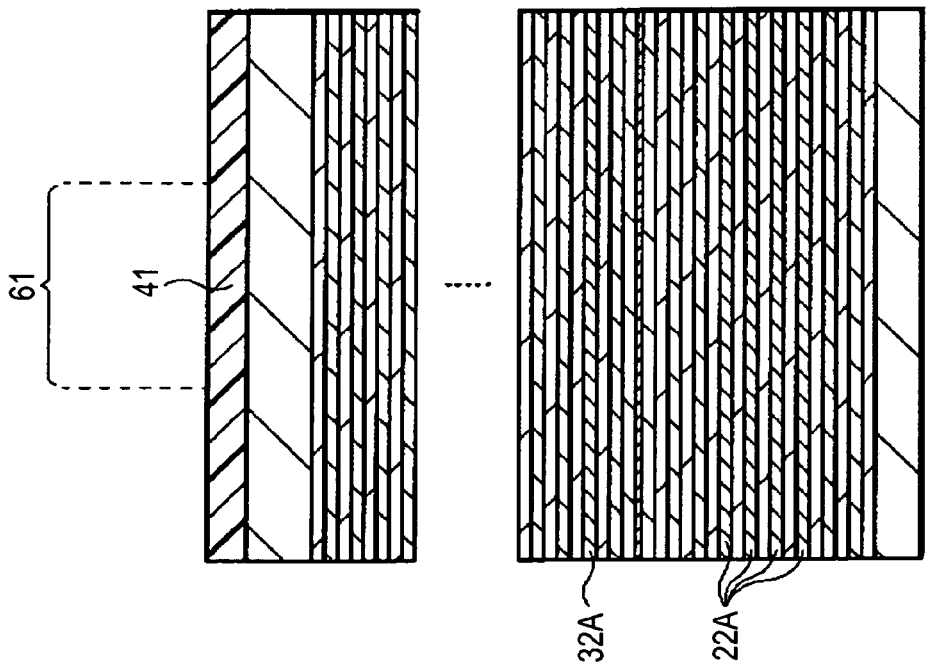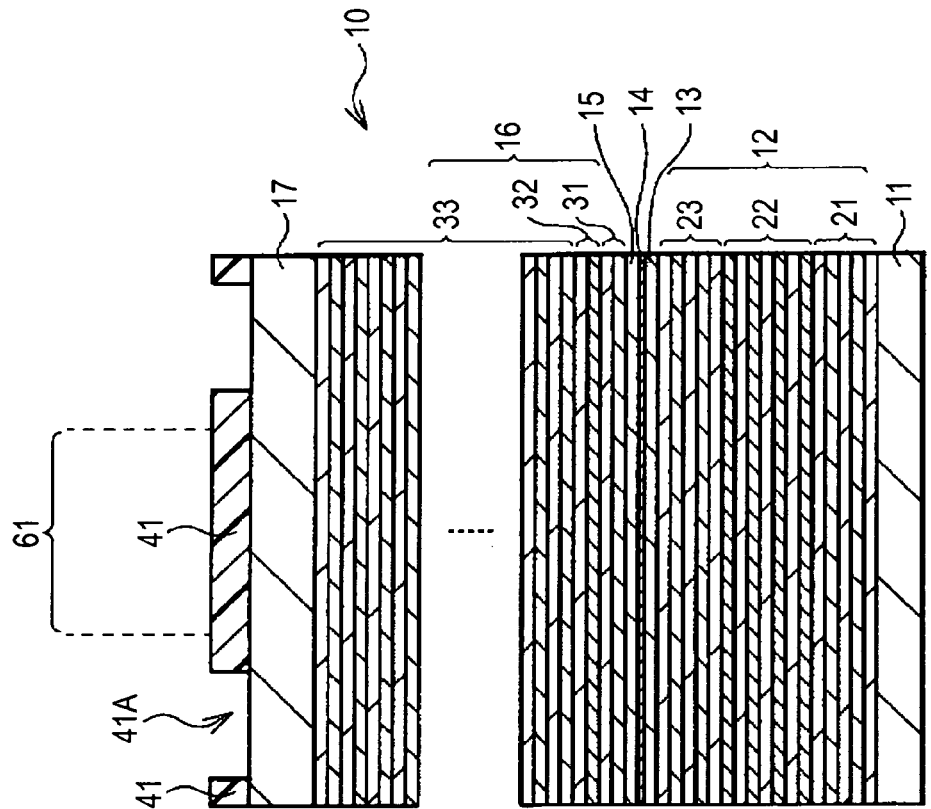

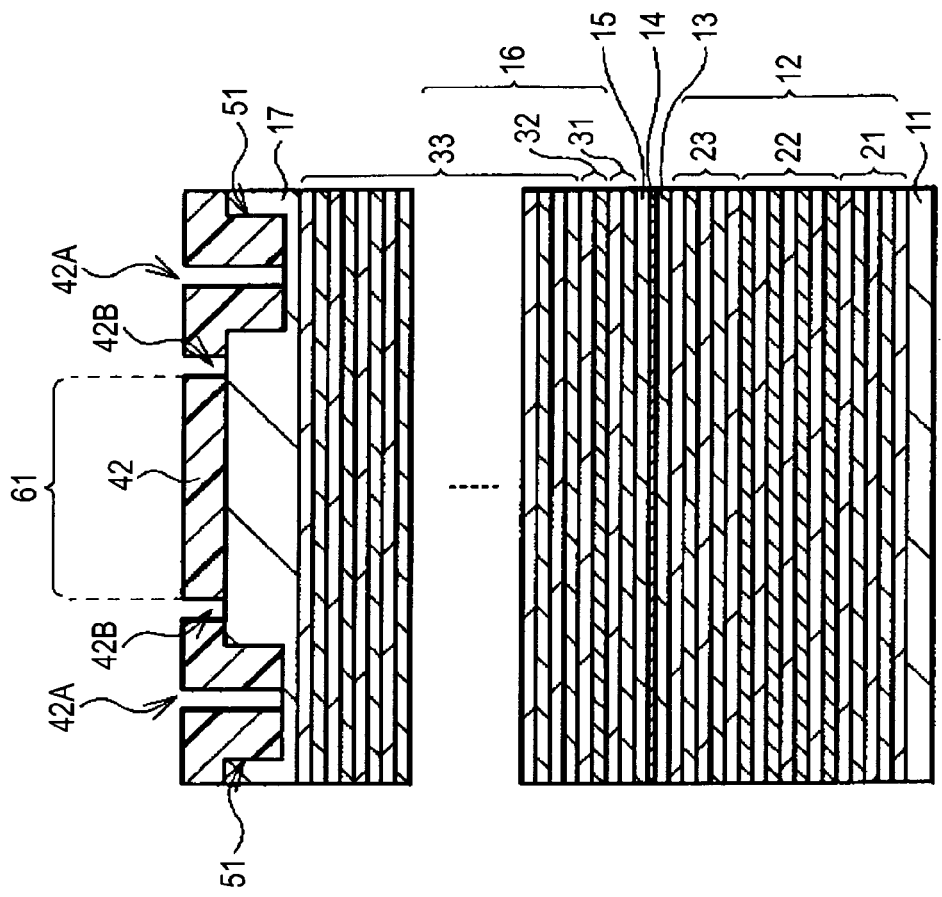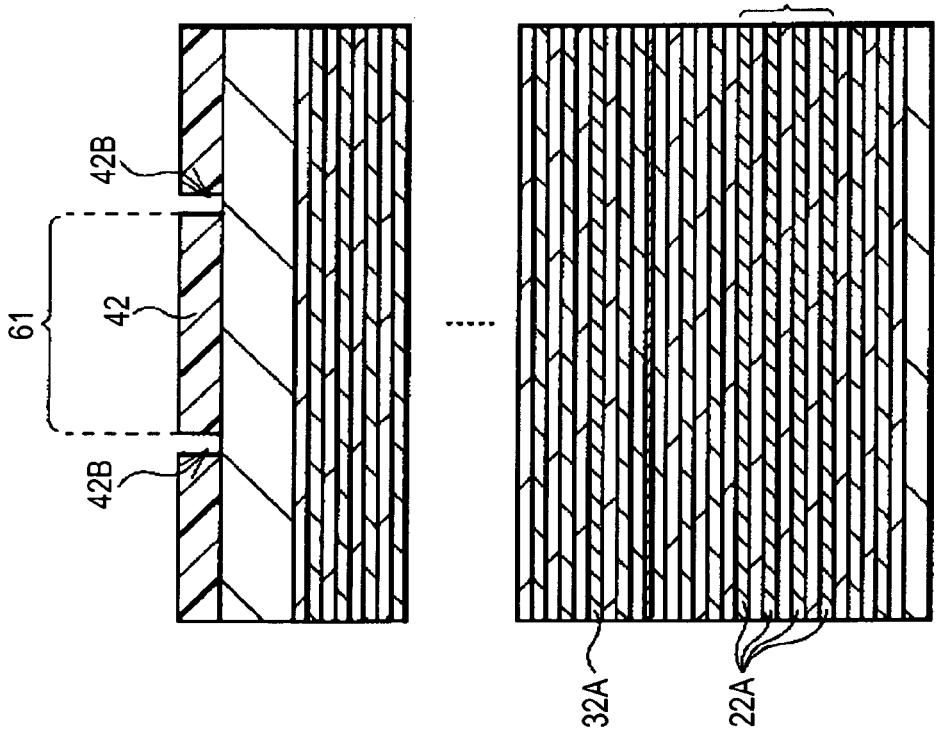

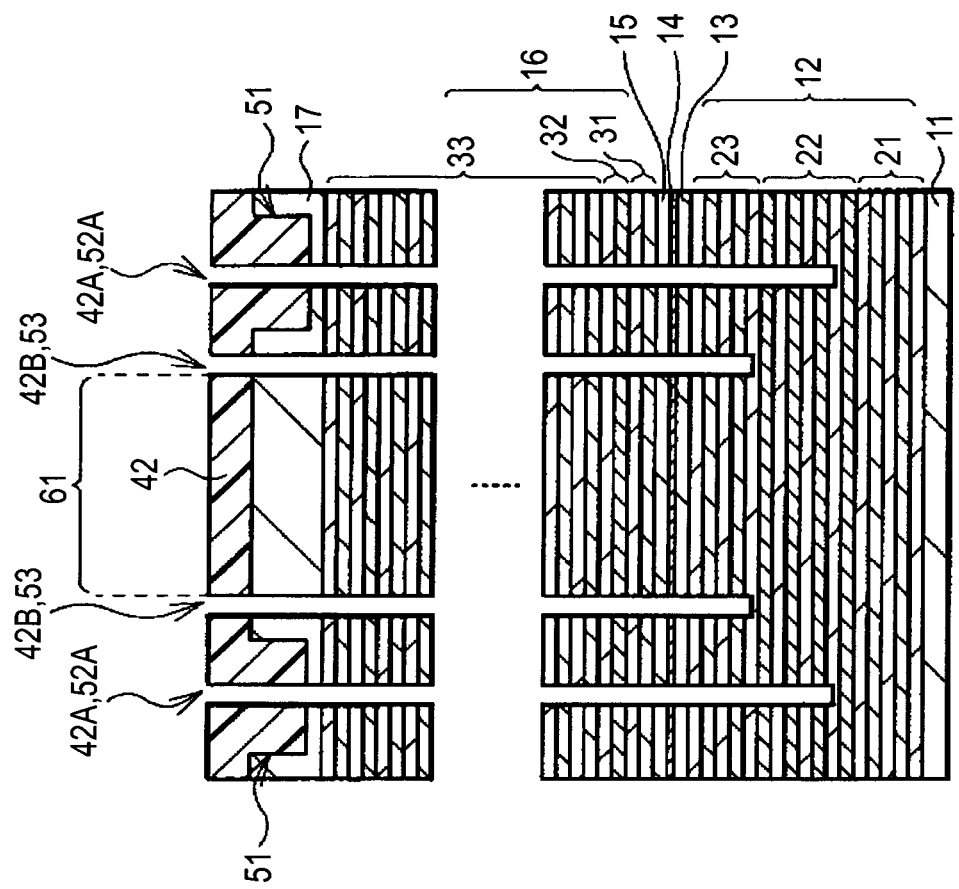
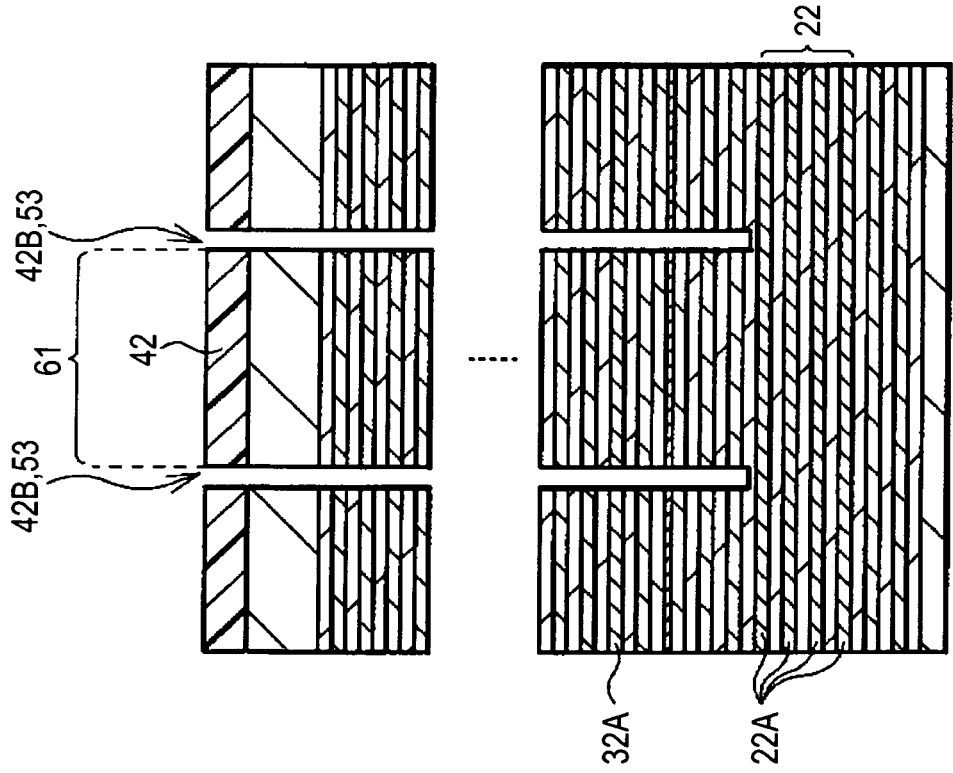

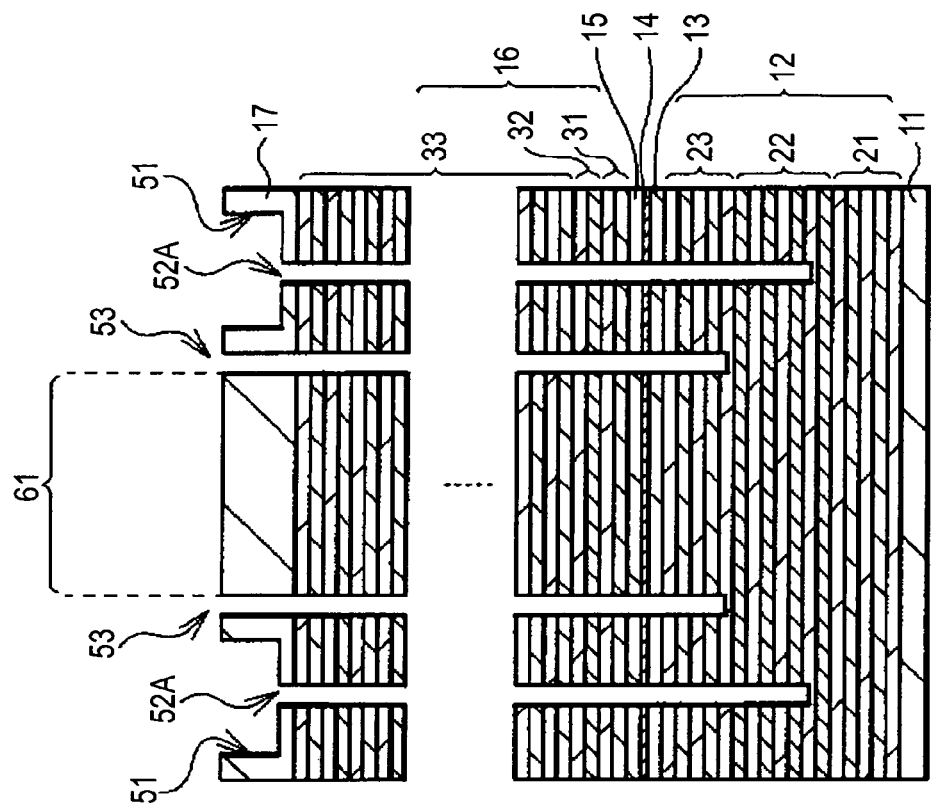
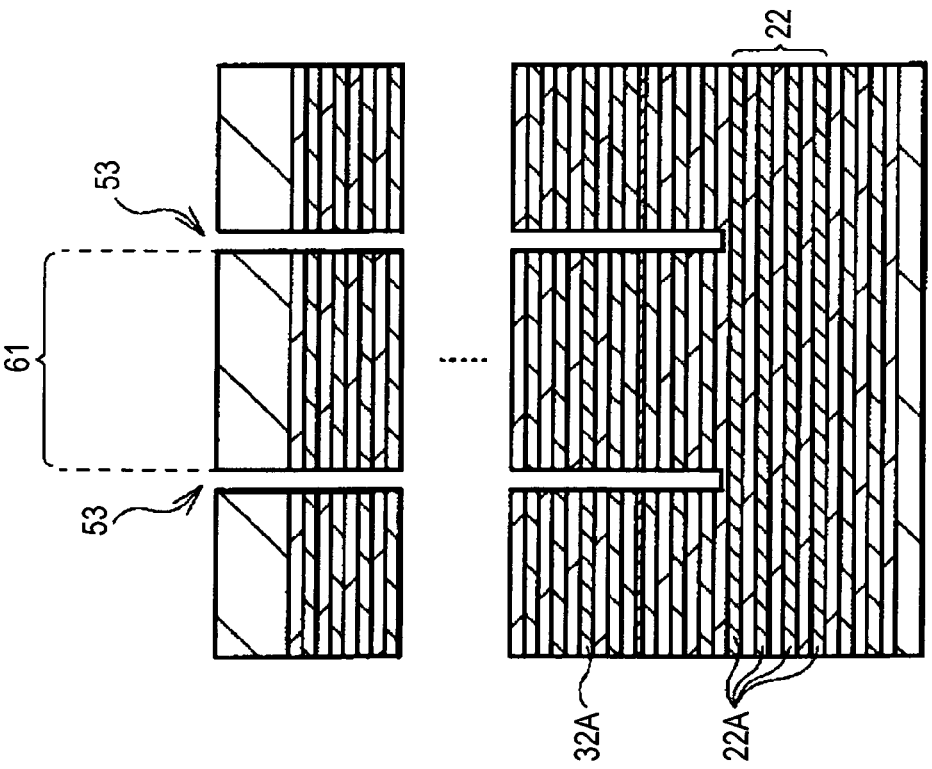

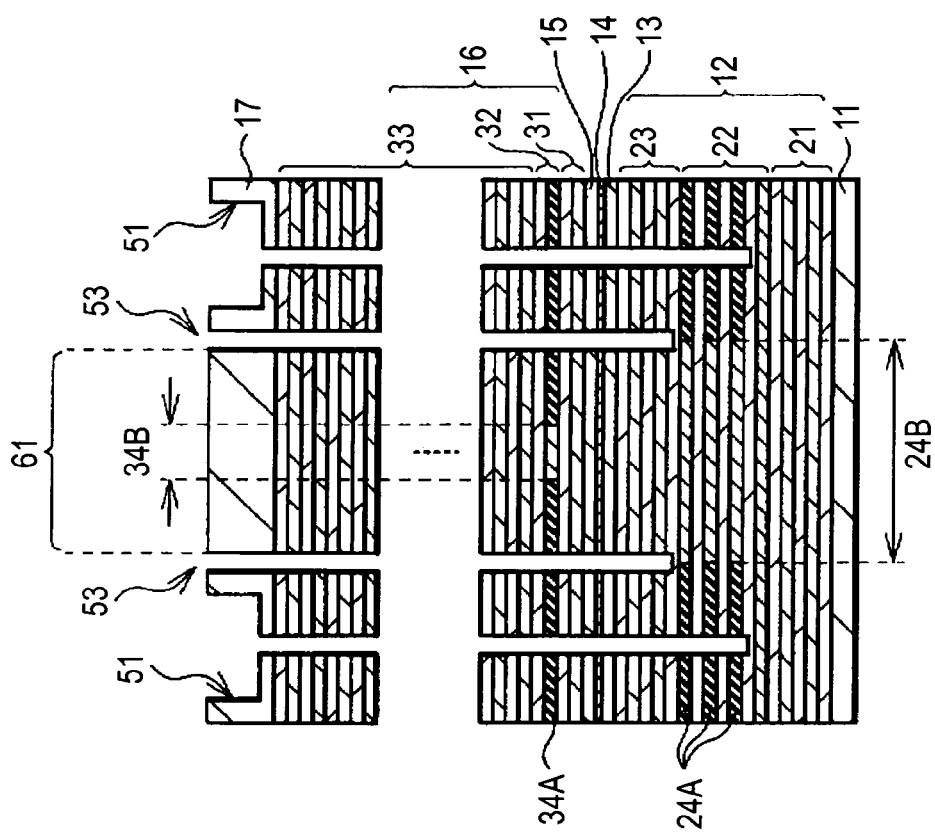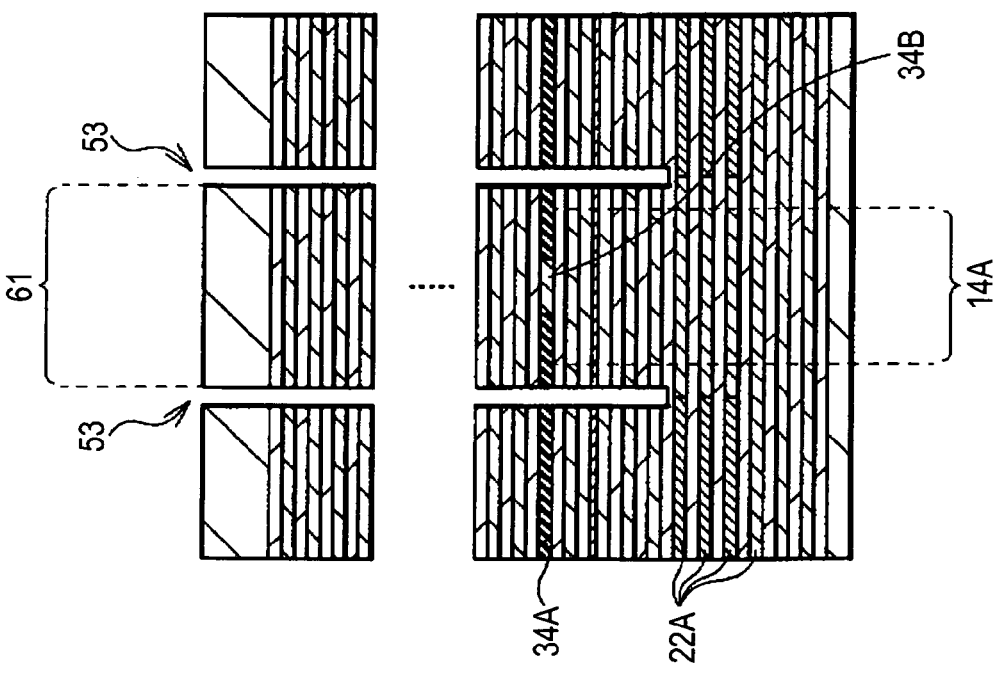

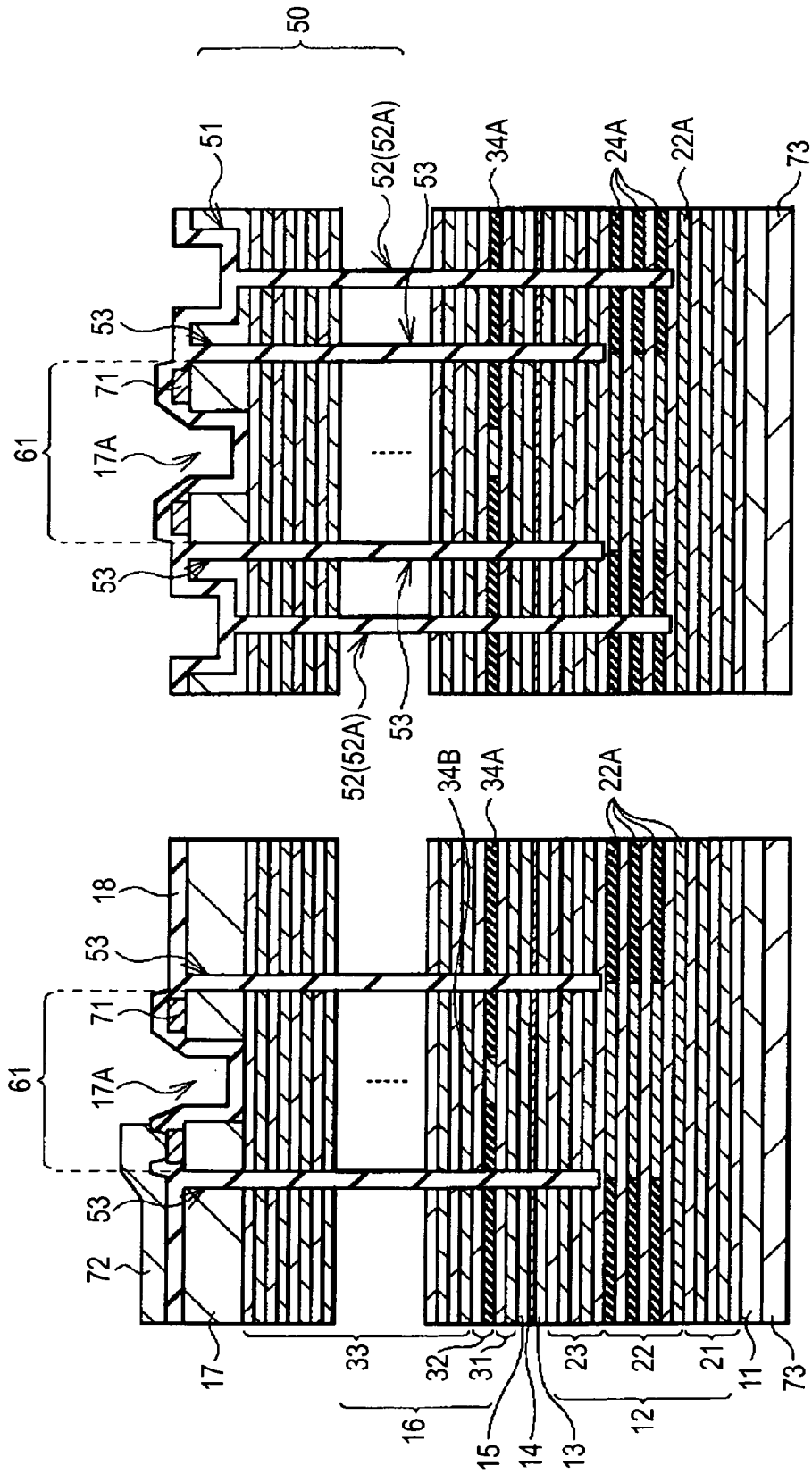

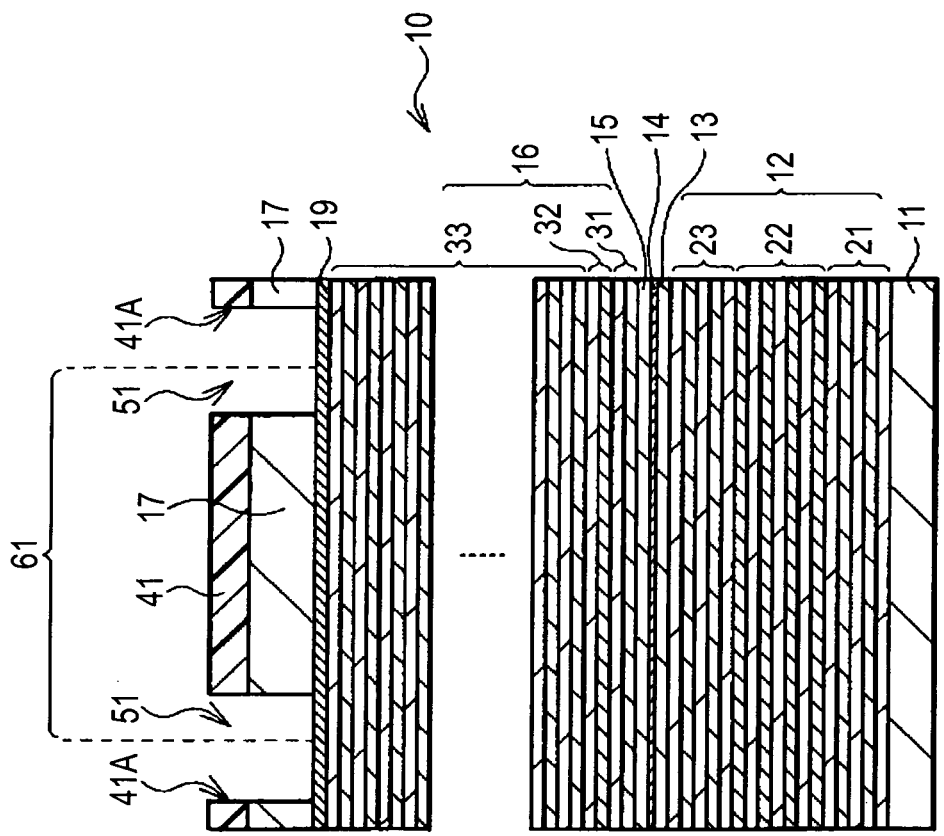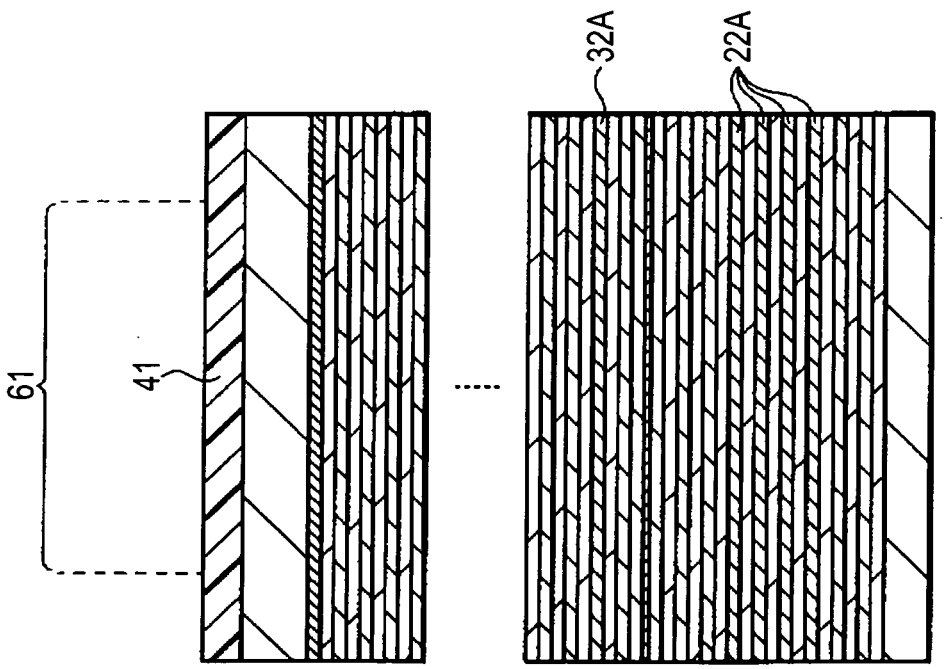

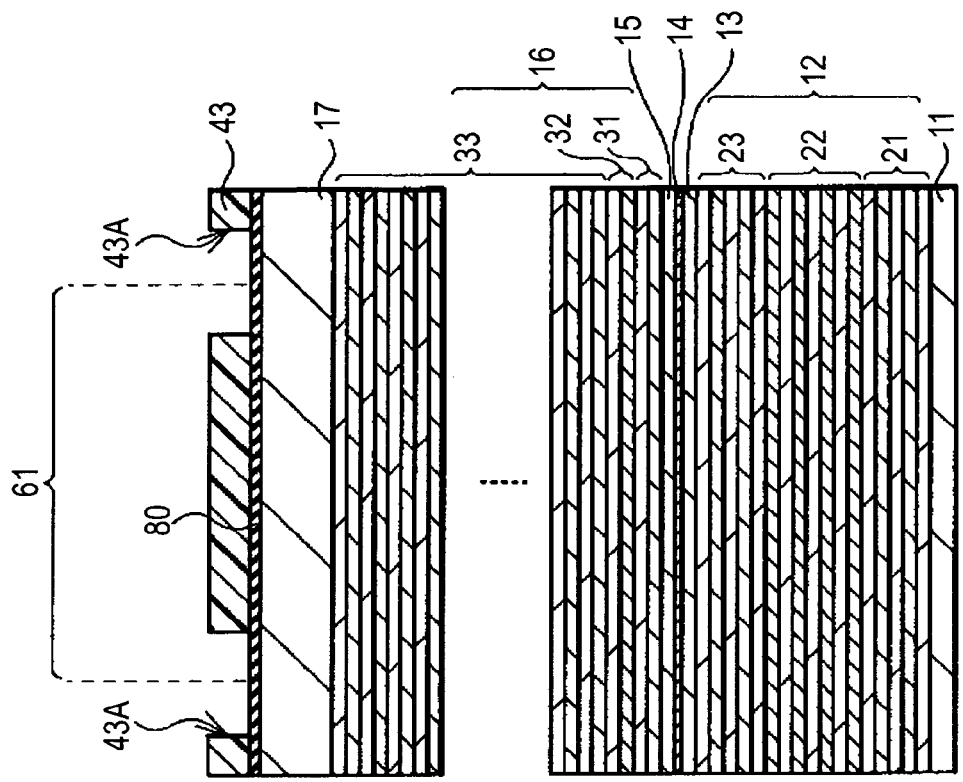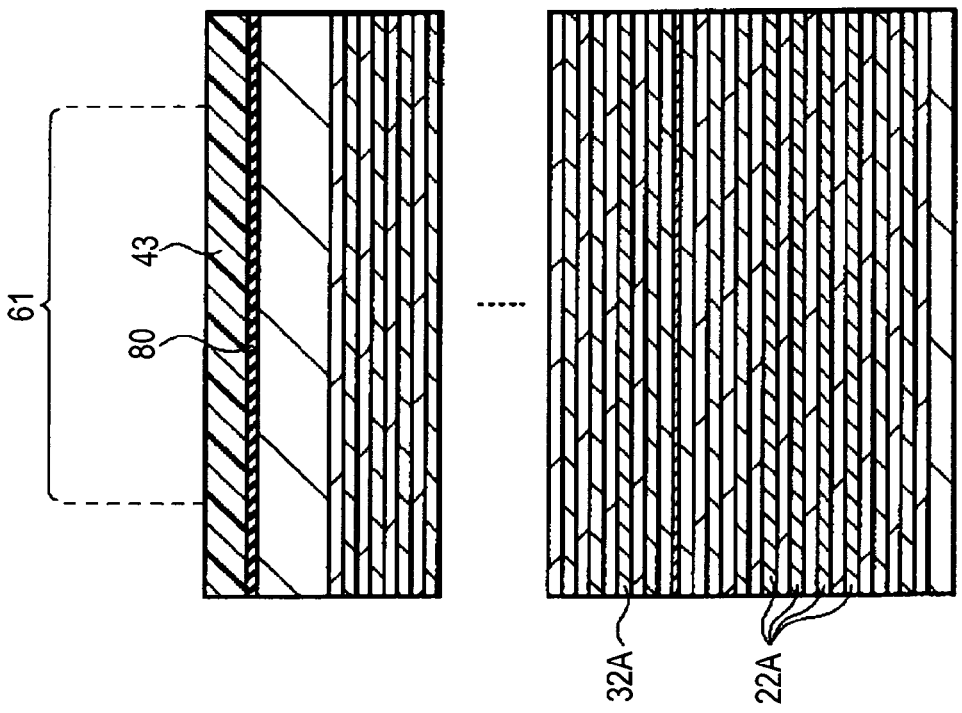

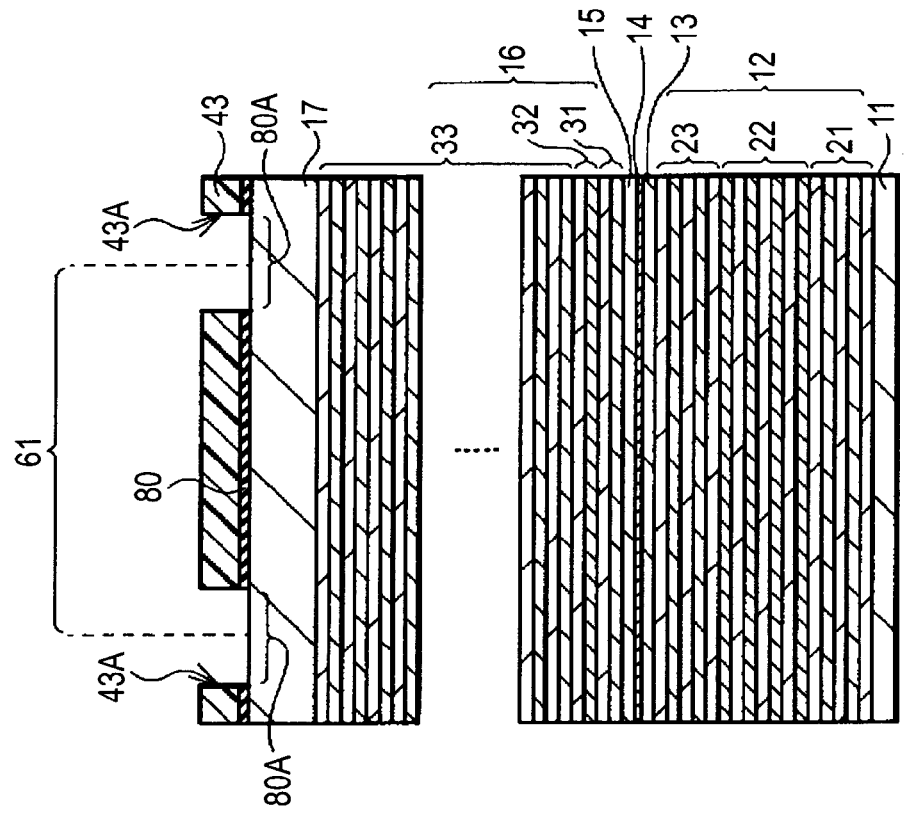
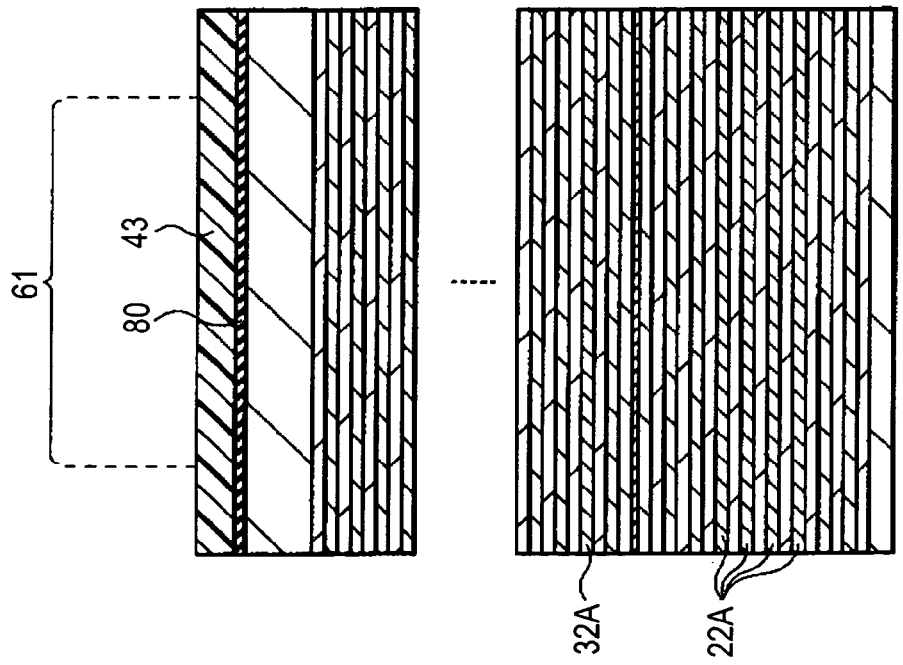

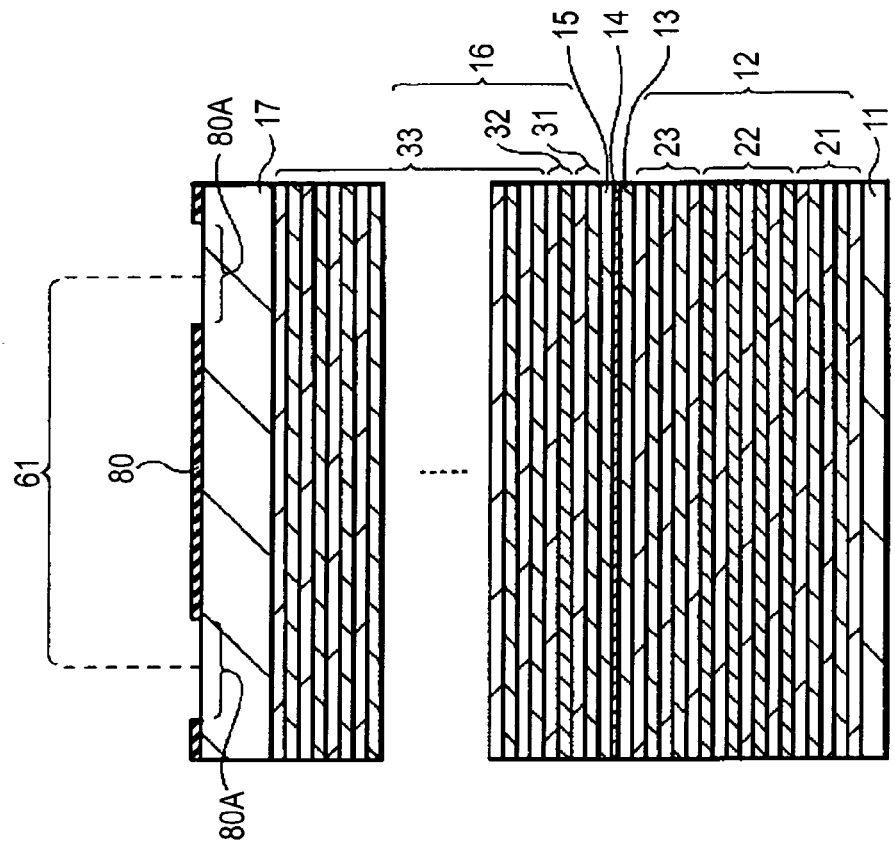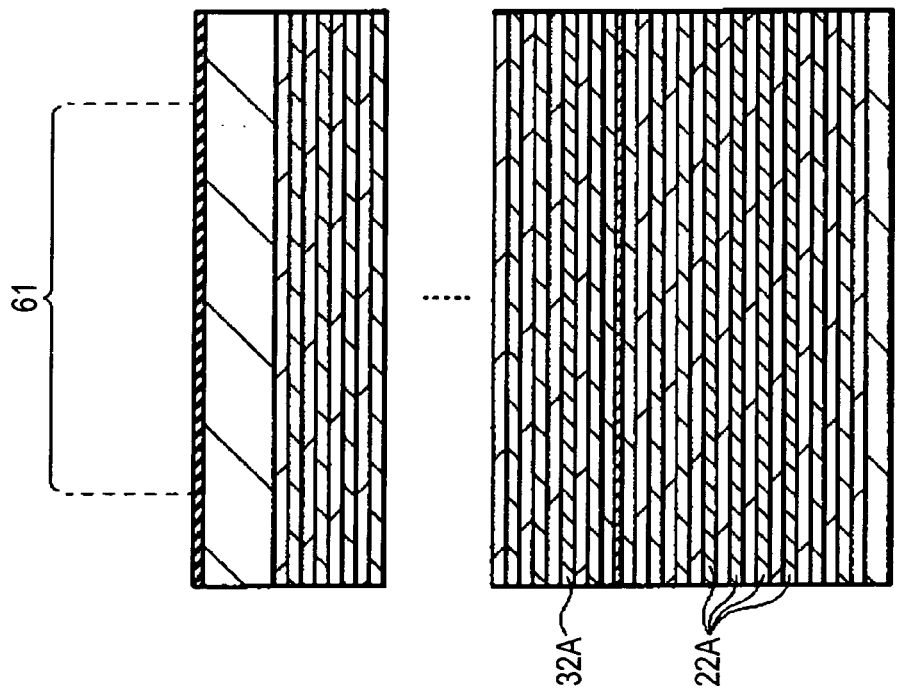

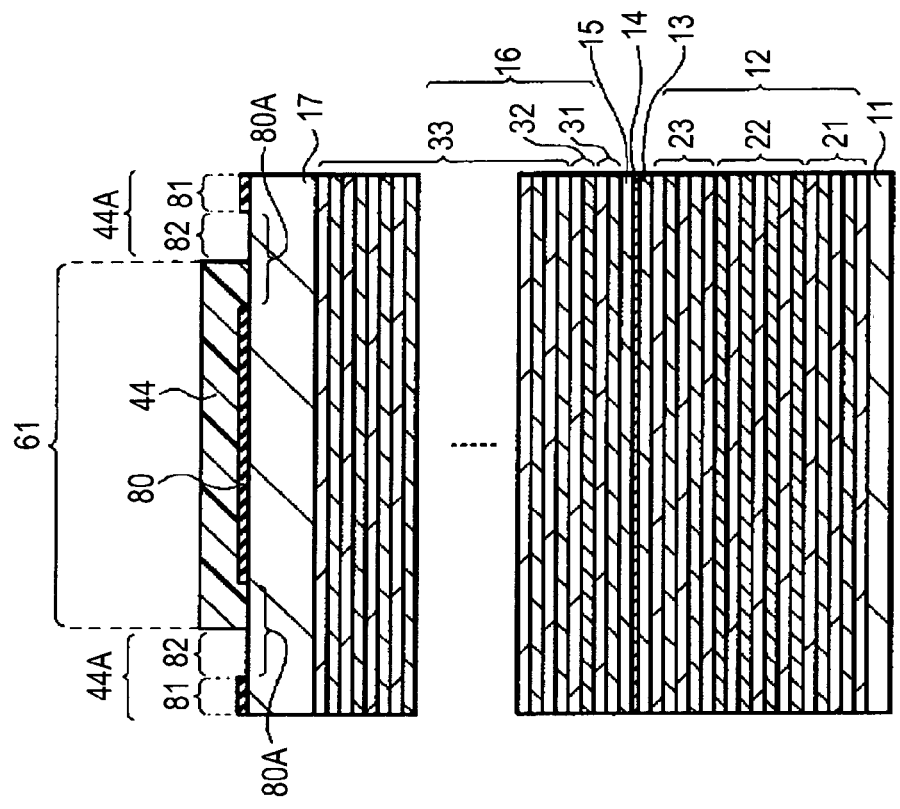
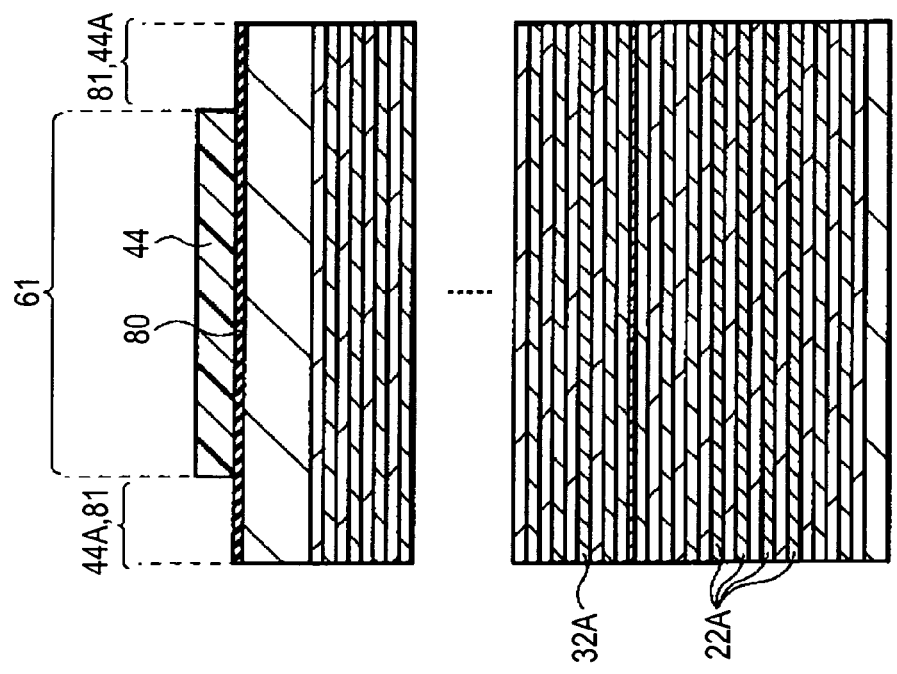

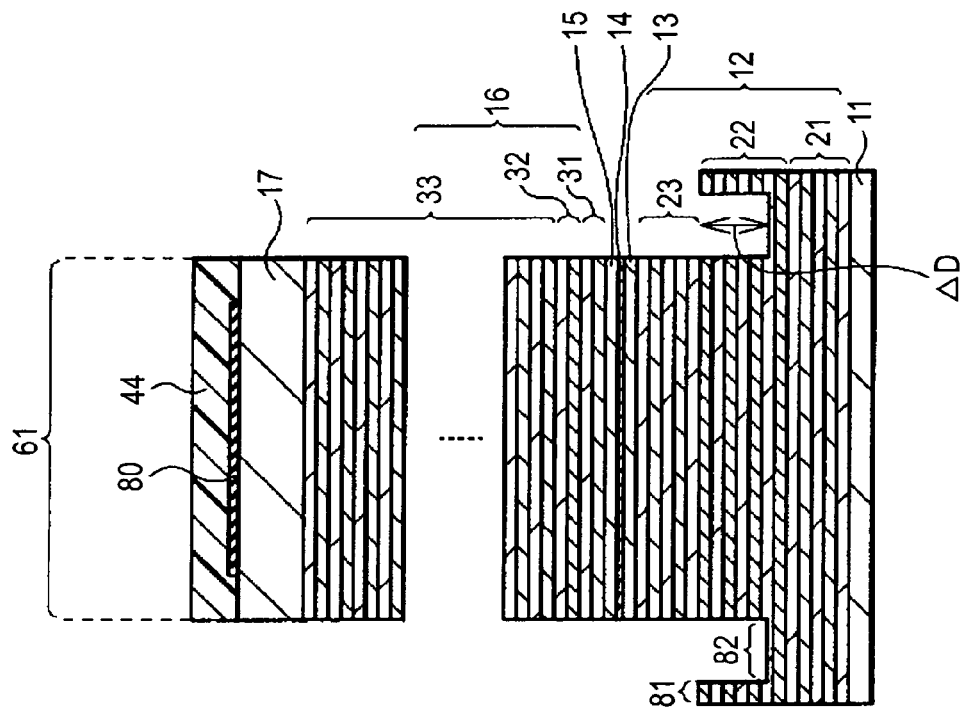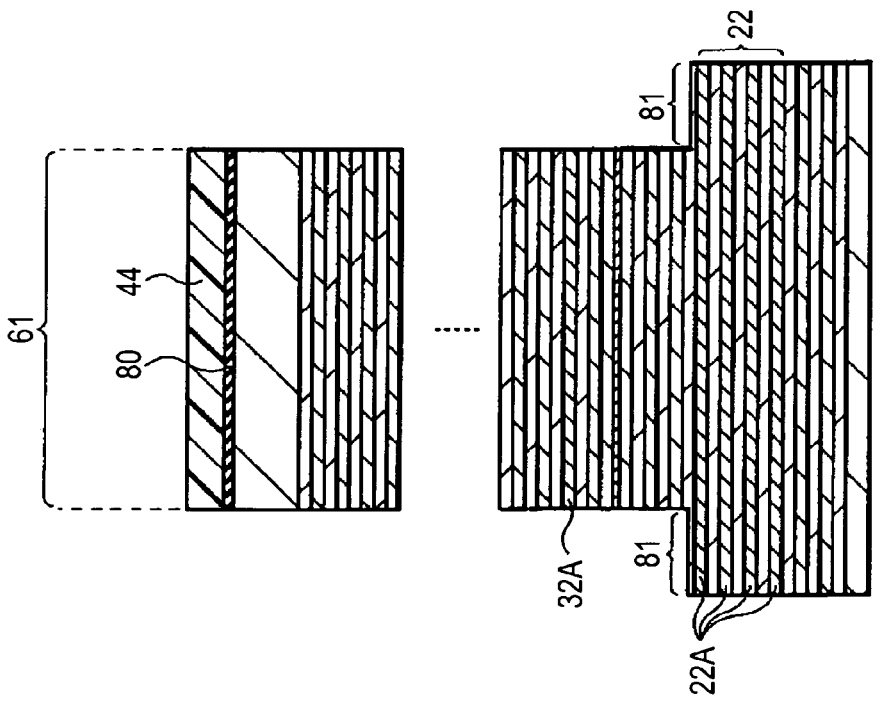

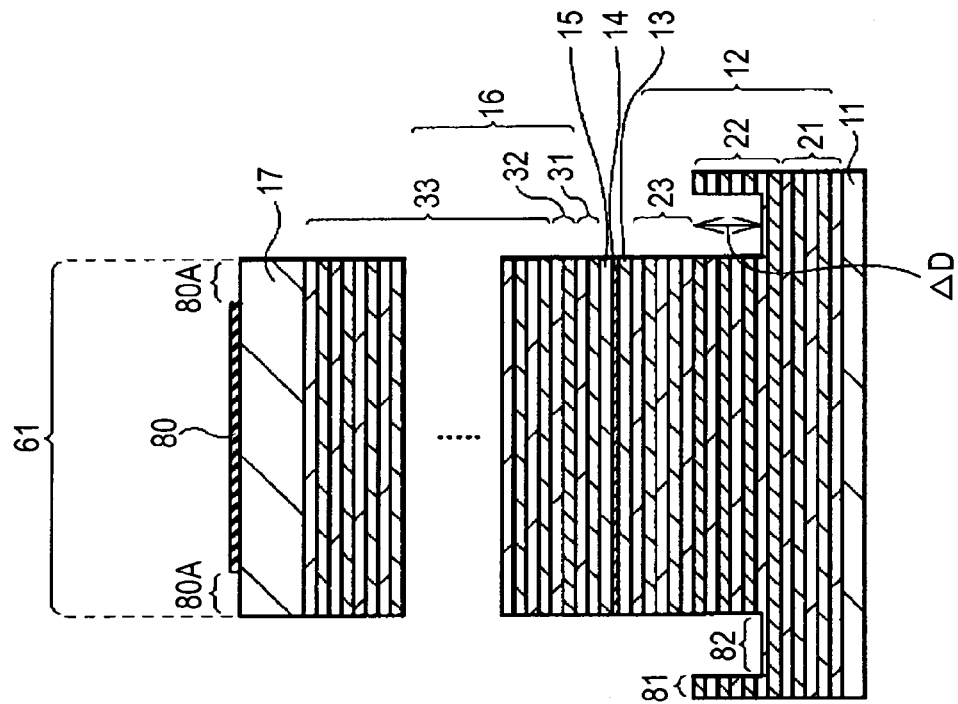
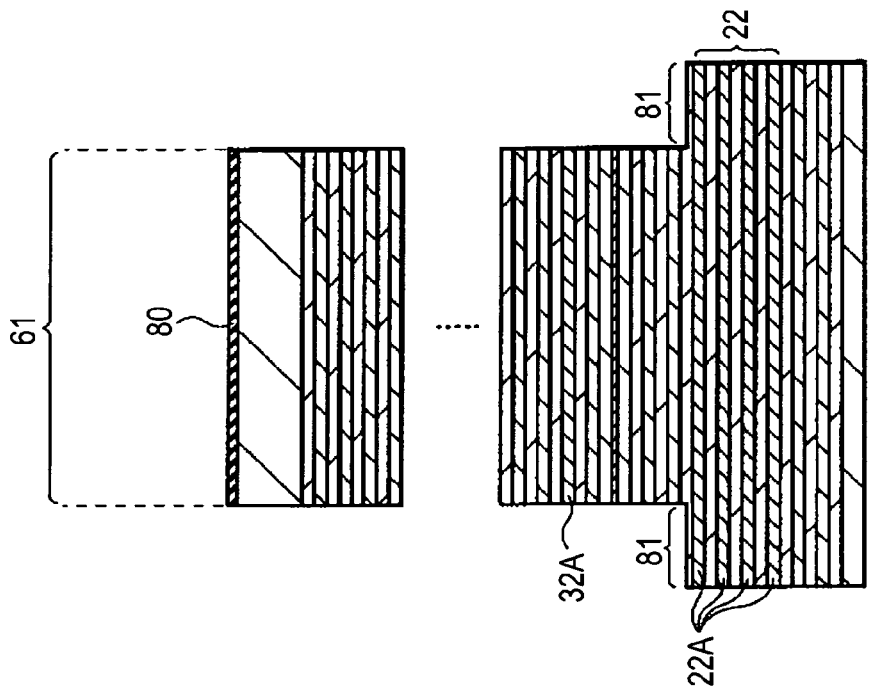

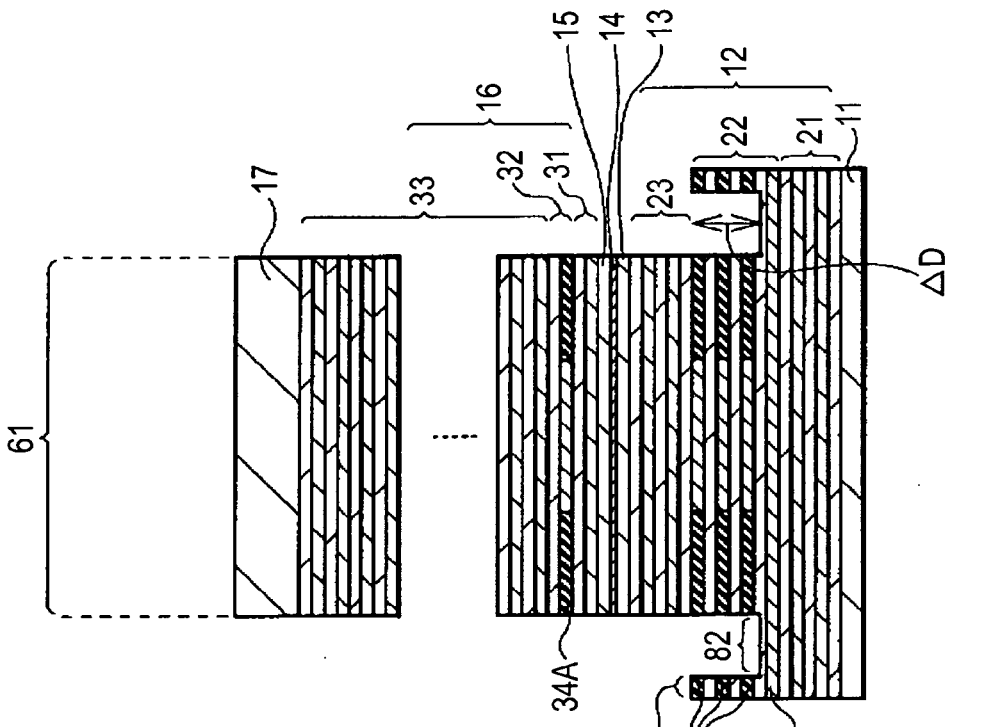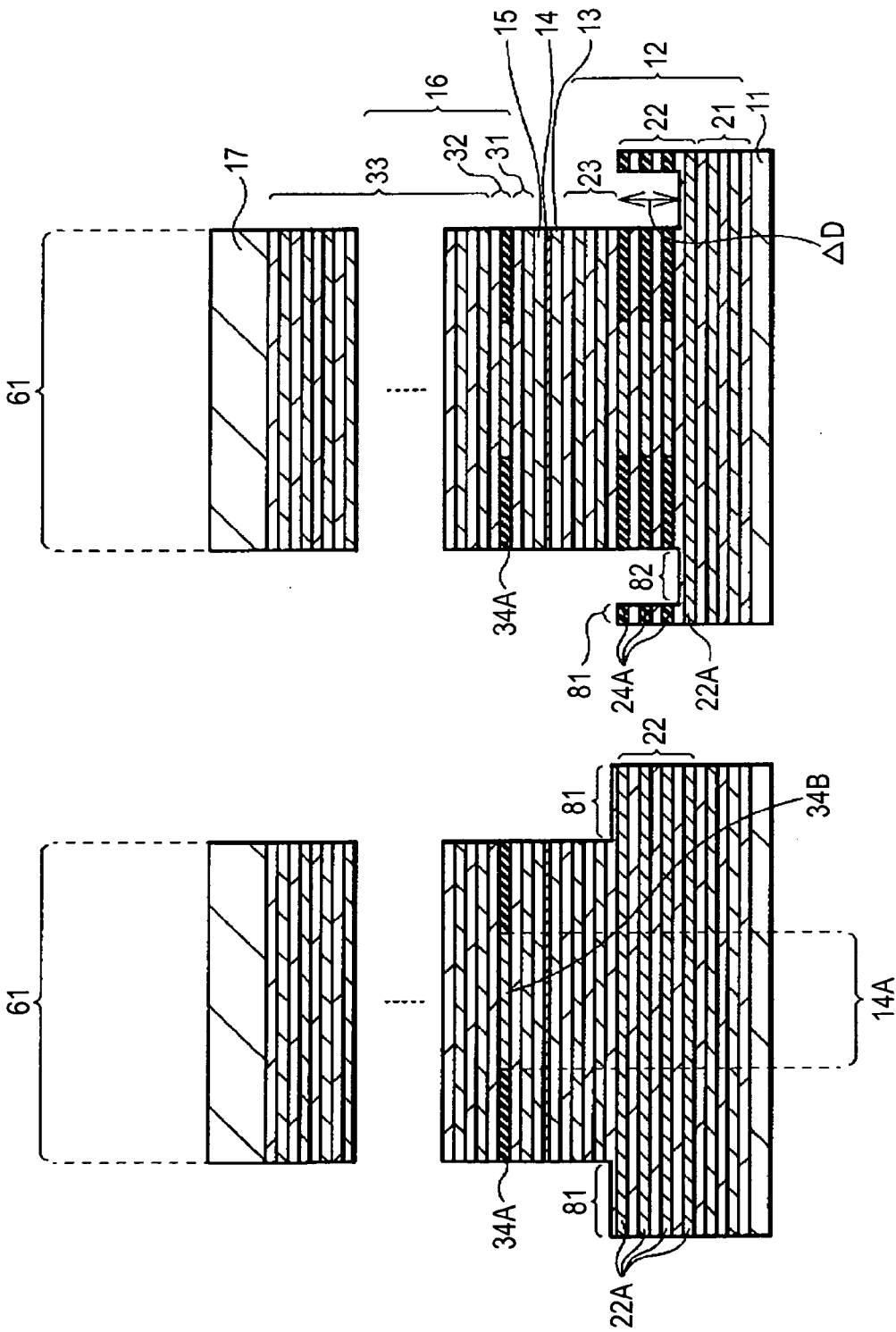

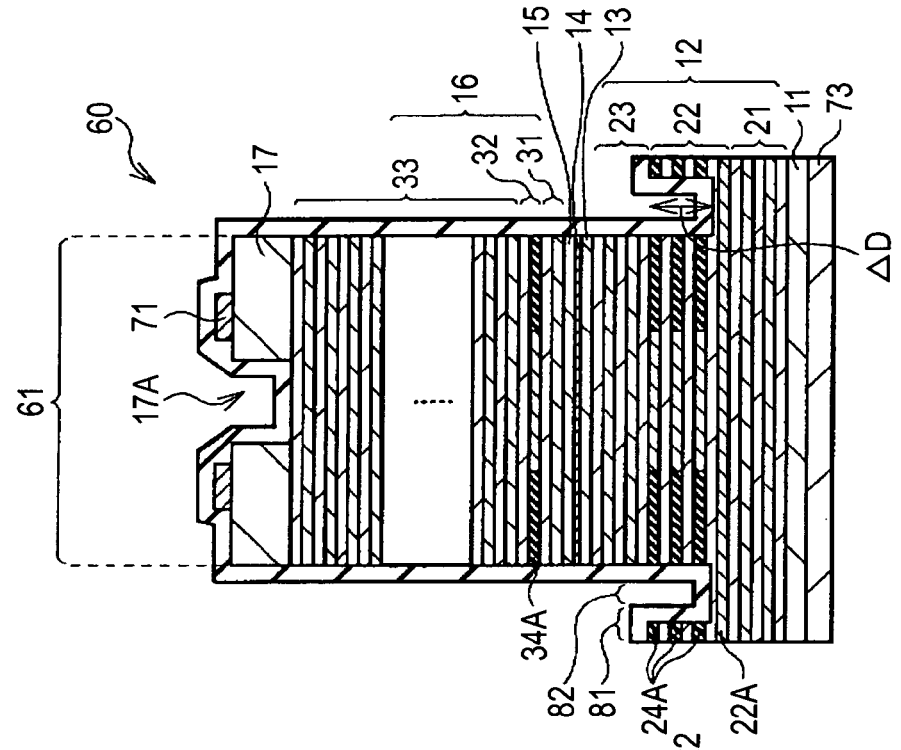
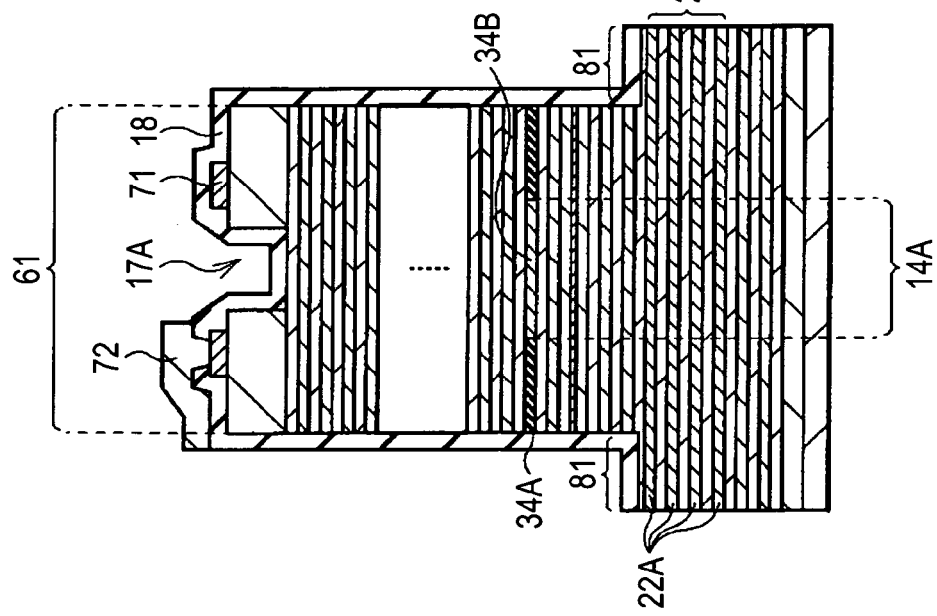

SURFACE-EMITTING SEMICONDUCTOR LASER AND MANUFACTURING METHOD THEREOF

BACKGROUND OF THE INVENTION

1. Field of the Invention

The present invention relates to a surface-emitting semiconductor laser having a laser emitting region at an upper surface and a manufacturing method thereof, and particularly relates to a surface-emitting semiconductor laser capable of being applied to applications where light output is necessary to be stable in the polarization direction and a manufacturing method thereof.

2. Description of the Related Art

The surface-emitting semiconductor laser is different from an edge-emitting laser in related art, which emits light in a direction orthogonal to a substrate and is capable of arranging many elements in a two-dimensional array state on the same substrate. Therefore, attentions is given to the surface-emitting laser as a light source for a digital copy machine or for a digital printer in recent years.

In this type of surface-emitting semiconductor laser in related art, a pair of multilayer film reflectors is formed on a semiconductor substrate and an active layer to be a light-emitting region is included between the pair of the multilayer film reflectors. In one of the multilayer film reflector, a current confinement layer having a structure in which a current injection region is narrowed is provided for increasing current injection efficiency to the active layer and for reducing threshold current. An n-side electrode is provided on the lower surface side and a p-side electrode is provided on the upper surface side respectively, and a light-emitting exit for emitting laser light is provided in the p-side electrode. In the surface-emitting semiconductor laser, electric current is injected into the active layer after being confined by the current confinement layer, and light is emitted there, then, light is emitted from the light-emitting exit of the p-side electrode as laser light while repeating reflection at the pair of multilayer film reflectors.

The above surface-emitting semiconductor layer generally has unevenness in which a polarization direction varies due to element variations and instability in which the polarization direction varies according to output and environmental temperature. Accordingly, when such surface-emitting semiconductor layer is applied to optical elements having polarized wave dependency such as a mirror and a beam splitter, for example, when the laser is used as a light source for the digital copy machine or the printer, variations in the polarization direction cause difference in a focus location or output of an image, which causes problem such as blur or color shading.

In response to the above problems, a technique of stabilizing the polarization direction into one direction by providing a polarization control function inside the surface-emitting semiconductor laser has been reported.

For example, in Japanese Patent No. 4138629 (Patent Document 1), it is disclosed that grooves having different depths are provided at two regions facing in the A-A direction as well as at two regions facing in the B-B direction orthogonal to the A-A direction around a resonator, and the number of oxidized layers in respective regions is changed to thereby increase compressive stress from one direction as well as increase polarized wave controllability.

SUMMARY OF THE INVENTION

However, in the related-art configuration of Patent Document 1, it is necessary to perform processing of forming a photoresist and processing of etching respective regions in order to form grooves having different depths at two regions. Accordingly, it is very difficult to form grooves concentrically around a light-emitting point with high accuracy and the shape of the current confinement region is liable to be uneven.

Thus, it is desirable to provide a surface-emitting semiconductor laser and a manufacturing method thereof capable of forming grooves having different depths with high accuracy by using a simple method to stabilize the polarization direction of laser light into one direction.

A manufacturing method of a surface-emitting semiconductor laser according to an embodiment of the invention includes the following steps of (A) to (C).

(A) a step of forming a stacked structure having a lower-multilayer film reflector including a lower oxidizable layer having at least one layer, an active layer having a light emitting region, an upper-multilayer film reflector including an upper oxidizable layer and an upper layer on a substrate in this order (B) a step of providing a first groove in the upper layer and (C) a step of providing a second groove including a portion overlapping the first groove in a planar shape and a portion not overlapping the first groove in the stacked structure A surface-emitting semiconductor laser according to another embodiment of the invention includes the following components of (A) to (D).

(A) a columnar portion having a stacked structure including a lower-multilayer film reflector, an active layer having a light emitting region, an upper-multilayer film reflector and an upper layer on a substrate in this order (B) an upper oxide layer provided at the upper-multilayer film reflector on a side surface of the columnar portion (C) a stepped concave portion provided at part of a periphery of the columnar portion or at a region outside the columnar portion, including the first groove in the upper layer and the second groove at a bottom of the first groove and (D) a lower oxide layer having at least one layer provided at the lower-multilayer film reflector at a side surface of the stepped concave portion.

Note that some kind of layer may be inserted between the lower-multilayer film reflector and the active layer or between the active layer and the upper-multilayer film reflector.

In the surface-emitting semiconductor laser according to the embodiment of the invention, the stepped concave portion including the first groove at the upper layer and the second groove at the bottom of the first groove is provided at part of the periphery of the columnar portion or at the region outside the columnar portion, and the lower oxide film having at least one layer is provided at the lower-multilayer film reflector at the side surface of the stepped concave portion, therefore, stress due to the lower oxide layer is unevenly generated in the active layer. At this time, when the uneven distribution of the lower oxide layer has anisotropy, anisotropic stress due to the lower oxide layer is generated in the active layer, therefore, any one of the polarization component in the direction parallel to the direction of stress and the polarization component in the direction orthogonal to the direction of stress is increased and other polarization components are suppressed. Accordingly, the polarization component of laser light is fixed into one direction.

A manufacturing method of a surface-emitting semiconductor laser according to still another embodiment of the invention includes the following steps of (A) to (D).

(A) a step of forming a stacked structure having a lower-multilayer film reflector including a lower oxidizable layer having at least one layer, an active layer having a light emitting region, an upper-multilayer film reflector including an upper oxidizable layer and an insulating layer on a substrate in this order (B) a step of providing an insulating film trimmed region by removing part of the insulating film (C) a step of providing a region with the insulating film on the insulating film not protected by a photoresist film and a region without the insulating film on the insulating film trimmed region not protected by the photoresist film by forming the photoresist film over the insulating film and the insulating film trimmed region and (D) etching the region with the insulating film and the region without the insulating film by using the photoresist film as a mask.

In the manufacturing method of the surface-emitting semiconductor laser according to the embodiment of the invention, the second groove having the portion overlapping the first groove and the portion not overlapping the first groove in the planer shape are provided after providing the first groove at the upper layer, therefore, the portion of the second groove overlapping the first groove can be formed so as to be deeper than the portion not overlapping the first groove. The positional accuracy of the portion of the second groove overlapping the first groove depends on the positional accuracy in the forming process of the second groove and positional displacement of the first groove is not reflected. Therefore, it is possible to form grooves having different depths with high accuracy and to stabilize the polarization direction of laser light into one direction by using the simple method.

In the surface-emitting semiconductor laser according to the embodiment of the invention, the stepped concave portion including the first groove at the upper layer and the second groove at the bottom of the first groove is provided at the part of the periphery of the columnar portion and the region outside the columnar portion, and the lower oxide layer having at least one layer is provided in the lower-multilayer film reflector at the side surface of the stepped concave portion, which enables the polarization direction of laser light to be stabilized into one direction.

In another manufacturing method of the surface-emitting semiconductor laser according to the embodiment of the invention, the photoresist film is formed over the insulating film and the insulating film trimmed region, the region with the insulating film on the insulating film not protected by the photoresist film and the region without the insulating film on the insulating film trimmed region not protected by the photoresist film are provided, then, the region with the insulating film and the region without the insulating film are etched by using the photoresist film as a mask, therefore, the region without the insulating film can be etched so to be deeper than the region with the insulating film in the same process. Accordingly, it is possible to form grooves having different depths with high accuracy and to stabilize the polarization direction of laser light into one direction by using the simple method.

BRIEF DESCRIPTION OF THE DRAWINGS

FIG. 3A is a cross-sectional view taken along the IIIA-IIIA line of FIG. 2 and FIG. 3B is a cross-sectional view taken along the IIIB-IIIB line of FIG. 2;

FIGS. 4A and 4B are cross-sectional views showing a process continued from FIGS. 3A and 3B;

FIGS. 5A and 5B are cross-sectional views showing a process continued from FIGS. 4A and 4B;

FIG. 7A is a cross-sectional view taken along the VIIA-VIIA line of FIG. 6 and FIG. 7B is a cross-sectional view taken along the VIIB-VIIB line of FIG. 6;

FIGS. 8A and 8B are cross-sectional views showing a process continued from FIGS. 7A and 7B;

FIGS. 9A and 9B are cross-sectional views showing a process continued from FIGS. 8A and 8B;

FIGS. 10A and 10B are cross-sectional views showing a process continued from FIGS. 9A and 9B;

FIGS. 11A and 11B are cross-sectional views showing a process continued from FIGS. 10A and 10B;

FIGS. 12A and 12B are cross-sectional views showing a process continued from FIGS. 11A and 11B;

FIGS. 13A and 13B are cross-sectional views showing a process continued from FIGS. 12A and 12B;

FIGS. 14A and 14B are cross-sectional views showing a process continued from FIGS. 13A and 13B;

FIGS. 15A and 15B are cross-sectional views showing a process continued from FIGS. 14A and 14B;

FIGS. 16A and 16B are cross-sectional views showing a process continued from FIGS. 15A and 15B;

FIG. 18A is a cross-sectional view taken along the XVIIIA-XVIIIA line of FIG. 17 and FIG. 18B is a cross-sectional view taken along the XVIIIB-XVIIIB line of FIG. 17;

FIGS. 19A and 19B are cross-sectional views showing a process continued from FIGS. 18A and 18B;

FIGS. 20A and 20B are cross-sectional views showing a process continued from FIGS. 19A and 19B;

FIGS. 21A and 21B are cross-sectional views showing a process continued from FIGS. 20A and 20B;

FIGS. 22A and 22B are cross-sectional views showing a process continued from FIGS. 21A and 21B;

FIG. 24A is a cross-sectional view taken along the XXIVA-XXIVA line of FIG. 23 and FIG. 24B is a cross-sectional view taken along the XXIVB-XXIVB line of FIG. 23;

FIG. 26A is a cross-sectional view taken along the XXVIA-XXVIA line of FIG. 25 and FIG. 26B is a cross-sectional view taken along the XXVIB-XXVIB line of FIG. 25;

FIGS. 27A and 27B are cross-sectional views showing a process continued from FIG. 25;

FIGS. 28A and 28B are cross-sectional views showing a process continued from FIGS. 27A and 27B;

FIGS. 29A and 29B are cross-sectional views showing a process continued from FIGS. 28A and 28B;

FIGS. 30A and 30B are cross-sectional views showing a process continued from FIGS. 29A and 29B;

FIGS. 31A and 31B are cross-sectional views showing a manufacturing method of a surface-emitting semiconductor laser according to a fourth embodiment of the invention;

FIG. 33A is a cross-sectional view taken along the XXXIIIA-XXXIIIA line of FIG. 32 and FIG. 33B is a cross-sectional view taken along the XXXIIIB-XXXIIIB line of FIG. 32;

FIGS. 34A and 34B are cross-sectional views showing a process continued from FIG. 32;

FIGS. 35A and 35B are cross-sectional views showing a process continued from FIGS. 34A and 34B;

FIG. 37A is a cross-sectional view taken along the XXXVIIA-XXXVIIA line of FIG. 36 and FIG. 37B is a cross-sectional view taken along the XXXVIIB-XXXVIIB line of FIG. 36;

FIGS. 38A and 38B are cross-sectional views showing a process continued from FIG. 36;

FIGS. 39A and 39B are cross-sectional views showing a process continued from FIGS. 38A and 38B;

FIGS. 41A and 41B are cross-sectional views showing a process continued from FIGS. 40A and 40B;

FIGS. 42A and 42B are cross-sectional views showing a process continued from FIGS. 41A and 41B;

DESCRIPTION OF THE PREFERRED EMBODIMENTS

Hereinafter, embodiments of the invention will be explained in detail with reference to the drawings. The explanation is performed in the following order.

Figure 1:
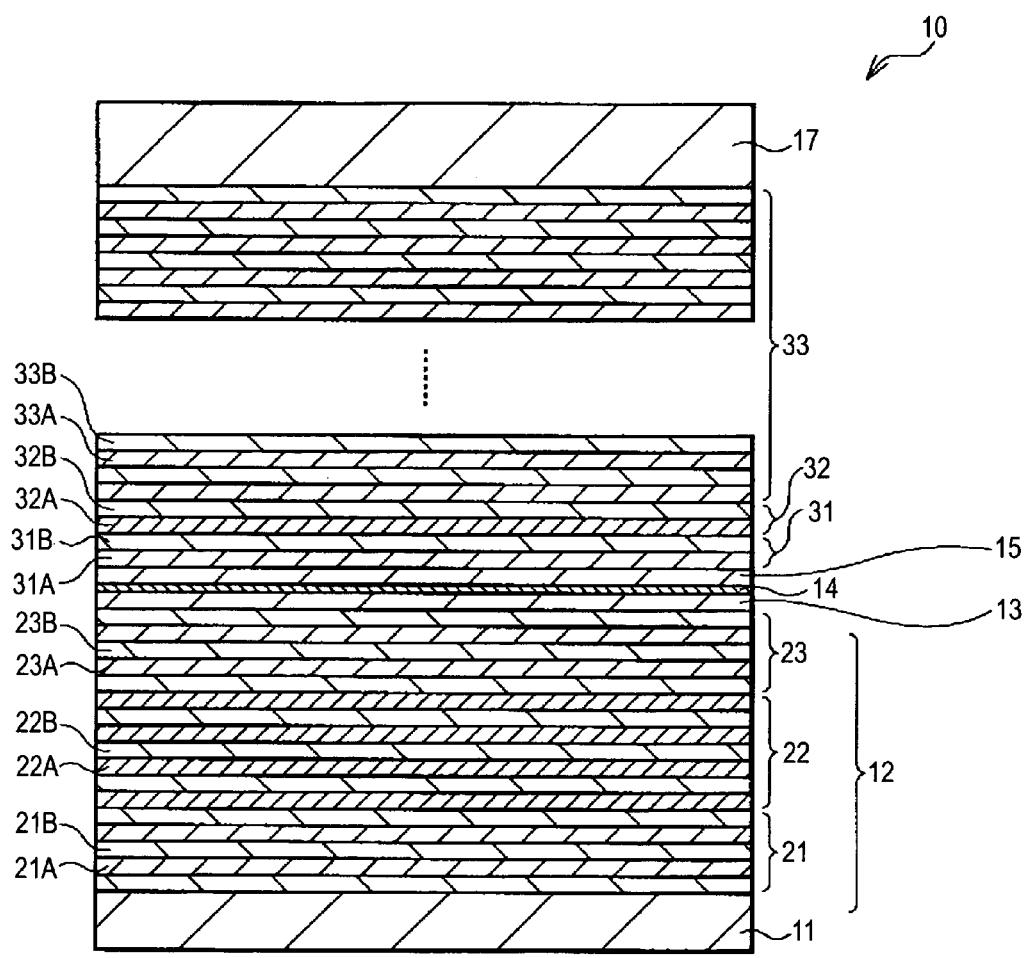
FIG. 1 is a cross-sectional view showing a manufacturing method of a surface-emitting semiconductor laser in the order of processes according to a first embodiment of the invention.

1. First Embodiment (an example in which a second groove is provided in a ring shape surrounding a columnar portion)
2. Second Embodiment (an example in which the second groove is provided at the whole region other than the columnar portion)
3. Third Embodiment (an example in which a third groove is provided in a ring shape surrounding the columnar portion and a first groove and a second groove are provided outside the third groove)
4. Fourth Embodiment (an example in which the first groove is provided by using an etching stopper layer)
5. Fifth Embodiment (an example in which an insulating film trimmed region is provided instead of the first groove)
First Embodiment
Manufacturing Method FIG. 1 to FIG. 16B show a manufacturing method of a surface-emitting semiconductor laser according to a first embodiment of the invention in the order of processes. First, as shown in FIG. 1, a compound semiconductor layer on a substrate 11 made of GaAs is formed by using, for example, a MOCVD (Metal Organic Chemical Vapor Deposition) method. In this case, as materials for a III-V-group compound semiconductor, for example, trimethyl aluminum (TMA), trimethyl gallium (TMG), trimethyl indium (TMIn) and arsine (AsH3) are used. As a material for a donor impurity, for example, H2Se is used, and as a material for an acceptor impurity, for example, dimethylzinc (DMZ) is used.

First, a lower DBR mirror layer 12, a lower spacer layer (cladding layer) 13, an active layer 14, an upper spacer layer (cladding layer) 15, an upper DBR mirror layer 16 and a contact layer 17 are sequentially stacked on the substrate 11 to form a stacked structure 10.

As the substrate 11, for example, an n-type GaAs substrate is used. The GaAs substrate is preferably (100) surface substrate, however, special substrates such as a substrate inclined by approximately 2 degrees to 20 degrees with respect to the (100) surface, an (n11) surface substrate ("n" is an integer) and so on may be applied.

The lower DBR mirror layer 12 is formed, for example, by stacking a lower first DBR mirror layer 21, a lower second DBR mirror layer 22 and a lower third DBR mirror layer 23 in the order from the substrate 11 side. The lower first DBR mirror layer 21 is formed by stacking plural pairs of a low-refractive index layer 21A and a high-refractive index layer 21B which are taken as a pair. The low-refractive index layer 21A is made of, for example, an n-type AlyGa1-yAs having an optical thickness of $\lambda/4$ ($\lambda$ denotes an oscillation wavelength) and the high-refractive index layer 21B is made of, for example, an n-type AlzGa1-zAs having the optical thickness of $\lambda/4$. The lower second DBR mirror layer 22 is formed by stacking plural pairs of a low-refractive index layer 22A and a high-refractive index layer 22B which are taken as a pair. The low-refractive index layer 22A is made of, for example, an n-type Alβ Ga1-βAs having the optical thickness of $\lambda/4$ and the high-refractive index layer 22B is made of, for example, the n-type AlzGa1-zAs having the optical thickness of $\lambda/4$. The lower third DBR mirror layer 23 is formed by stacking plural pairs of a low-refractive index layer 23A and a high-refractive index layer 23B which are taken as a pair. The low-refractive index layer 23A is made of, for example, an n-type AlxGa1-xAs having the optical thickness of $\lambda/4$ and the high-refractive index layer 23B is made of, for example, the n-type AlzGa1-zAs having the optical thickness of $\lambda/4$.

The upper DBR mirror layer 16 is formed, for example, by stacking an upper first DBR mirror layer 31, an upper second DBR mirror layer 32 and an upper third DBT mirror layer 33 in the order from the substrate 11 side. The upper first DBR mirror layer 31 is formed by stacking plural pairs of a low-refractive index layer 31A and a high-refractive index layer 31B which are taken as a pair. The low-refractive index layer 31A is made of, for example, the n-type AlxGa1-xAs having the optical thickness of $\lambda/4$ ($\lambda$ denotes the oscillation wavelength) and the high-refractive index layer 31B is made of, for example, the n-type AlzGa1-zAs having the optical thickness of $\lambda/4$. The upper second DBR mirror layer 32 is formed by stacking plural pairs of a low-refractive index layer 32A and a high-refractive index layer 32B which are taken as a pair. The low-refractive index layer 32A is made of, for example, the n-type AlαGa1-αAs having the optical thickness of $\lambda/4$ and the high-refractive index layer 32B is made of, for example, the n-type AlzGa1-zAs having the optical thickness of $\lambda/4$. The upper third DBR mirror layer 33 is formed by stacking plural pairs of a low-refractive index layer 33A and a high-refractive index layer 33B which are taken as a pair. The low-refractive index layer 33A is made of, for example, the n-type AlxGa1-xAs having the optical thickness of $\lambda/4$ and the high-refractive index layer 33B is made of, for example, the n-type AlzGa1-zAs having the optical thickness of $\lambda/4$.

A composition ratio of aluminum (Al) in respective layers of the lower DBR mirror layer 12 and the upper DBR mirror layer 16 satisfies the following.

$$1 \geq \alpha, \beta \geq x, y > 0.8 > z \geq 0$$

That is, the low-refractive index layer 22A of the lower second DBR mirror layer 22 is a lower oxidizable layer 22A having at least one layer made of AlβGa1-βAs, and the low-refractive index layer 32A of the upper second DBR mirror layer 32 is an upper oxidizable layer 32A made of AlαGa1-αAs.

The lower spacer layer 13 is made of, for example Alx2Ga1-x2As (0<x2<1). The active layer 14 is made of, for example, AlGaAs-system materials. The upper spacer layer 15 is made of, for example, Alx3Ga1-x3As (0<x3<1). It is desirable that the lower spacer layer 13, the active layer 14 and the upper spacer layer 15 do not include an impurity, however, a p-type or an N-type impurity may be included. As the n-type impurity, for example, silicon (Si), selenium (Se) and the like can be cited. As the p-type impurity, zinc (Zn), magnesium (Mg), beryllium (Be), carbon (C) and the like can be cited.

The contact layer 17 is made of, for example, Alx4Ga1-x4As ($0 \leqq x4 \leqq 0.3$). The thickness of the contact layer 17 will be described later.

Figure 2:
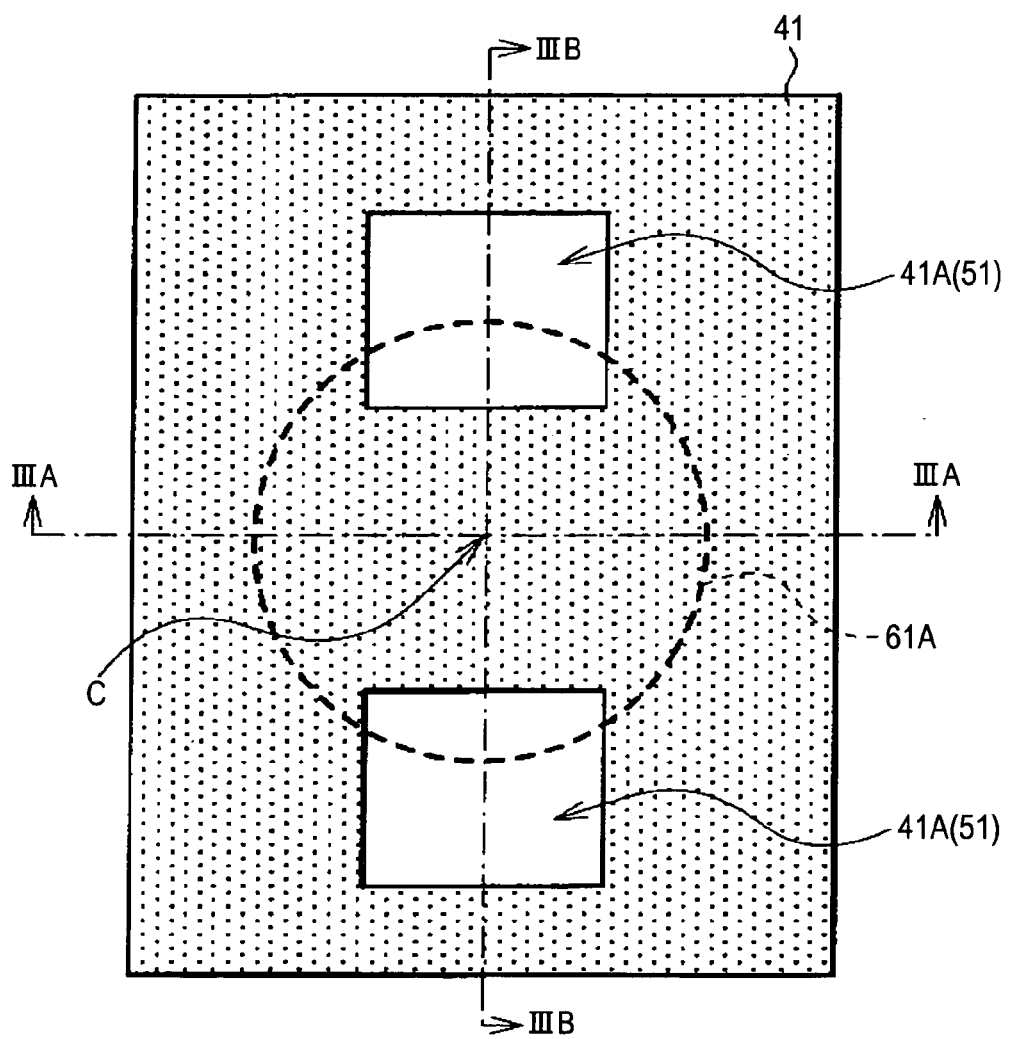
FIG. 2 is an upper surface view showing a process continued from FIG. 1.

Next, a photoresist film 41 is formed on the contact layer 17 and openings 41A for forming later-described first grooves 51 are formed on the photoresist film 41 as shown in FIG. 2 and FIGS. 3A and 3B.

Subsequently, the upper layer of the upper DBR mirror layer 16, namely, the contact layer 17 is etched by a wet etching method or a dry etching method using the photoresist film 41 as a mask to form the first grooves 51 as shown in FIGS. 4A and 4B. In cross-sectional views showing respective processes in FIGS. 4A and 4B and the subsequent drawings, views identified with a suffix A show a structure of a cross section obtained by being cut in the same direction as viewed from the direction of arrows of the IIIA-IIIA line in FIG. 2 and views identified with a suffix B show a structure of a cross section obtained by being cut in the same direction as viewed from the direction of arrows of IIIB-IIIB line in FIG. 2.

It is preferable that the first grooves 51 have a desired depth in which the groove does not pierce through the contact layer 17. The depth of the first grooves 51 will be described later with the thickness of the contact layer 17. Concerning the planar arrangement of the first grooves 51, they are arranged at parts of the periphery of a columnar portion formation estimated region 61A. Specifically, the first grooves 51 are preferably formed at positions on a straight line passing through a center C of the columnar portion formation estimated region 61A so as to be symmetrical with respect to the center C, that is, at opposite angles in one direction for controlling polarization. It is not necessary to provide the first groove 51 at two points, but it is sufficient to provide the first groove 51 at least at one point. The planar shape of the first groove 51 is not limited to a rectangular shape as shown in FIG. 2 but is optional as long as sufficient oxidization can be performed for adding anisotropic stress to the active layer 14.

After forming the first grooves 51, the photoresist film 41 is peeled off as shown in FIGS. 5A and 5B.

Figure 6:
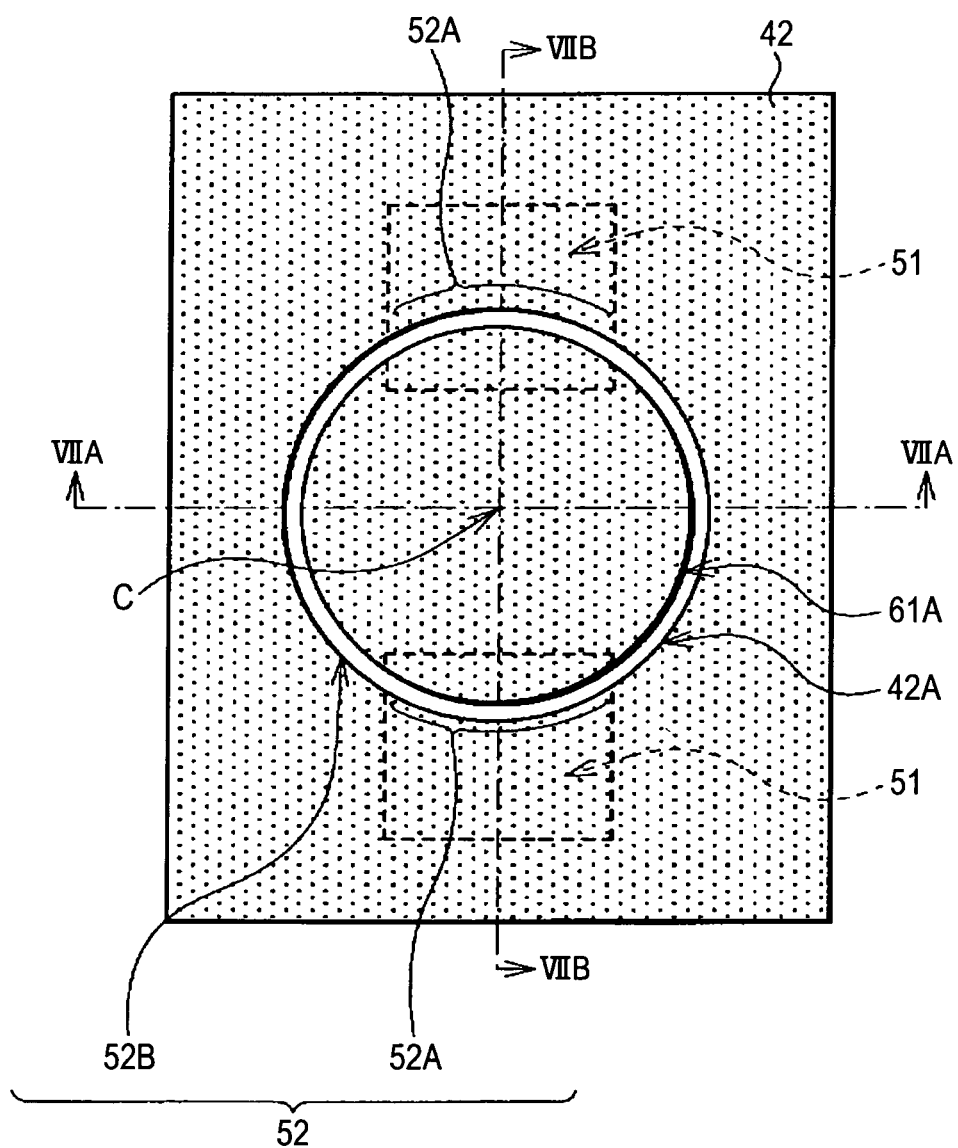
FIG. 6 is an upper surface view showing a process continued from FIGS. 5A and 5B.

After peeling off the photoresist film 41, a photoresist 42 is formed on the contact layer 17 in which the first grooves 51 have been formed and an opening 42A for forming a later-described second groove 52 is formed on the photoresist film 42 as shown in FIG. 6 and FIGS. 7A and 7B.

After forming the opening 42A, the second groove 52 is formed by the wet etching method or the dry etching method, preferably by the dry etching method using the photoresist film 42 as a mask as shown in FIGS. 8A and 8B. The second groove 52 is formed in a frame shape surrounding the columnar portion (Mesa portion) 61 having the cylindrical shape, namely, formed in a ring shape, and part of the second groove 52 overlaps the first groove 51. That is, the second groove 52 includes a portion 52A overlapping the first groove 51 and a portion 52B not overlapping the first groove 51 in the planar shape.

The etching depth of the portion 52B of the second groove 52 not overlapping, the first groove 51 is a depth in which the groove pierces through the upper second DBR mirror layer 32 including the upper oxidizable layer 32A as well as in which the groove does not reach the lower second DBR mirror layer 22 including the lower oxidizable layer 22A in the stacked direction. At this time, the etching depth of the portion 52A of the second groove overlapping the first groove 51 is deeper than the portion 52B not overlapping the first groove 51 by the depth of the first groove 51. Therefore, the etching depth of the portion 52A of the second groove 52 overlapping the first groove 51 can be the depth in which the groove pierces through at least one layer of the lower oxidizable layers 22A in the stacked direction by controlling the depth of the first groove 51 properly.

Specifically, the first groove 51 has preferably the depth deeper than the thickness of a pair of the low-refractive index layer 22A and the high-refractive index layer 22B of the lower second DBR mirror layer 22. According to the structure, the etching depth of the portion 52A of the second groove 52 overlapping the first groove 51 can be the depth in which the groove pierces through at least one layer of the lower oxidizable layers 22A in the stacked direction. The thickness of a pair of the low-refractive index layer 22A and the high-refractive index layer 22B of the lower second DBR mirror layer 22 differs according to the wavelength, and for example, 120 nm when the wavelength is 780 nm, and 100 nm when the wavelength is 660 nm.

It is desirable to form the contact layer 17 to have the thickness larger than the depth of the first groove 51 in order to form the first groove 51 to have the above-described depth. Specifically, the thickness of the contact layer 17 is preferably 0.1 µm or more to 1 µm or less.

Incidentally, the loading effect has been hitherto known, in which grooves having different etching depths are formed by providing openings having uneven widths on the photoresist film to thereby slow down the etching speed in a portion having a narrow width as compared with in a portion having a wide width. However, the loading effect is unstable and the etching depth is easily changed, therefore, variation is liable to occur because the difference in the depth of grooves becomes too large or too small. Accordingly, when using only the loading effect, it is extremely difficult to perform accurate control such that the thickness of the portion 52A of the second groove 52 overlapping the first groove 51 is formed so as to be deeper than the portion 52B not overlapping the first groove 51 by the thickness of a pair of the low-refractive index layer 22A and the high-refractive index layer 22B of the lower second DBR mirror layer 22 as in the embodiment.

After forming the second groove 52, the photoresist film 42 is peeled off as shown in FIGS. 9A and 9B.

After peeling off the photoresist film 42, oxidation treatment is performed in water vapor atmosphere at high temperature as shown in FIGS. 10A and 10B. At this time, in the portion 52B of the second groove 52 not overlapping the first groove 51, only the upper oxidizable layer 32A is exposed at a side surface of the second groove 52B. Therefore, aluminum (Al) in the upper oxidizable layer 32A is selectively oxidized to be an upper oxide layer 34A made of an insulating layer (aluminum oxide), however, the lower oxidizable layer 22A is not oxidized.

On the other hand, in the portion 52A of the second groove 52 overlapping the first groove 51, both the upper oxidizable layer 32A and the lower oxidizable layer 22A are exposed at the side surface of the second groove 52. Therefore, the upper oxidizable layer 32A is oxidized to be the upper oxide layer 34A in the same manner as the above. At the same time, aluminum (Al) of the lower oxidizable layer 22A is selectively oxidized to be a lower oxide layer 24A made of the insulating layer (aluminum oxide).

At this time, oxidation of the upper first DBR mirror layer 31, the upper third DBR mirror layer 33, the lower first DBR mirror layer 21 and the lower third DBR mirror layer 23 is seldom performed or slightly performed with respect to the oxidation of the upper oxidizable layer 32A and the lower oxidizable layer 22A according to the difference of the composition ratio of aluminum (Al) in respective layers of the upper DBR mirror layer 16 and the lower DBR mirror layer 12.

Accordingly, in the lower second DBR mirror layer 22, the lower oxide layers 24A are formed on a straight line passing through the center C of the columnar portion 61 so as to be symmetrical with respect to the center C, that is, at opposite angles in one direction. On the other hand, in the upper second DBR mirror layer 32, the upper oxide layer 34A having an opening is formed so as to correspond to a light emitting region 14A of the light emitting layer 14, and the opening will be a current injection region 34B.

After forming the first grooves 51 in the contact layer 17 as described above, the second groove 52 overlapping the first groove 51 at part thereof in the planar shape is formed, thereby making the portion 52A of the second groove 52 overlapping the first groove 51 deeper than the portion 52B not overlapping the first groove 51 by the etching process at one time. Additionally, the oxidation treatment is performed by using the first groove 51 and the second groove 52, thereby easily forming the lower oxide layers 24A distributing unevenly in the rotating direction around the light emitting region 14A as the center.

After forming the upper oxide layer 34A and the lower oxide layer 24A, a metal material is stacked over the whole surface by, for example, a vacuum deposition method. After that, a ring-shaped upper electrode 71 is formed on an upper surface (a region other than the light emitting region of the contact layer 17 positioned inside the second groove 52) of the columnar portion 61 by using, for example, a selective etching as shown in FIGS. 11A and 11B. An upper electrode pad (not shown) is formed at a position apart from the columnar portion 61. The upper electrode 71 and the upper electrode pad (not shown) are formed by stacking, for example, a titanium (Ti) layer, a platinum (Pt) layer and a gold (Au) layer in this order to be electrically connected to the contact layer 17.

Subsequently, only the light emitting region of the contact layer 17 is opened and a light emitting window 17A is formed as shown in FIGS. 12A and 12B.

After forming the light emitting window 17A of the contact layer 17, an insulating film (passivation film) 18 made of an insulating material of oxide or nitride such as $SiO_2$ and $SiN_x$ is formed on the whole surface (the upper surface of the columnar portion 61, inner surfaces of the first grooves 51 and the second groove 52 and the surface other than the columnar portion 61 in the contact layer 17) as shown in FIGS. 13A and 13B by using, for example, a CVD (Chemical Vapor Deposition) method.

Subsequently, part of the insulating film 18 on the upper electrode 71 is etched to form an upper electrode exposed portion 71A as shown in FIG. 14A. After that, a connection portion 72 for connecting the upper electrode 71 and the upper electrode pad (not shown) is formed on the upper electrode exposed portion 71A. The connection portion 72 forms a plating layer on a stacked structure formed by stacking, for example, the Ti layer, the Pt layer and the Au layer in this order.

After forming the connection portion 72, the reverse side of the substrate 11 is polished and etched until the whole thickness becomes, for example, 200 μm or less. Subsequently, a lower electrode 73 is formed on the reverse side of the substrate 11 as shown in FIGS. 16A and 16B. The lower electrode 73 is formed by, for example, sequentially stacking an alloy layer of gold (Au) and germanium (Ge), a nickel (Ni) layer and a gold (Au) layer in this order from the substrate 10 side to be electrically connected to the substrate 11. After that, the substrate 11 is heated to 400° C. or more to perform alloying of the electrode. In the manner as described above, a surface-emitting semiconductor laser 1 according to the embodiment is completed.

(Structure)

The surface-emitting semiconductor layer 1 includes a light emitting portion 60 at one surface of the substrate 11 as shown in FIGS. 16A and 16B. The light emitting portion 60 is formed by the stacked structure 10 including the lower DBR mirror layer 12, the lower spacer layer 13, the active layer 14, the upper spacer layer 15, the upper DBR mirror layer 16 and the contact layer 17 in this order from the substrate 11 side. In the light emitting portion 60, part of the lower DBR mirror layer 12, the lower spacer layer 13, the active layer 14, the upper spacer layer 15, the upper DBR mirror layer 16 and the contact layer 17 compose the columnar portion (Mesa portion) 61 having the cylindrical shape, for example, with approximately 10 μm to 30 μm in width.

The upper oxide layer 34A is provided as the current confinement layer inside the upper second DBR mirror layer 32 in the side surface of the columnar portion 61. The upper oxide layer 34A is obtained by oxidizing high-concentration Al included in the upper oxidizable layer 32A from the side surface of the columnar portion 61 as described above, which is made of $Al2O3$ (aluminum oxide) having a ring-shape in plan view. That is, the central opening of the upper oxide layer 34A is the current injection region 34B through which electric current passes, and the region of the active layer 14 facing the current injection region 34B is the light emitting region 14A.

The surface-emitting semiconductor layer 1 also has a stepped concave portion 50 at part of the periphery of the columnar portion 61. The stepped concave portion 50 includes the first groove 51 provided in the contact layer 17 and the second groove 52 provided at the bottom of the first groove 51, which corresponds to the portion 52B of the second groove 52 overlapping the first groove 51 in the above manufacturing method. In the lower second DBR mirror layer 22 at the side surface of the stepped concave portion 50, at least one layer of the lower oxide layer 24A is provided. According to the structure, the surface-emitting semiconductor laser 1 can stabilize the polarized direction of laser light into one direction.

The lower oxide layer 24A is obtained by oxidizing high-concentration Al included in the lower oxidizable layer 22A from the side surface of the stepped concave portion 50 as described above, which is made of $Al2O3$ (aluminum oxide) and is provided only inside the stepped concave portion 50. That is, the lower second DBR mirror layer 22 including the lower oxidizable layer 22A is not exposed at the side surface of the portion 52B of the second groove 52 not overlapping the first groove 51, therefore, the lower oxide layer 24A is not distributed in the portion 52B. Therefore, the lower oxide layer 24A is distributed unevenly in the rotating direction around the light emitting region 14A as a center, causing uneven stress corresponding to the distribution in the active layer 14. Specifically, the lower oxide layers 24A are arranged on the straight line passing through the center C of the columnar portion 61 so as to be symmetrical with respect to the center C, that is, at opposite angles in one direction.

(Operation)

In the surface-emitting semiconductor layer 1, when given voltage is applied between the lower electrode 73 and the upper electrode 71, electric current is injected to the active layer 14 through the current injection region 34B at the center of the upper oxide layer 34A, which causes light emission by recombination of electrons and holes. The light reflected on the lower DBR mirror layer 12 and the upper DBR mirror layer 16 generates laser oscillation with a given wavelength and is emitted to the outside as a laser beam.

In this case, there is provided the stepped concave portion 50 including the first groove 51 of the contact layer 17 and the second groove 52 at the bottom of the first groove 51 at part of the periphery of the columnar portion 61, and at least one layer of the lower oxide layer 24A is provided in the lower second DBR mirror layer 22 at the side surface of the stepped concave portion 50, therefore, tensile stress due to the lower oxide layer 24A is generated unevenly in the active layer 14. The lower oxide layers 24A are arranged on the straight line passing through the center C of the columnar portion 61 so as to be symmetrical with respect to the center C, that is, at opposite angles in one direction, which has anisotropic distribution. Accordingly, anisotropic tensile stress corresponding to the distribution is generated in the active layer 14. As described above, there is no fear that the lower oxidizable layer 22A is oxidized in the portion 52B of the second groove 52 not overlapping the first groove 51 as described above, and there is no fear that stress in the direction in which the portions 52B of the second groove 52 not overlapping the first grooves 51 face each other is generated in the active layer 14. Accordingly, a polarization component in the direction orthogonal to the direction of the tensile stress is increased as well as a polarization component in the direction parallel to the direction of the tensile stress is suppressed. Therefore, strong uniaxial strain is added to the active layer 14 and the polarization direction is aligned in one direction.

In the manufacturing method of the surface-emitting semiconductor laser according to the embodiment described above, the second groove 52 including the portion 52A overlapping the first groove 51 and the portion 52B not overlapping the first groove 51 is formed in the planar shape after forming the first groove 51 in the contact layer 17, therefore, the portion 52A of the second groove 52 overlapping the first groove 51 can be formed to be deeper than the portion 52B not overlapping the first groove 51. Accordingly, grooves having different depths can be formed accurately as well as the polarization direction of laser light can be stabilized into one direction with a simple method.

Additionally, the depths of the first groove 51 and the second groove 52 are controlled, thereby preventing the portion 52B of the second groove 52 not overlapping the first groove 51 from reaching the lower oxidizable layer 22A as well as allowing the portion 52A of the second groove 52 overlapping the first groove 51 to reach the lower oxidizable layer 22A to a desirable depth with high accuracy. Therefore, the stress added to the active layer 14 can be accurately controlled.

Furthermore, though the first groove 51 and the second groove 52 are formed in different processes, the formation of the columnar portion 61 to be the resonator and the accession to the lower oxidizable layer 22A depend on only the positional accuracy of the second groove 52 and the positional displacement of the first grooves 51 is not reflected. Accordingly, shapes of the upper oxide layer 34A as the current confinement layer and the lower oxide layer 24A become stable, as a result, the uniform shape and characteristics can be obtained.

It is not necessary to use special substrates such as the (n11) surface substrate ("n" is an integer) as the substrate 11, and the common (100) surface substrate or approximately 2 to 20°-off substrates can be further used, therefore, doping conditions and epitaxial growth conditions such as gas flow of the common (100) surface substrate or off-substrates can be used. Accordingly, the substrate can be manufactured easily at low costs.

In the surface-emitting semiconductor laser according to the embodiment, the stepped concave portion 50 including the first groove 51 of the contact layer 17 and the second groove 52 at the bottom of the first groove 51 is provided at part of the periphery of the columnar portion 61, and the lower oxide layer 24A having at least one layer is provided at the lower second DBR mirror layer 22 at the side surface of the stepped concave portion 50, therefore, the polarization direction of laser light can be stabilized into one direction.

Additionally, the lower DBR mirror layer 12 has the structure in which the lower first DBR mirror layer 21 to the lower third DBR mirror layer 23 are stacked in this order from the substrate 11 side, therefore, the number of layers (thickness) of the lower oxide layer 24A included n the lower second DBR mirror layer 22 can be increased as the second groove 52 becomes deeper. Accordingly, the anisotropic stress can be increased so as to correspond to the number of layers (thickness) of the lower oxide layer 24A, and polarization controllability can be increased.

Additionally, as the lower DBR mirror layer 12 has the above structure, there is no fear of affecting the polarization controllability as long as the bottom of the portion 52B of the second groove 52 not overlapping the first groove 51 is formed at any position inside the lower third DBR mirror layer 23. That is, it is not necessary to accurately control the depth of the portion 52B of the second groove 52 not overlapping the first grooves 51 in the manufacturing process, and even when the depth of the portion 52B of the second groove 52 not overlapping the first groove 51 varies, there is no fear that variations occur in the controllability of polarization light in each surface-emitting semiconductor laser 1.

Furthermore, the more the number of layers (thickness) of the lower oxide layer 24A is increased, the more the anisotropic stress is increased, therefore, it is not necessary to provide the lower oxide layer 24A in the region corresponding to the light emitting region 14A for adding large stress on the active layer 14. Accordingly, there is little fear that light output is reduced by the lower oxide layer 24A, and the laser light with high output can be emitted.

Moreover, the second groove 52 formed around the columnar portion 61 has the depth in which the groove pierces through at least the active layer 14, therefore, a current path connecting from the upper electrode 71, the upper electrode pad and the connection portion 72 to the active layer 14 exists only inside the columnar portion 61. Therefore, there is no fear that the current injection efficiency is reduced due to the formation of the second groove 52 around the columnar portion 61.

Second Embodiment

FIG. 17 to FIGS. 22A and 22B show a manufacturing method of a surface-emitting semiconductor laser according to a second embodiment of the invention in the order of processes. The manufacturing method is the same as the manufacturing method according to the first embodiment except that the second groove 52 is not formed in a ring-shape and is formed over the whole region other than the columnar portion 61. Therefore, the same processes will be explained with reference to FIG. 1 to FIGS. 16A and 16B.

First, the lower DBR mirror layer 12, the lower spacer layer (cladding layer) 13, the active layer 14, the upper spacer layer (cladding layer) 15, the upper DBR mirror layer 16 and the contact layer 17 are sequentially stacked on the substrate 11 to form the stacked structure 10 by processes shown in FIG. 1 in the same manner as the first embodiment. At that time, the lower DBR mirror layer 12 is formed, for example, by stacking the lower first DBR mirror layer 21, the lower second DBR mirror layer 22 and the lower third DBR mirror layer 23 in the order from the substrate 11 side. The upper DBR mirror layer 16 is formed, for example, by stacking the upper first DBR mirror layer 31, the upper second DBR mirror layer 32 and the upper third DBR mirror layer 33 in the order from the substrate 11 side. The composition ratio of aluminum (Al) in respective layers of the lower DBR mirror layer 12 and the upper DBR mirror layer 16 satisfies the following in the same manner as the first embodiment.

$$1 \geq \alpha, \beta \geq x, y > 0.8 > z \geq 0$$

That is, the low-refractive index layer 22A of the lower second DBR mirror layer 22 is the lower oxidizable layer 22A having at least one layer made of Al$\beta$Ga1-$\beta$As, and the low-refractive index layer 32A of the upper second DBR mirror layer 32 is the upper oxidizable layer 32A made of Al$\alpha$Ga1-$\alpha$As.

Next, the photoresist film 41 is formed on the contact layer 17 and openings 41A for forming later-described first grooves 51 are formed on the photoresist film 41 by processes as shown in FIG. 2 and FIGS. 3A and 3B in the same manner as the first embodiment.

Subsequently, the contact layer 17 is etched by the wet etching method or dry etching method using the photoresist film 41 as a mask to form the first grooves 51 by the process as shown in FIGS. 4A and 4B in the same manner as the first embodiment.

After that, the photoresist film 41 is peeled off by the process shown in FIGS. 5A and 5B in the same manner as the first embodiment.

Figure 17:
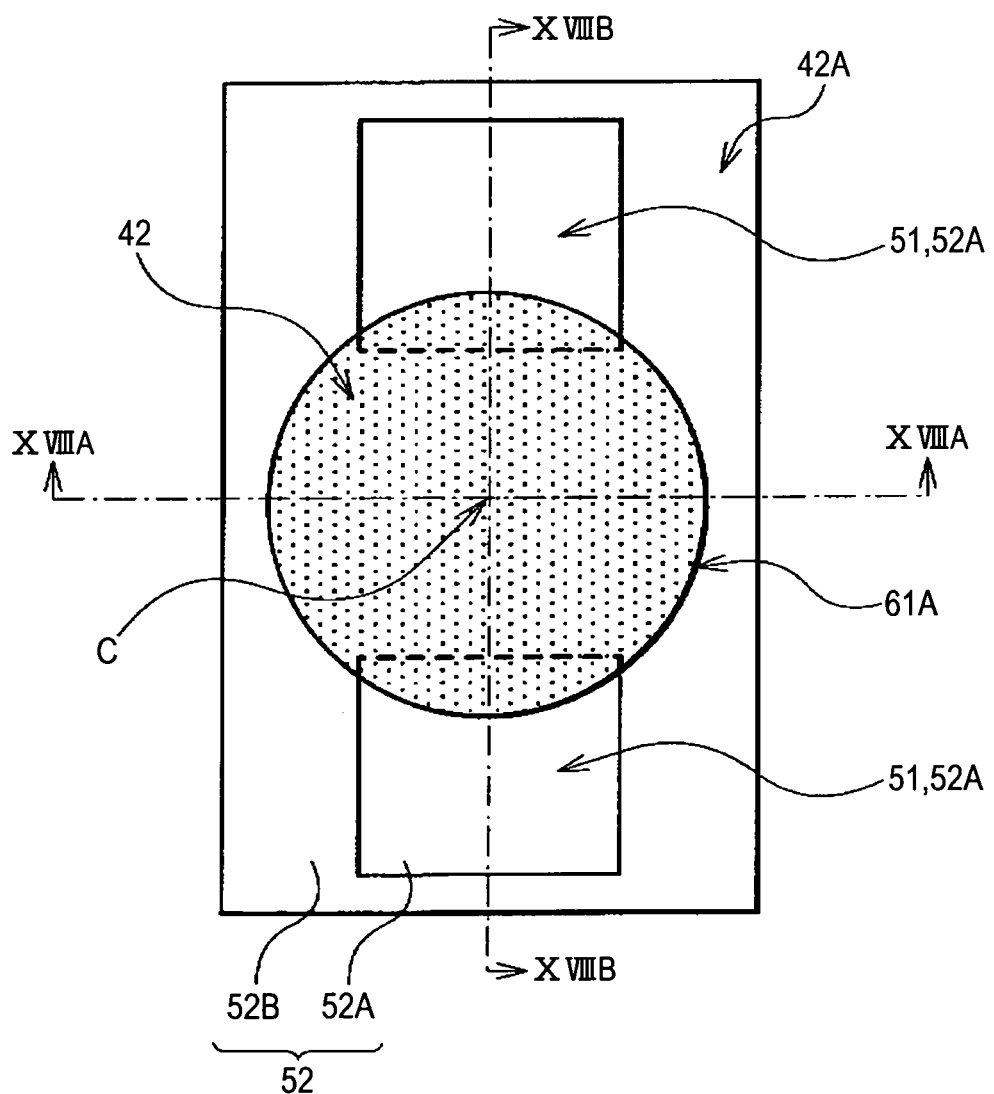
FIG. 17 is an upper surface view showing a manufacturing method of a surface-emitting semiconductor laser according to a second embodiment of the invention.

After peeling off the photoresist film 41, the photoresist film 42 is formed on the contact layer 17 in which the first grooves 51 have been formed and the opening 42A for forming the second groove 52 is provided in the photoresist 42 as shown in FIG. 17 and FIGS. 18A and 18B.

After forming the opening 42A, the second groove 52 is formed by the wet etching method or the dry etching method, preferably by the dry etching method using the photoresist 42 as a mask as shown in FIGS. 19A and 19B. The second groove 52 is formed over the whole area other than the columnar portion (Mesa portion) 61 having the cylindrical shape, and part of the second groove 52 overlaps the first groove 51. That is, the second groove 52 includes the portion 52A overlapping the first groove 51 and a portion 52B not overlapping the first groove 51 in the planar shape.

The etching depth of the portion 52B of the second groove 52 not overlapping the first groove 51 is a depth in which the groove pierces through the upper second DBR mirror layer 32 including the upper oxidizable layer 32A as well as in which the groove does not reach the lower second DBR mirror layer 22 including the lower oxidizable layer 22A in the stacked direction. At this time, the etching depth of the portion 52A of the second groove 52 overlapping the first groove 51 is deeper than the portion 52B not overlapping the first groove 51 by the depth of the first groove 51. Therefore, the etching depth of the portion 52A of the second groove 52 overlapping the first groove 51 can be the depth in which the groove pierces through at least one layer of the lower oxidizable layers 22A in the stacked direction by controlling the depth of the first groove 51 properly.

Specifically, the first groove 51 has preferably the depth deeper than the thickness of a pair of the low-refractive index layer 22A and the high-refractive index layer 22B of the lower second DBR mirror layer 22 in the same manner as the first embodiment. To realize the above, it is desirable to form the contact layer 17 to have the thickness larger than the depth of the first groove 51 in the same manner as the first embodiment. Specifically, the thickness of the contact layer 17 is preferably 0.1 μm or more to 1 μm or less in the same manner as the first embodiment.

After forming the second groove 52, the photoresist film 42 is peeled off as shown in FIGS. 20A and 20B.

After peeling off the photoresist film 42, oxidation treatment is performed in water vapor atmosphere at a high temperature as shown in FIGS. 21A and 21B. At this time, in the portion 52B of the second groove 52 not overlapping the first groove 51, only the upper oxidizable layer 32A is exposed at a side surface of the second groove 52. Therefore, aluminum (Al) in the upper oxidizable layer 32A is selectively oxidized to be the upper oxide layer 34A made of the insulating layer (aluminum oxide), however, the lower oxidizable layer 22A is not oxidized.

On the other hand, in the portion 52A of the second groove 52 overlapping the first groove 51, both the upper oxidizable layer 32A and the lower oxidizable layer 22A are exposed at the side surface of the second groove 52. Therefore, the upper oxidizable layer 32A is oxidized to be the upper oxide layer 34A in the same manner as the above. At the same time, aluminum (Al) of the lower oxidizable layer 22A is selectively oxidized to be the lower oxide layer 24A made of the insulating layer (aluminum oxide).

At this time, oxidation of the upper first DBR mirror layer 31, the upper third DBR mirror layer 33, the lower first DBR mirror layer 21 and the lower third DBR mirror layer 23 is seldom performed or slightly performed with respect to the oxidation of the upper oxidizable layer 32A and the lower oxidizable layer 22A according to the difference of the composition ratio of aluminum (Al) in respective layers of the upper DBR mirror layer 16 and the lower DBR mirror layer 12.

Accordingly, in the lower second DBR mirror layer 22, the lower oxide layers 24A are formed on a straight line passing through the center C of the columnar portion 61 so as to be symmetrical with respect to the center C, that is, at opposite angles in one direction. On the other hand, in the upper second DBR mirror layer 32, the upper oxide layer 34A having an opening is formed so as to correspond to the light emitting region 14A of the light emitting layer 14, and the opening will be the current injection region 34B.

After forming the first grooves 51 in the contact layer 17 as described above, the second groove 52 overlapping the first grooves 51 at parts thereof in the planar shape is formed, thereby making the portion 52A of the second groove 52 overlapping the first grooves 51 deeper than the portion 52B not overlapping the first grooves 51 by the etching process at one time. Additionally, the oxidation treatment is performed by using the first groove 51 and the second groove 52, thereby easily forming the lower oxide layer 24A distributing unevenly in the rotating direction around the light emitting region 14A as the center.

After forming the upper oxide layer 34A and the lower oxide layer 24A, the ring-shaped upper electrode 71 is formed on the upper surface of the columnar portion 61 as shown in FIGS. 22A and 22B in the same manner as the first embodiment. The upper electrode pad (not shown) is formed at a position apart from the columnar portion 61.

Subsequently, only the light emitting region of the contact layer 17 is opened and the light emitting window 17A is formed also as shown in FIGS. 22A and 22B in the same manner as the first embodiment.

After forming the light emitting window 17A of the contact layer 17, the insulating film (passivation film) 18 made of an insulating material of oxide or nitride such as SiO2 and SiNx is formed on the whole surface (the upper surface of the columnar portion 61, inner surfaces of the first grooves 51 and the second groove 52 and the surface other than the columnar portion 61 in the contact layer 17) as shown in FIGS. 22A and 22B by using, for example, the CVD method in the same manner as the first embodiment.

Subsequently, part of the insulating film 18 on the upper electrode 71 is etched to form the upper electrode exposed portion 71A also as shown in FIGS. 22A and 22B in the same manner as the first embodiment, then, the connection portion 72 is formed on the upper electrode exposed portion 71A.

After forming the connection portion 72, the reverse side of the substrate 11 is polished and etched to thereby form the lower electrode 73 on the reverse side of the substrate 11 also as shown in FIGS. 22A and 22B in the same manner as the first embodiment. After that, the substrate 11 is heated to 400° C. or more to perform alloying of the electrode. In the manner as described above, the surface-emitting semiconductor laser 1 according to the embodiment is completed.

(Structure)

The surface-emitting semiconductor laser 1 manufactured by the manufacturing method of the embodiment has the same structure as the first embodiment 1 except that the second groove 52 is provided on the whole surface other than the columnar portion 61.

The surface-emitting semiconductor layer 1 has the stepped concave portion 50 at part of the periphery of the columnar portion 61. The stepped concave portion 50 includes the first groove 51 provided in the contact layer 17 and the second groove 52 provided at the bottom of the first groove 51, which corresponds to the portion 52B of the second groove 52 overlapping the first groove 51 in the above manufacturing method. In the lower second DBR mirror layer 22 at the side surface of the stepped concave portion 50, at least one layer of the lower oxide layer 24A is provided. According to the structure, the surface-emitting semiconductor laser 1 can stabilize the polarized direction of laser light into one direction.

The lower oxide layer 24A is provided only inside the stepped concave portion 50 and is not distributed at the side surface of the portion 52B of the second groove 52 not overlapping the first groove 51 in the same manner as the first embodiment. Therefore, the lower oxide layer 24A is distributed unevenly in the rotating direction around the light emitting region 14A as the center, causing uneven stress corresponding to the distribution in the active layer 14. Specifically, the lower oxide layers 24A are arranged on the straight line passing through the center C of the columnar portion 61 so as to be symmetrical with respect to the center C, that is, at opposite angles in one direction.

Operations and effects of the surface-emitting semiconductor laser 1 according to the embodiment is the same as the first embodiment.

Particularly in the present embodiment, when plural columnar portions 61 are arranged in an array state, the warpage of the whole wafer generated by the epitaxial crystal growth can be alleviated in the wafer before dicing the surface-emitting semiconductor laser 1 into the chip state. Accordingly, the warpage amount remaining in individual chips after dicing can be reduced as well as variations of the warpage amount in individual chips can be also reduced.

Third Embodiment

FIG. 23 to FIGS. 30A and 30B show a manufacturing method of a surface-emitting semiconductor laser according to a third embodiment of the invention in the order of processes. In the manufacturing method, a third groove 53 not overlapping the first groove 51 in the planar shape is provided in a ring shape surrounding the columnar portion 61 at the same time as the second groove 52 is provided, in which the first groove 51 and the second groove 52 are arranged at regions outside the third groove 53. The manufacturing method according to the embodiment is the same as the manufacturing method of the first embodiment except the above. Therefore, the same processes will be explained with reference to FIG. 1 to FIGS. 16A and 16B.

First, the lower DBR mirror layer 12, the lower spacer layer (cladding layer) 13, the active layer 14, the upper spacer layer (cladding layer) 15, the upper DBR mirror layer 16 and the contact layer 17 are sequentially stacked on the substrate 11 to form the stacked structure 10 by the process shown in FIG. 1 in the same manner as the first embodiment. At that time, the lower DBR mirror layer 12 is formed, for example, by stacking the lower first DBR mirror layer 21, the lower second DBR mirror layer 22 and the lower third DBR mirror layer 23 in the order from the substrate 11 side. The upper DBR mirror layer 16 is formed, for example, by stacking the upper first DBR mirror layer 31, the upper second DBR mirror layer 32 and the upper third DBR mirror layer 33 in the order from the substrate 11 side. The composition ratio of aluminum (Al) in respective layers of the lower DBR mirror layer 12 and the upper DBR mirror layer 16 satisfies the following in the same manner as the first embodiment.

$$1 \geq \alpha, \beta \geq x, y > 0.8 > z \geq 0$$

That is, the low-refractive index layer 22A of the lower second DBR mirror layer 22 is the lower oxidizable layer 22A having at least one layer made of AlβGa1-βAs, and the low-refractive index layer 32A of the upper second DBR mirror layer 32 is the upper oxidizable layer 32A made of AlαGa1-αAs.

Figure 23:
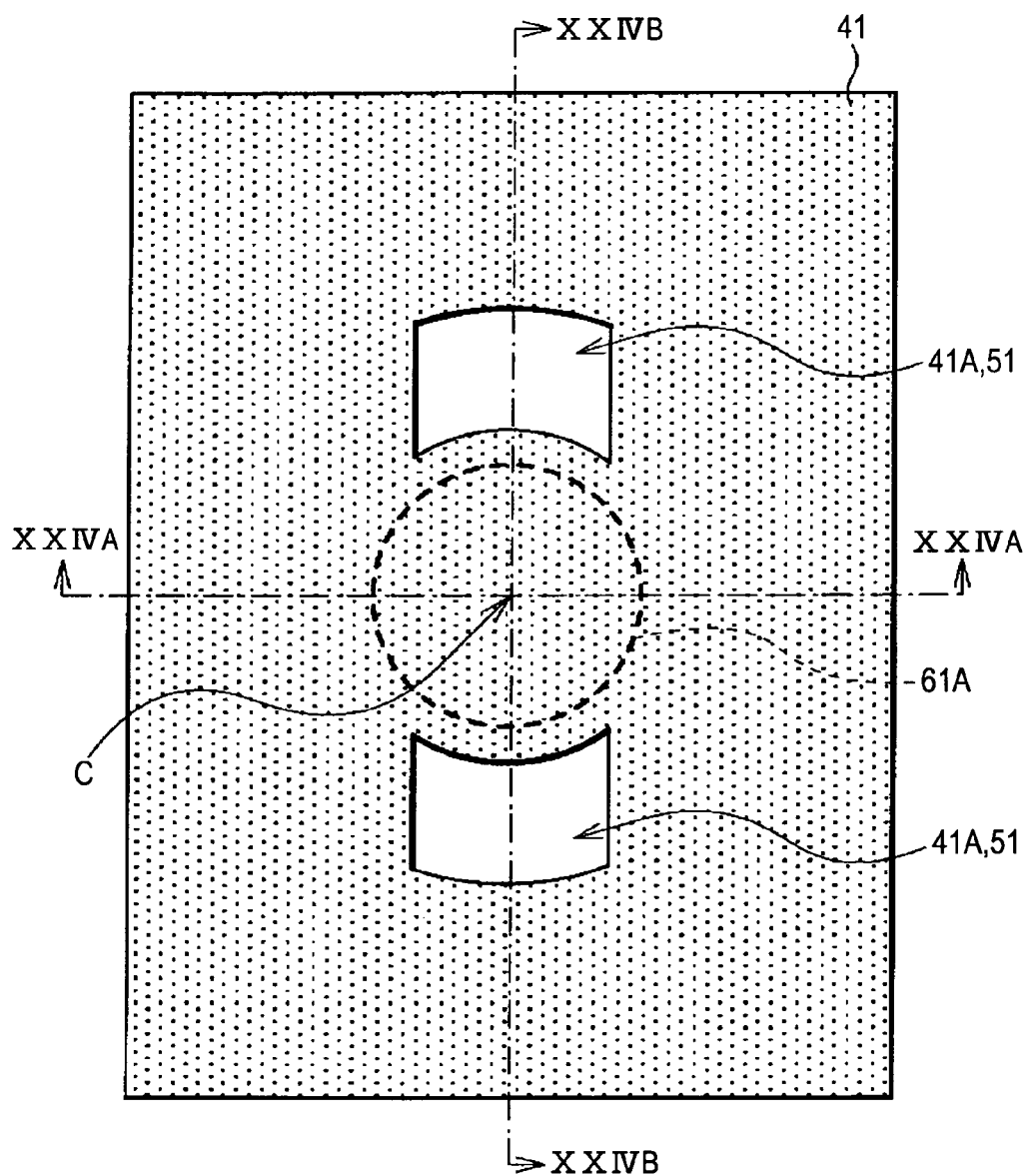
FIG. 23 is an upper surface view showing a manufacturing method of a surface-emitting semiconductor laser according to a third embodiment of the invention.

Next, the photoresist film 41 is formed on the contact layer 17 and openings 41A for forming later-described first grooves 51 are formed on the photoresist film 41 as shown in FIG. 23 and FIGS. 24A and 24B in the same manner as the first embodiment.

Subsequently, the contact layer 17 is etched by the wet etching method or dry etching method using the photoresist film 41 as a mask to form the first grooves 51 by the process as shown in FIGS. 4A and 4B in the same manner as the first embodiment. At this time, the first grooves 51 are provided at regions outside the columnar portion formation estimated region 61A.

After that, the photoresist film 41 is peeled off by the process shown in FIGS. 5A and 5B in the same manner as the first embodiment.

Figure 25:
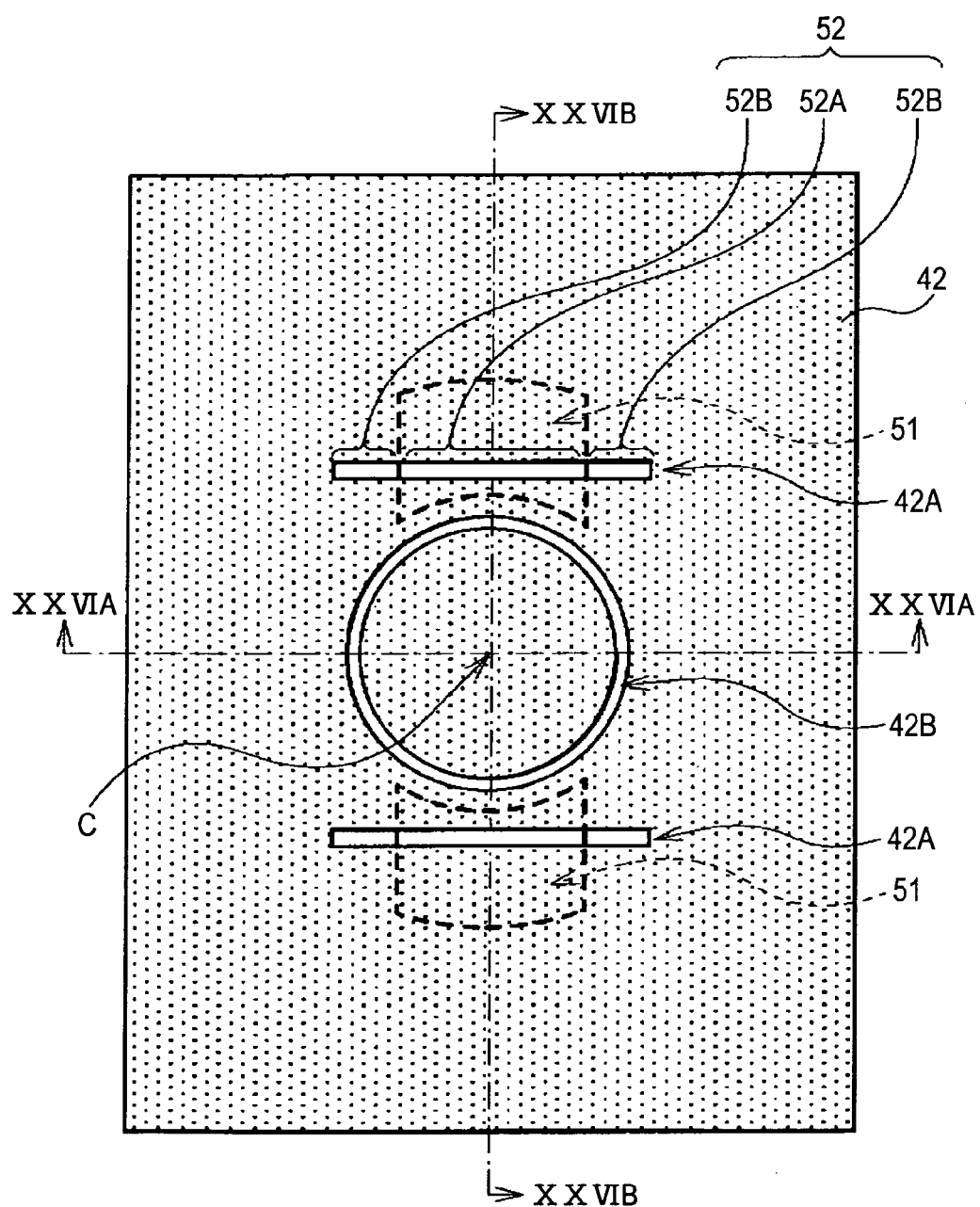
FIG. 25 is an upper surface view showing a process continued from FIG. 23.

After peeling off the photoresist film 41, the photoresist film 42 is formed on the contact layer 17 in which the first grooves 51 have been formed, then, the openings 42A for forming the second grooves 52 as well as an opening 42B for forming the third groove 53 are provided in the photoresist film 42 as shown in FIG. 25 and FIGS. 26A and 26B.

After forming the openings 42A, 42B, the second grooves 52 and the third groove 53 are formed by the wet etching method or the dry etching method, preferably by the dry etching method using the photoresist film 42 as a mask as shown in FIGS. 27A and 27B.

The second groove 52 is formed in a straight-line shape overlapping the first groove 51 at part thereof in the planar shape. That is, the second groove 52 includes the portion 52A overlapping the first groove 51 and the portion 52B not overlapping the first groove 51 in the planar shape. It goes without saying that the second groove 52 may be formed not only in the straight-line shape but also in a curved-shape such as an arc shape.

The third groove 53 does not overlap the first grooves 51 in the planar shape, which is formed in a frame shape surrounding the columnar portion 61, namely, in a ring shape. The first grooves 51 and the second grooves 52 are provided at regions outside the third groove 53.

The etching depth of the third groove 53 is a depth in which the groove pierces through the upper second DBR mirror layer 32 including the upper oxidizable layer 32A as well as in which the groove does not reach the lower second DBR mirror layer 22 including the lower oxidizable layer 22A in the stacked direction. At this time, the etching depth of the portion 52A of the second groove 52 overlapping the first groove 51 is deeper than the third groove 53 by the depth of the first groove 51. Therefore, the etching depth of the third groove 53 can be the depth in which the groove pierces through at least one layer of the lower oxidizable layers 22A in the stacked direction by controlling the etching depth of the first groove 51 properly. The etching depth of the portion 52B of the second groove 52 not overlapping the first groove 51 will be the same as the third groove 53.

Specifically, the first groove 51 has preferably the depth deeper than the thickness of a pair of the low-refractive index layer 22A and the high-refractive index layer 22B of the lower second DBR mirror layer 22 in the same manner as the first embodiment. To realize the above, it is desirable to form the contact layer 17 to have the thickness larger than the depth of the first groove 51 in the same manner as the first embodiment. Specifically, the thickness of the contact layer 17 is preferably 0.1 μm or more to 1 μm or less in the same manner as the first embodiment.

After forming the second grooves 52 and the third groove 53, the photoresist film 42 is peeled off as shown in FIGS. 28A and 28B.

After peeling off the photoresist film 42, oxidation treatment is performed in water vapor atmosphere at high temperature as shown in FIGS. 29A and 29B. At this time, in the third groove 53, only the upper oxidizable layer 32A is exposed at a side surface of the third groove 53. Therefore, aluminum (Al) in the upper oxidizable layer 32A is selectively oxidized to be the upper oxide layer 34A made of the insulating layer (aluminum oxide), however, the lower oxidizable layer 22A is not oxidized. Note that the upper oxidizable layer 32A is oxidized also in the portion 52B of the second groove 52 not overlapping the first groove 51 in the same manner as in the third groove 53, not shown in the drawings.

On the other hand, in the portion 52A of the second groove 52 overlapping the first groove 51, both the upper oxidizable layer 32A and the lower oxidizable layer 22A are exposed at the side surface of the second groove 52. Therefore, the upper oxidizable layer 32A is oxidized to be the upper oxide layer 34A in the same manner as the above. At the same time, aluminum (Al) of the lower oxidizable layer 22A is selectively oxidized to be the lower oxide layer 24A made of the insulating layer (aluminum oxide).

At this time, oxidation of the upper first DBR mirror layer 31, the upper third DBR mirror layer 33, the lower first DBR mirror layer 21 and the lower third DBR mirror layer 23 is seldom performed or slightly performed with respect to the oxidation of the upper oxidizable layer 32A and the lower oxidizable layer 22A according to the difference of the composition ratio of aluminum (Al) in respective layers of the upper DBR mirror layer 16 and the lower DBR mirror layer 12.

Accordingly, in the lower second DBR mirror layer 22, the lower oxide layers 24A are formed on the straight line passing through the center C of the columnar portion 61 so as to be symmetrical with respect to the center C, that is, at opposite angles in one direction. On the other hand, in the upper second DBR mirror layer 32, the upper oxide layer 34A having an opening is formed so as to correspond to the light emitting region 14A of the light emitting layer 14, and the opening will be the current injection region 34B.

As described above, the third groove 53 not overlapping the first groove 51 in the planar shape is provided in a frame shape surrounding the columnar portion 61 at the same time as providing the second groove 52, and the first groove 51 and the second groove 52 are formed at regions outside the third groove 53, thereby making the portion 52A of the second groove 52 overlapping the first groove 51 deeper than the third groove 53 by the etching process at one time. Additionally, the oxidation treatment is performed by using the first groove 51, the second groove 52 and the third groove 53, thereby easily forming the lower oxide layer 24A distributing unevenly in the rotating direction around the light emitting region 14A as the center.

The size of the current injection region 34B at the center of the upper oxide layer 34 and the size of an unoxidized region 24B of the lower oxide layer 24 can be changed according to the arrangement of the second grooves 52 and the third groove 53, which can control the oxidation shape and the oxidation amount of the lower oxide layer 24A.

After forming the upper oxide layer 34A and the lower oxide layer 24A, the ring-shaped upper electrode 71 is formed on the upper surface of the columnar portion 61 as shown in FIGS. 30A and 30B in the same manner as the first embodiment. The upper electrode pad (not shown) is formed at a position apart from the columnar portion 61.

Subsequently, only the light emitting region of the contact layer 17 is opened and the light emitting window 17A is formed also as shown in FIGS. 30A and 30B in the same manner as the first embodiment.

After forming the light emitting window 17A of the contact layer 17, the insulating film (passivation film) 18 made of an insulating material of oxide or nitride such as SiO2 and SiNx is formed on the whole surface (the upper surface of the columnar portion 61, inner surfaces of the first grooves 51 and the second grooves 52 and the surface other than the columnar portion 61 in the contact layer 17) as shown in FIGS. 30A and 30B by using, for example, the CVD method in the same manner as the first embodiment.

Subsequently, part of the insulating film 18 on the upper electrode 71 is etched to form the upper electrode exposed portion 71A also as shown in FIGS. 30A and 30B in the same manner as the first embodiment, then, the connection portion 72 is formed on the upper electrode exposed portion 71A.

After forming the connection portion 72, the reverse side of the substrate 11 is polished and etched to thereby form the lower electrode 73 on the reverse side of the substrate 11 also as shown in FIGS. 30A and 30B in the same manner as the first embodiment. After that, the substrate 11 is heated to 400° C. or more to perform alloying of the electrode. In the manner as described above, the surface-emitting semiconductor laser 1 according to the embodiment is completed.

(Structure)

The surface-emitting semiconductor laser 1 has the same structure as the first embodiment except that the third groove 53 not overlapping the first groove 51 in the planar shape is provided in a ring shape surrounding the columnar portion 61, and the first groove and the second groove 52 are arranged at regions outside the third groove 53.

The surface-emitting semiconductor layer 1 has the stepped concave portion 50 at a region outside the columnar portion 61. The stepped concave portion 50 includes the first groove 51 provided in the contact layer 17 and the second groove 52 provided at the bottom of the first groove 51, which corresponds to the portion 52B of the second groove 52 overlapping the first groove 51 in the above manufacturing method. In the lower second DBR mirror layer 22 at the side surface of the stepped concave portion 50, at least one layer of the lower oxide layer 24A is provided. According to the structure, the surface-emitting semiconductor laser 1 can stabilize the polarized direction of laser light into one direction.

The lower oxide layer 24A is provided only inside the stepped concave portion 50 and is not provided at the side surface of the portion 52B of the second groove 52 not overlapping the first groove 51 in the same manner as the first embodiment. Therefore, the lower oxide layer 24A is distributed unevenly in the rotating direction around the light emitting region 14A as the center, causing uneven stress corresponding to the distribution in the active layer 14. Specifically, the lower oxide layers 24A are arranged on the straight line passing through the center C of the columnar portion 61 so as to be symmetrical with respect to the center C, that is, at opposite angles in one direction.

(Operation)

In the surface-emitting semiconductor laser 1, when given voltage is applied between the lower electrode 73 and the upper electrode 71, laser oscillation is generated in the same manner as the first embodiment. Here, the stepped concave portion 50 including the first groove 51 of the contact layer 17 and the second groove 52 at the bottom of the first groove 51 is provided at the region outside the columnar portion 61, and the lower oxide layer 24A having at least one layer is provided in the lower second DBR mirror layer 22 at the side surface of the stepped concave portion 50, therefore, tensile stress due to the lower oxide layer 24A is generated unevenly in the active layer 14. The lower oxide layers 24A are arranged on the straight line passing through the center C of the columnar portion 61 so as to be symmetrical with respect to the center C, that is, at opposite angles in one direction, which has anisotropic distribution. Accordingly, anisotropic tensile stress corresponding to the distribution is generated at the active layer 14. As described above, there is no fear that the lower oxidizable layer 22A is oxidized in the portion 52B of the second grooves 52 not overlapping the first grooves 51, and there is no fear that stress in the direction in which the portions 52B of the second grooves 52 not overlapping the first grooves 51 face each other is generated in the active layer 14. Accordingly, the polarization component in the direction orthogonal to the direction of the tensile stress is increased as well as the polarization component in the direction parallel to the direction of the tensile stress is suppressed. Accordingly, strong uniaxial strain is added to the active layer 14 and the polarization direction is aligned into one direction.

As described above, in the manufacturing method of the surface-emitting semiconductor laser according to the embodiment, the third groove 53 not overlapping the first groove 51 in the planar direction is provided in the frame shape surrounding the columnar portion 61 at the same time as providing the second groove 52, and the first groove 51 and the second groove 52 are formed at regions outside the third groove 53, therefore, the portion 52A of the second groove 52 overlapping the first groove 51 can be provided deeper than the portion 52B not overlapping the first groove 51 in the same process. Accordingly, it is possible to form grooves having different depths with high accuracy and to stabilize the polarization direction of laser light into one direction by using the simple method.

Particularly in the present embodiment, the size of the current injection region 34B at the center of the upper oxide layer 34A and the size of an unoxidized region 24B of the lower oxide layer 24A can be changed according to the arrangement of the second groove 52 and the third groove 53, which can control the oxidation shape and the oxidation amount of the lower oxide layer 24A.

Other operations and effects of the embodiment are the same as the first embodiment.

Fourth Embodiment

FIGS. 31A and 31B show a manufacturing method of the surface-emitting semiconductor laser according to a fourth embodiment of the invention. In the manufacturing method, an etching stopper layer 19 is provided between the upper third DBR mirror layer 33 and the contact layer 17 and the first grooves 51 are provided to have a depth in which the groove reaches the etching stopper layer 19. According to the structure, the depth of the first groove 51 can be formed with high accuracy in the embodiment and characteristics can be further stabilized. The etching stopper layer 19 can be made of, for example, GaInP or $Al_{x5}Ga_{1-x5}As$ ($0.3 \leq x5 \leq 0.4$).

Fifth Embodiment

FIG. 32 to FIGS. 35A and 35B show a manufacturing method of a surface-emitting semiconductor laser according to a fifth embodiment of the invention in the order of processes. The manufacturing method is the same as the first embodiment except that an insulating film trimmed region 80A is formed in an insulating film 80 instead of the first groove 51. Therefore, the same processes will be explained with reference to FIG. 1 to FIGS. 16A and 16B.

First, the lower DBR mirror layer 12, the lower spacer layer (cladding layer) 13, the active layer 14, the upper spacer layer (cladding layer) 15, the upper DBR mirror layer 16 and the contact layer 17 are sequentially stacked on the substrate 11 to form the stacked structure 10 by the process shown in FIG. 1 in the same manner as the first embodiment. At that time, the lower DBR mirror layer 12 is formed, for example, by stacking the lower first DBR mirror layer 21, the lower second DBR mirror layer 22 and the lower third DBR mirror layer 23 in the order from the substrate 11 side. The upper DBR mirror layer 16 is formed, for example, by stacking the upper first DBR mirror layer 31, the upper second DBR mirror layer 32 and the upper third DBR mirror layer 33 in the order from the substrate 11 side. The composition ratio of aluminum (Al) in respective layers of the lower DBR mirror layer 12 and the upper DBR mirror layer 16 satisfies the following in the same manner as the first embodiment.

$$1 \geq \alpha, \beta \geq x, y > 0.8 > z \geq 0$$

That is, the low-refractive index layer 22A of the lower second DBR mirror layer 22 is the lower oxidizable layer 22A of at least one layer made of $Al\beta Ga_{1-\beta}As$, and the low-refractive index layer 32A of the upper second DBR mirror layer 32 is the upper oxidizable layer 32A made of $Al\alpha Ga_{1-\alpha}As$.

Figure 32:
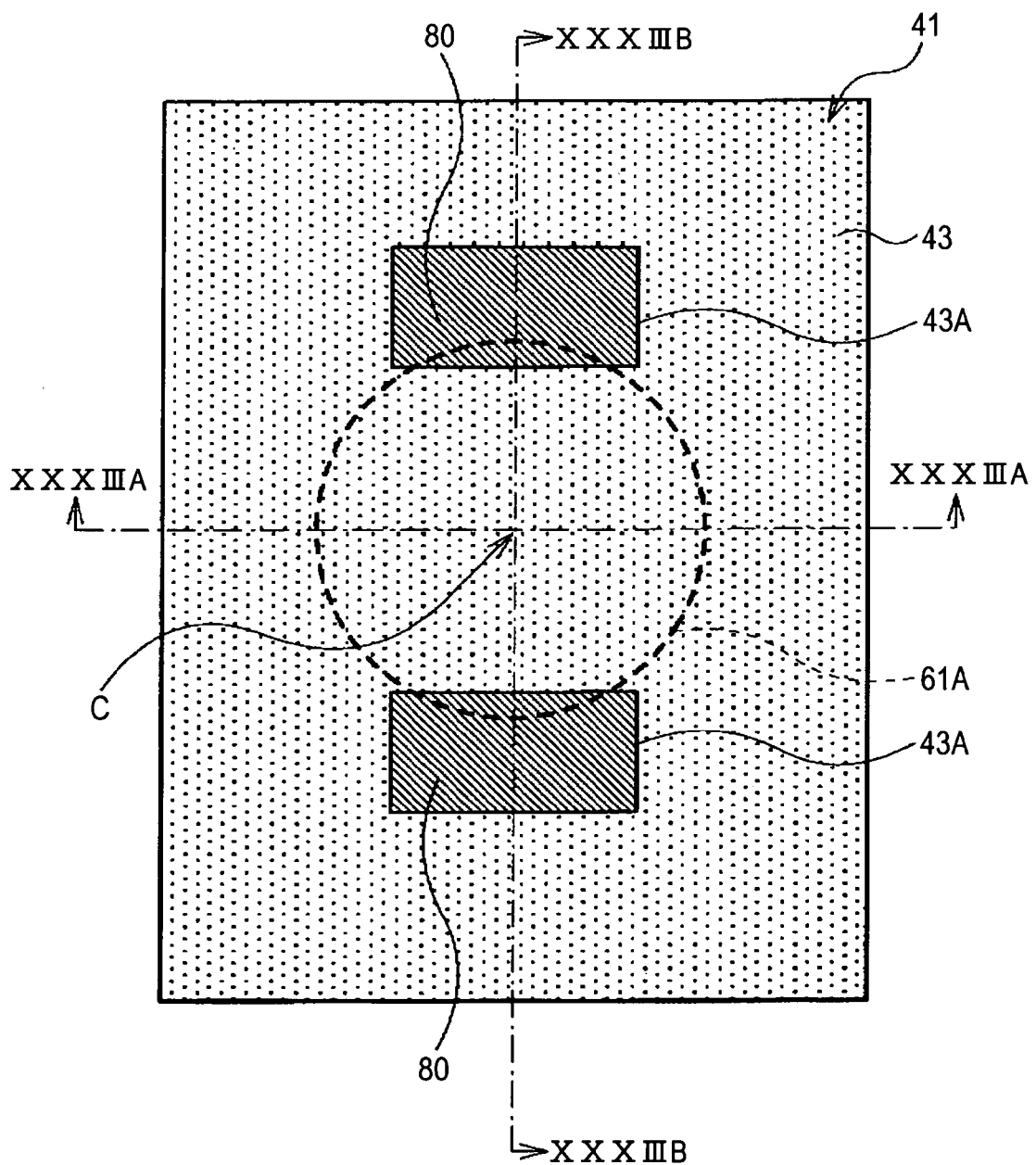
FIG. 32 is an upper surface view showing a manufacturing method of a surface-emitting semiconductor laser according to a fifth embodiment of the invention.

Next, as shown in FIG. 32 and FIGS. 33A and 33B, the insulating film 80 such as $SiO_2$ is formed on the whole surface of the contact layer 17 as an etching alleviation layer by using, for example, the CVD method. Subsequently, a photoresist film 43 is formed on the insulating film 80 and openings 43A for forming later described insulating film trimmed regions 80A are formed in the photoresist film 43 also as shown in FIG. 32 and FIGS. 33A and 33B.

After that, as shown in FIGS. 34A and 34B, parts of the insulating film 80 are selectively removed by etching using the photoresist film 43 as a mask to form the insulating film trimmed regions 80A. Subsequently, as shown in FIGS. 35A and 35B, the photoresist film 43 is peeled off.

As shown in FIG. 32, the insulating film trimmed regions 80A are provided at parts of the periphery of the columnar portion formation estimated region 61A as the planar arrangement in the same manner as the first grooves 51 of the first embodiment. Specifically, the insulating film trimmed regions 80A are preferably formed at positions on a straight line passing through the center C of the columnar portion formation estimated region 61A so as to be symmetrical with respect to the center C, that is, at opposite angles in one direction for controlling polarization. It is not necessary to provide the insulating film trimmed region 80A at two points, but it is preferable to provide the insulating film trimmed region 80A at least at one point. The planar shape of the insulating film trimmed region 80A is not limited to a rectangular shape as shown in FIG. 32 but is optional as long as sufficient oxidization can be performed for adding anisotropic stress to the active layer 14.

Figure 36:
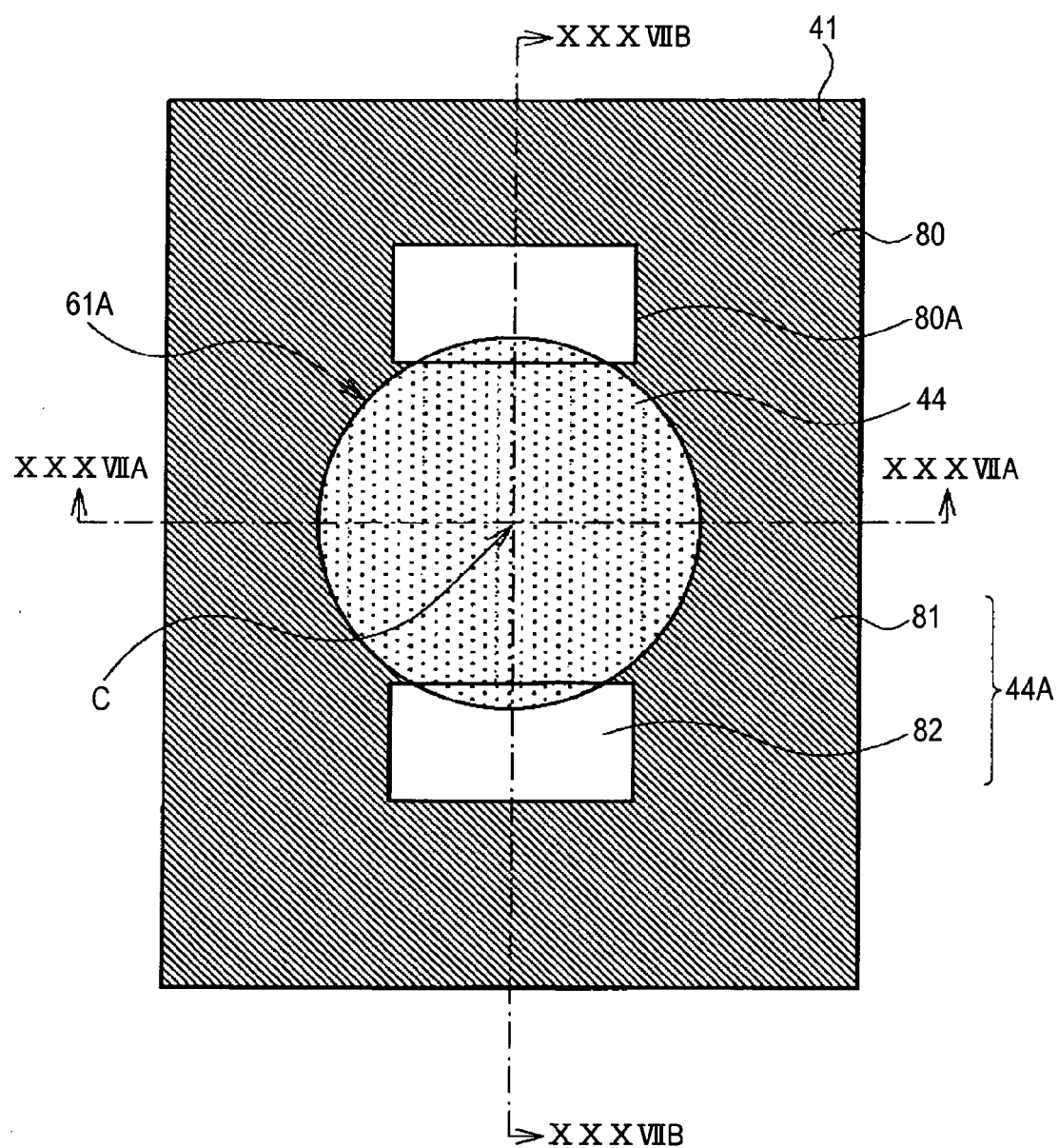
FIG. 36 is an upper surface view showing a process continued from FIGS. 35A and 35B.

After peeling off the photoresist film 43, a photoresist film 44 is formed on the whole surface over the insulating film 80 and the insulating film trimmed regions 80A as shown in FIG. 36 and FIGS. 37A and 37B. Subsequently, an opening 44A is formed on the whole region other than the columnar portion formation estimated region 61A (a circular region in which half-tone dot meshing is applied in FIG. 36) in the photoresist film 44. In the opening 44A, a region with the insulating film 81 of the insulating film 80 (a hatched region in which half-tone dot meshing is not applied in FIG. 36) which is not protected by the photoresist film 44 and a region without the insulating film 82 of the insulating film trimmed region 80A (a white region in which both half-tone dot meshing and hatching are not performed in FIG. 36) which is not protected by the photoresist film 44 are formed.

After forming the opening 44A of the photoresist film 44, the region with the insulating film 81 and the region without the insulating film 82 are etched using the photoresist film 44 as a mask as shown in FIGS. 38A and 38B. According to the process, the columnar portion 61 is formed at a part covered with the photoresist 44.

When performing etching, SiCl4, Ar, Cl2 and so on are used as an etchant gas. At this time, etching conditions having large difference in the etching rate are used between the insulating film 80 made of SiO2 and the photoresist 44, the region with the insulating film 81 and the region without the insulating film 82 can be etched without etching the columnar portion formation estimated region 61A protected by the photoresist film 44. The stacked structure 10 made of the semiconductor is etched after the insulating film 80 is etched off in the region with the insulating film 81, whereas in the region without the insulating film 82, the stacked structure 10 made of the semiconductor is etched from the start. Therefore, the region without the insulating film 82 is etched to be deeper than the region with the insulating film 81 for the period of time during which the insulating film 80 is etched off. As described above, it is possible to allow the insulating film 80 to have the function as the etching alleviation layer.

Specifically, the etching depth of the region with the insulating film 81 is a depth in which the groove pierces through the upper second DBR mirror layer 32 including the upper oxidizable layer 32A as well as in which the groove does not reach the lower second DBR mirror layer 22 including the lower oxidizable layer 22A in the stacked direction. At this time, the etching depth of the region without the insulating film 82 is deeper than the etching depth of the region with the insulating film 81 by a difference $\Delta D$ of depths for the period of time during which the insulating film 80 is etched off. Therefore, the etching depth of the region without the insulating film 82 can be the depth in which the groove pierces through at least one layer of the lower oxidizable layer 22A in the stacked direction by controlling the thickness and etching conditions of the insulating film 80 properly.

After forming the columnar portion 61 by etching, the photoresist film 44 is peeled off as shown in FIGS. 39A and 39B.

Figures 40A, 40B:
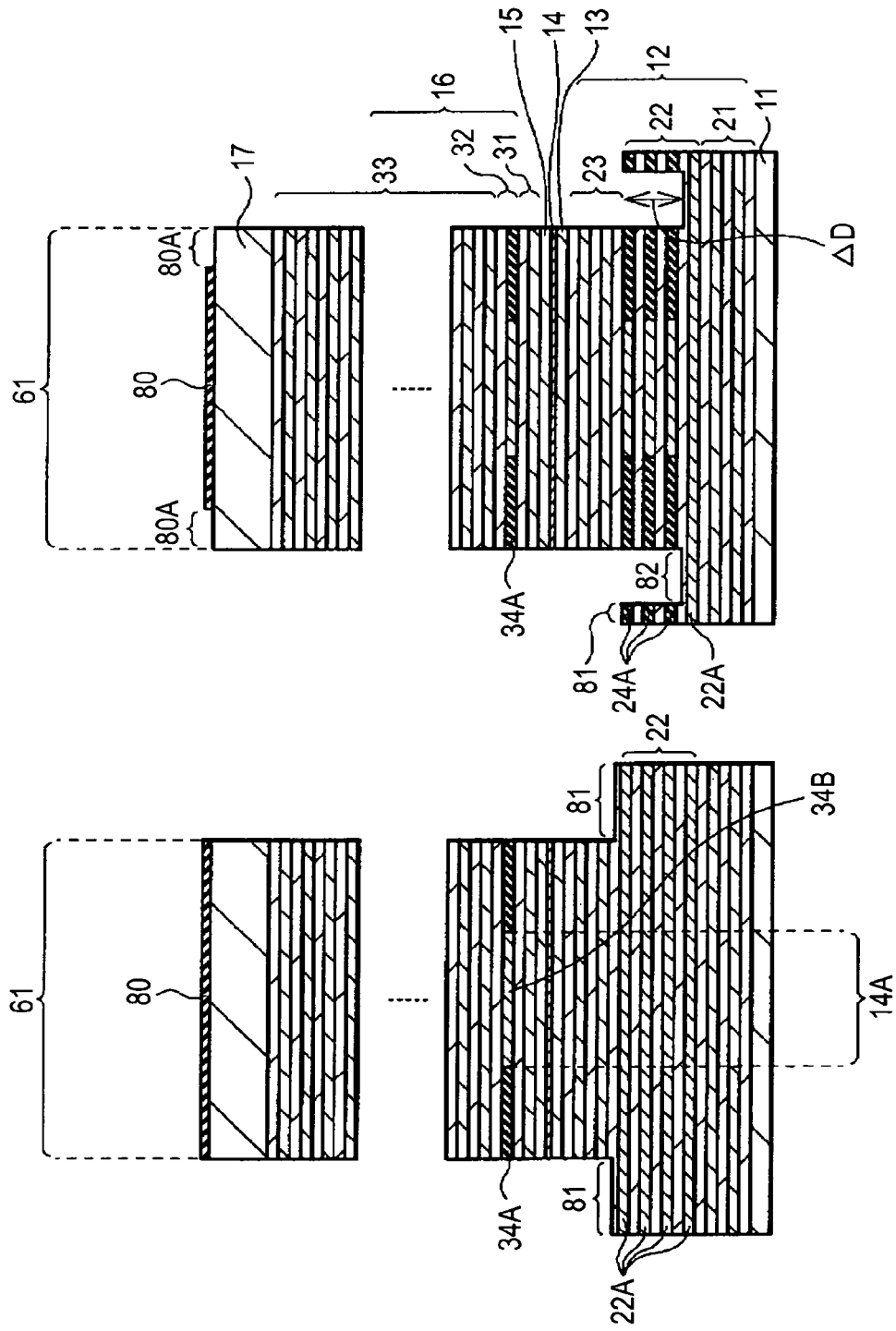
FIGS. 40A and 40B are cross-sectional views showing a process continued from FIGS. 39A and 39B.

After peeling off the photoresist film 44, oxidation treatment is performed at high temperature in water vapor atmosphere as shown in FIGS. 40A and 40B. At this time, in the region with the insulating film 81, only the upper oxidizable layer 32A is exposed at a side surface of the columnar portion 61. Therefore, aluminum (Al) in the upper oxidizable layer 32A is selectively oxidized to be the upper oxide layer 34A made of the insulating layer (aluminum oxide), however, the lower oxidizable layer 22A is not oxidized.

On the other hand, in the region without the insulating film 82, both the upper oxidizable layer 32A and the lower oxidizable layer 22A are exposed at the side surface of the columnar portion 61. Therefore, the upper oxidizable layer 32A is oxidized to be the upper oxide layer 34A in the same manner as the above. At the same time, aluminum (Al) of the lower oxidizable layer 22A is selectively oxidized to be the lower oxide layer 24A made of the insulating layer (aluminum oxide).

At this time, oxidation of the upper first DBR mirror layer 31, the upper third DBR mirror layer 33, the lower first DBR mirror layer 21 and the lower third DBR mirror layer 23 is seldom performed or slightly performed with respect to the oxidation of the upper oxidizable layer 32A and the lower oxidizable layer 22A according to the difference of the composition ratio of aluminum (Al) in respective layers of the upper DBR mirror layer 16 and the lower DBR mirror layer 12.

Accordingly, in the lower second DBR mirror layer 22, the lower oxide layers 24A are formed on the straight line passing through the center C of the columnar portion 61 so as to be symmetrical with respect to the center C, that is, at opposite angles in one direction. On the other hand, in the upper second DBR mirror layer 32, the upper oxide layer 34A having an opening is formed so as to correspond to the light emitting region 14A of the light emitting layer 14, and the opening will be the current injection region 34B.

As described above, after forming the insulating film trimmed region 80A in the insulating film 80, the region with the insulating film 81 and the region without the insulating film 82 are formed inside the opening 44A of the photoresist 44, and the region with the insulating film 81 and the region without the insulating film 82 are etched, thereby allowing the etching depth of the region without the insulating film 82 to be deeper than the region with the insulating film 81 by the etching process at one time. Additionally, the oxidation treatment is performed by using the depth difference $\Delta D$, thereby easily forming the lower oxide layer 24A distributing unevenly in the rotating direction around the light emitting region 14A as the center.

After forming the upper oxide layer 34A and the lower oxide layer 24A, the insulating film 80 is removed as shown in FIGS. 41A and 41B.

After removing the insulating film 80, the ring-shaped upper electrode 71 is formed on the upper surface of the columnar portion 61 as shown in FIGS. 42A and 42B in the same manner as the first embodiment. The upper electrode pad (not shown) is formed at a position apart from the columnar portion 61.

Subsequently, only the light emitting region of the contact layer 17 is opened and the light emitting window 17A is formed also as shown in FIGS. 42A and 42B in the same manner as the first embodiment.

After forming the light emitting window 17A of the contact layer 17, the insulating film (passivation film) 18 made of an insulating material of oxide or nitride such as SiO2 and SiNx is formed on the whole surface (the upper surface of the columnar portion 61, inner surfaces of the first grooves 51 and the second groove 52 and the surface other than the columnar portion 61 in the contact layer 17) as shown in FIGS. 42A and 42B by using, for example, the CVD method in the same manner as the first embodiment.

Subsequently, part of the insulating film 18 on the upper electrode 71 is etched to form the upper electrode exposed portion 71A also as shown in FIGS. 42A and 42B in the same manner as the first embodiment, then, the connection portion 72 is formed on the upper electrode exposed portion 71A.

After forming the connection portion 72, the reverse side of the substrate 11 is polished and etched to thereby form the lower electrode 73 on the reverse side of the substrate 11 also as shown in FIGS. 42A and 42B in the same manner as the first embodiment. After that, the substrate 11 is heated to 400° C. or more to perform alloying of the electrode. In the manner as described above, the surface-emitting semiconductor laser 1 according to the embodiment is completed.

As described above, in the present embodiment, the photoresist film 44 is formed on the insulation film 80 and the insulating film trimmed region 80A as well as the region with the insulating film 81 on the insulating film 80 not protected by the photoresist film 44 and the region without the insulating film 82 on the insulating film trimmed region 80A not protected by the photoresist film 44 are formed, then, the region with the insulating film 81 and the region without the insulating film 82 are etched by using the photoresist film 44 as a mask, therefore, the region without the insulating film 82 can be etched to be deeper than the region with the insulating film 81 in the same process by using the insulating film 80 as the etching alleviation layer. Accordingly, it is possible to form grooves having different depths with high accuracy and to stabilize the polarization direction of laser light into one direction by using simple method.

It is further possible to control the etching depth freely according to the thickness of the insulating film 80 and etching conditions, which increases the degree of freedom in designing the stacked structure 10.

In the above embodiment, the case in which the opening 44A of the photoresist film 44 is formed over the whole area other than the columnar portion formation estimated region 61A in the same manner the second groove 52 of the second embodiment has been explained, however, the opening 44A may have other shapes.

Figure 43:
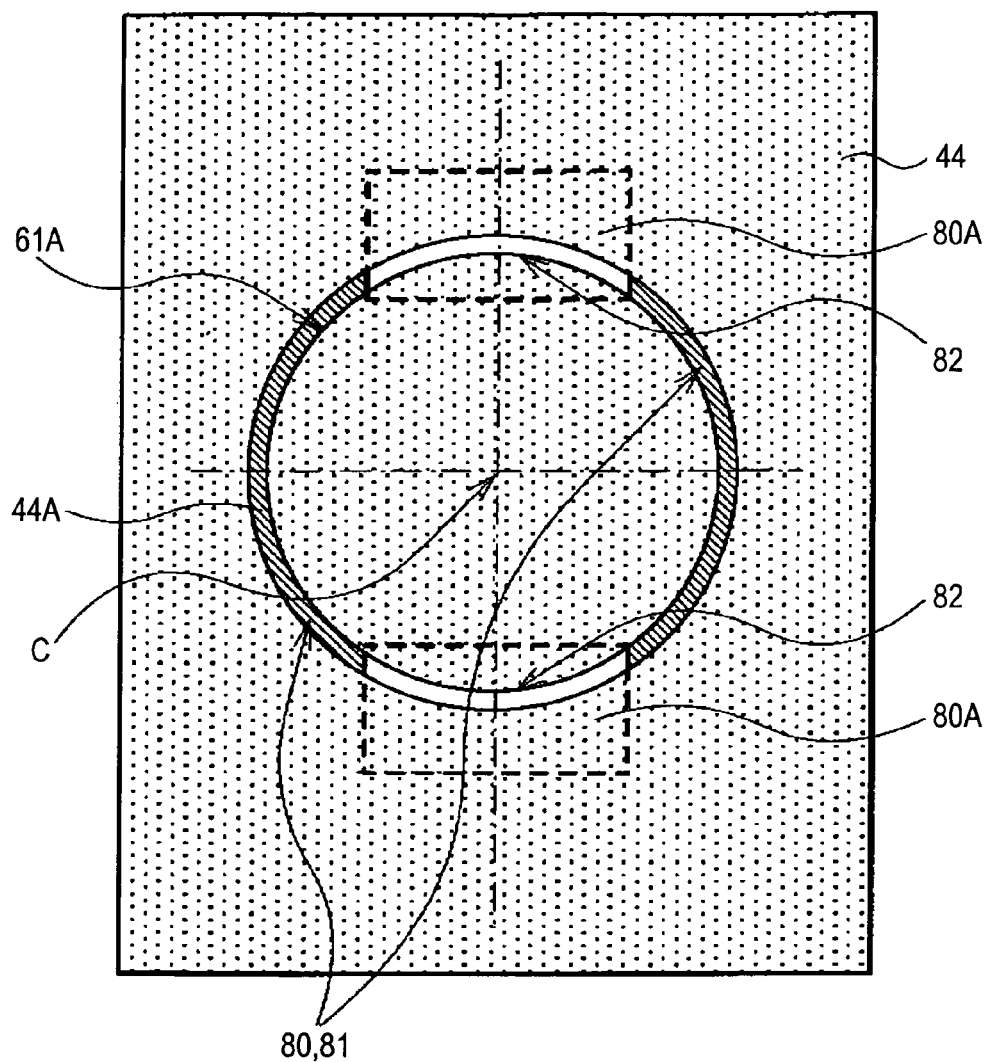
FIG. 43 is an upper surface view showing a modification example of FIG. 36.

Additionally, for example, the opening 44A may be provided in a frame shape surrounding the columnar portion formation estimated region 61A in the same manner as the second groove 52 of the first embodiment as shown in FIG. 43.

Figure 44:
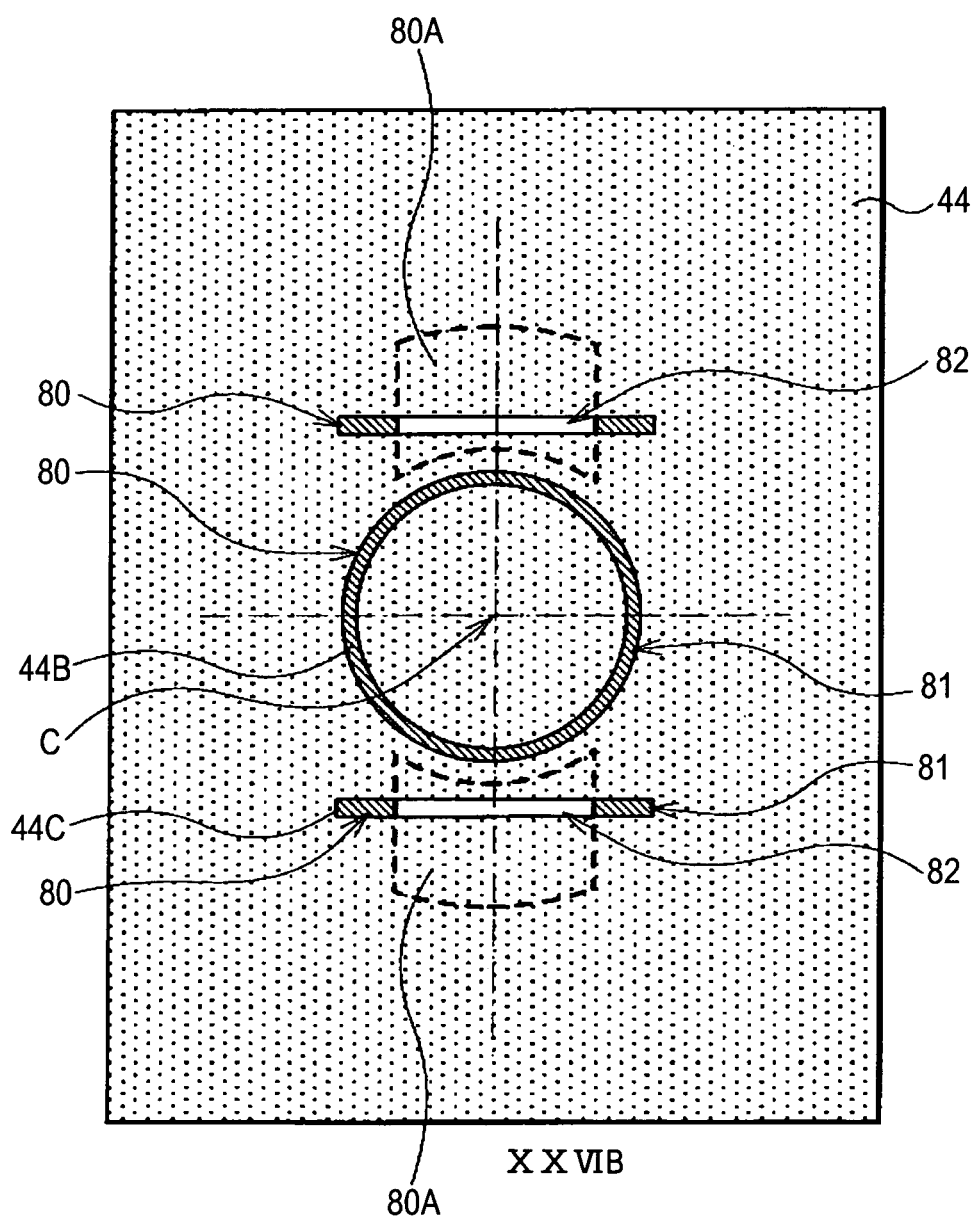
FIG. 44 is an upper surface view showing another modification example of FIG. 36

For example, it is preferable that insulating film trimmed regions 80A are provided at parts of the periphery of (outside region) the columnar portion formation estimated region 61A, and that a frame-shaped opening 44B surrounding the columnar portion formation estimated region 61A and a linear-shaped opening 44C overlapping the insulating film trimmed region 80A at part thereof outside the frame-shaped opening 44A are provided in the photoresist film 44 in the same manner as the second groove 52 and the third groove 53 in the third embodiment, as shown in FIG. 44.

The invention has been explained by citing embodiments as the above, however, the invention is not limited to the above embodiments and can be variously modified. For example, the case in which the first groove 51 is provided in the contact layer 17 has been explained in the above embodiments, however, the first groove 51 may be formed not only in the contact layer 17 but also in an immediate layer having a low-aluminum content rate which is inserted between the upper layer of the upper DBR mirror layer 16, for example, the upper third DBR mirror layer 33 or the upper DBR mirror layer 16 and the contact layer 17.

Additionally, the structures of the surface-emitting semiconductor laser 1 have been explained with specific examples in the above embodiments, however, it is not necessary to provide all layers as well as it is possible to further include another layer. For example, the case in which the lower DBR mirror layer 12 has the structure obtained by stacking the lower first DBR mirror layer 21 to the lower third DBR mirror layer 23 in this order from the substrate 10 side and in which the upper DBR mirror layer 16 has the structure obtained by stacking the upper first DBR mirror layer 31 to the upper third DBR mirror layer 33 in this order from the substrate 10 side has been explained in the above respective embodiments, however, the lower first DBR mirror layer 21 may be omitted.

Furthermore, materials of respective layer explained in the above embodiment or a deposition method and deposition conditions explained in the above embodiments are not limited, and other materials, other deposition methods or deposition conditions can be applied.

Additionally, the invention has been explained by applying an AlGaAs compound semiconductor laser as an example, however, the invention can be applied to a compound semiconductor laser including Al such as an AlGaInP system or an AlGaInAs system.

The present application contains subject matter related to that disclosed in Japanese Priority Patent Application JP 2010-014859 filed in the Japan Patent Office on Jan. 26, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method of a surface-emitting semiconductor laser, the method comprising the steps of:
    forming stacked structure, an upper DBR mirror layer of the stacked structure being between a contact layer of the stacked structure and a lower DBR mirror layer of the stacked structure;
    forming a first groove into said contact layer, said first groove terminating prior to reaching said upper DBR mirror layer;
    forming a second groove through said contact layer, a portion of the second groove originating within said first groove,
    wherein a thickness of the contact layer is larger than a depth of the first groove, a depth of the second groove being larger than said thickness of the contact layer.

2. The manufacturing method according to claim 1, wherein an active layer is between said upper DBR mirror layer and said lower DBR mirror layer.

3. The manufacturing method according to claim 2, wherein an upper spacer layer is between said upper DBR mirror layer and said active layer, a lower spacer layer being between said lower DBR mirror layer and said active layer.

4. The manufacturing method according to claim 1, wherein said portion of the second groove terminates within said lower DBR mirror layer.

5. The manufacturing method according to claim 1, wherein said first groove is formed before said second groove.

6. The manufacturing method according to claim 1 wherein said second groove exposes an upper oxidizable layer of the upper DBR mirror layer, a portion of the upper oxidizable layer being oxidized.

7. The manufacturing method according to claim 6, wherein said upper oxidizable layer is a low-refractive index layer, said low-refractive index layer being between a high-refractive index layer and another high-refractive index layer.

8. The manufacturing method according to claim 1, wherein a second DBR mirror layer of the lower DBR mirror layer is between a first DBR mirror layer of the lower DBR mirror layer and a third DBR mirror layer of the lower DBR mirror layer.

9. The manufacturing method according to claim 8, wherein said portion of the second groove exposes a lower oxidizable layer of the second DBR mirror layer, a portion of the lower oxidizable layer being oxidized.

10. The manufacturing method according to claim 9, wherein said lower oxidizable layer is a low-refractive index layer, said low-refractive index layer being between a high-refractive index layer and another high-refractive index layer.

11. The manufacturing method according to claim 8, wherein a different portion of the second groove originates at a location other than within said first groove, said different portion of the second groove terminating within said third DBR mirror layer.

12. The manufacturing method according to claim 11, wherein said third DBR mirror layer is non-oxidizable.

13. The manufacturing method according to claim 8, further comprising:
    forming a third groove through said contact layer, said third groove terminating within said third DBR mirror layer.

14. The manufacturing method according to claim 13, wherein said third groove originates at a location other than said first groove.

15. The manufacturing method according to claim 13, wherein in a plan view of the surface-emitting semiconductor laser, said third groove surrounds a columnar portion of the stacked structure.

16. The manufacturing method according to claim 1, wherein in a plan view of the surface-emitting semiconductor laser, said second groove surrounds a columnar portion of the stacked structure.

17. The manufacturing method according to claim 1, wherein said first groove terminates within said contact layer.

18. The manufacturing method according to claim 1, wherein an etching stopper layer is between said contact layer and said upper DBR mirror layer, said first groove terminating at said etching stopper layer.

\* \* \* \* \*